(12) United States Patent
Cao et al.

(10) Patent No.: US 7,772,606 B2
(45) Date of Patent: Aug. 10, 2010

(54) LIGHT-EMITTING PHOTONIC DEVICE

(75) Inventors: Jiang-Rong Cao, Irvine, CA (US);
Mamoru Miyawaki, Irvine, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 631 days.

(21) Appl. No.: 11/274,133

(22) Filed: Nov. 16, 2005

(65) Prior Publication Data

US 2007/0097680 A1    May 3, 2007

Related U.S. Application Data

(60) Provisional application No. 60/628,601, filed on Nov. 16, 2004.

(51) Int. Cl.
*H01L 33/00*    (2010.01)
(52) U.S. Cl. .................. 257/98; 257/88; 257/E33.068; 385/14; 372/50.122
(58) Field of Classification Search .................... 257/98
See application file for complete search history.

(56) References Cited

U.S. PATENT DOCUMENTS

| | | | | |
|---|---|---|---|---|
| 4,318,058 | A | 3/1982 | Mito et al. | 372/50 |
| 4,722,089 | A | 1/1988 | Botez et al. | 372/50 |
| 5,050,180 | A | 9/1991 | Botez et al. | 372/45 |
| 5,323,405 | A | 6/1994 | Kamiyama et al. | 372/18 |
| 5,365,541 | A | 11/1994 | Bullock | 372/99 |
| 5,673,284 | A | 9/1997 | Congdon et al. | 372/50 |
| 6,002,522 | A | 12/1999 | Todori et al. | 359/573 |
| 6,363,096 | B1 | 3/2002 | Dodabalapur et al. | 372/75 |
| 6,404,542 | B1 | 6/2002 | Ziari et al. | 359/341.3 |
| 6,448,997 | B1 | 9/2002 | Koide | 347/250 |
| 6,465,742 | B1 | 10/2002 | Hiraoka et al. | 174/255 |
| 6,683,898 | B2 | 1/2004 | Ostergaard et al. | 372/43 |
| 6,711,200 | B1 | 3/2004 | Scherer et al. | 372/64 |
| 6,721,344 | B2 | 4/2004 | Nakao et al. | 372/55 |
| 6,738,551 | B2 | 5/2004 | Noda et al. | 385/130 |
| 6,804,283 | B2 | 10/2004 | Scherer | 372/50 |
| 7,054,517 | B2 * | 5/2006 | Mossberg et al. | 385/14 |
| 7,092,421 | B2 * | 8/2006 | Capasso et al. | 372/45.01 |
| 7,116,878 | B2 * | 10/2006 | Zoorob et al. | 385/129 |
| 7,127,146 | B2 * | 10/2006 | Schmidt et al. | 385/129 |
| 7,184,638 | B2 * | 2/2007 | Noda et al. | 385/129 |

(Continued)

FOREIGN PATENT DOCUMENTS

WO    2004/068205    8/2004

(Continued)

OTHER PUBLICATIONS

"WDM Technology: Active Optical Components", edited by N. K. Dutta et al., Academic Press, 2002 (p. 52).

(Continued)

*Primary Examiner*—Jerome Jackson, Jr.
(74) *Attorney, Agent, or Firm*—Fitzpatrick, Cella, Harper & Scinto

(57) ABSTRACT

A colored light source apparatus is provided. The apparatus includes light sources corresponding to active regions defined by defects in a photonic crystal structure, wherein the photonic crystal structure is based on periodic structures. The apparatus also includes a waveguide, a first electrode, and a second electrode. Varying electrical properties between the first and second electrodes stimulates radiation production in the active regions, wherein the radiation is at least partially coupled to and guided by the waveguide.

8 Claims, 28 Drawing Sheets

U.S. PATENT DOCUMENTS

| | | | |
|---|---|---|---|
| 7,351,601 B2* | 4/2008 | Scherer | 438/31 |
| 2001/0019565 A1 | 9/2001 | Iwasaki et al. | 372/39 |
| 2001/0048783 A1 | 12/2001 | Herble et al. | 385/16 |
| 2002/0074537 A1 | 6/2002 | John et al. | 252/584 |
| 2002/0167984 A1 | 11/2002 | Scherer | 372/50 |
| 2002/0191905 A1 | 12/2002 | Prather et al. | 385/24 |
| 2003/0169787 A1 | 9/2003 | Vurgaftman et al. | 372/20 |
| 2003/0231689 A1 | 12/2003 | Vurgaftman et al. | 372/96 |
| 2003/0235229 A1 | 12/2003 | Deng et al. | 372/96 |
| 2004/0036814 A1 | 2/2004 | Yamaguchi | 349/2 |
| 2004/0057472 A1 | 3/2004 | Takiguchi et al. | 372/20 |
| 2004/0062505 A1* | 4/2004 | Sugitatsu et al. | 385/131 |
| 2004/0080726 A1 | 4/2004 | Suh et al. | 353/122 |
| 2004/0190814 A1 | 9/2004 | Suzuki | 385/14 |
| 2004/0213536 A1 | 10/2004 | Zoorab et al. | 385/131 |

OTHER PUBLICATIONS

C. Sell, et al, "Waveguide networks in three-dimensional layer-by-layer photonic crystals," Applied Physics Letters 84 (23), 4605-7(2004). Z.

C. W. Kim, W. J. Kim, A. Stapleton, J. R. Cao, J. D. O'Brien, and P. D. Dapkus, "Quality factors in single-defect photonic-crystal lasers with asymmetric cladding layers", Journal of Optical Society of America B 19, 1777, (2002).

D.J. Duchesne, K.W. Hipps, B.A. Grasher, and M.G. Norton, "The formation of transition aluminas during oxidation of AIN," Journal of Materials Science Letters 18, 877-9(1999).

J. D. Joannopoulos, et al, "Photonic Crystals," Princeton University Press (1995), pp. 19.

J. D. Joannopoulos, et al, "Photonic Crystals," Princeton University Press (1995), pp. 56.

J. P. Donnelly et al (J. P. Donnelly, R. K. Huang, L. J. Missaggia, J. Plant, P.W.Juodwlkis, "High-brightness slab-coupled semiconductor lasers with single-spatial, large-diameter mode," CTuC3, CLEO 2004 conference, San Francisco, California (2004).

J. R. Cao, Ph.D. Thesis, "Photonic Crystal Microcavity Lasers and Laser Arrays," University of Southern California, Los Angeles (2004).

J.N.Walpole, E.S.Kintzer, S.R.Chinn, C.A.Wang, L.J.Missaggia,"High-power strained-layer InGaAs/AlGaAs tapered traveling-waveamplifier", Appl.Phys.Lett., 61 (1992) 740-742.

John D. Joannopoulos, et al, "Photonic Crystals: Molding the Flow of Light," Princeton University Press (1995), pp. 11.

K. M. Ho, C. T. Chan, C. M. Soukoulis, R. Biswas and M. Sigalas, "Photonic band gaps in three dimensions: new layer-by-layer periodic structures," Solid State Commun. 89, 413 (1994).

K. Srinivasan and O. Painter, "Momentum space design of high-Q photonic crystal optical cavities," Opt. Express 10, 670 (2002).

L. A. Coldren and S. W. Corzine, "Diode Lasers and Photonic Integrated Circuits," John Wiley & Sons, New York (1995).

M. H. Shih et al, "Two-dimensional photonic crystal Mach-Zehnder interferometers," Applied Physics Letters 84(4), 460-2 (2004).

M. Okano, et al, "Coupling between a point-defect cavity and a line-defect waveguide in three-dimensional photonic crystal," Physical Review B 68, 235110 (2003).

O. Painter, et al, "Tailoring of the resonant mode properties of optical nanocavities in two-dimensional photonic crystal slab waveguides," J. Opt. A.:Pure Appl. Opt. 3, S161-S170 (2003).

Ph. Lalanne, S. Mias, and J. P. Hugonin, "Two physical mechanisms for boosting the quality factor to cavity volume ratio of photonic crystal microcavities," Opt. Express 12, 458 (2004).

S. Hughes, et al, "Extrinsic Optical Scattering Loss in Photonic Crystal Waveguides: Role of Fabrication Disorder and Photon Group Velocity," Physical Review Letters 94, 0339.3 (2005).

S. Ogawa et al, "Control of Light Emission by 3D Photonic Crystals," Science Express 10.1126, Jun. 2004.

S. Y. Lin, et al, "A three-dimensional photonic crystal operating at infrared wavelengths," Nature 394, 251-3 (1998).

Steven Serati, Hugh Masterson and Anna Linnenberger, "Beam combining using a Phased Array of Phased Arrays (PAPA)" 2004 IEEE Aerospace Conference, 5.0205 (Mar. 2004).

Wan Kuang, Cheolwoo Kim, A. Stapleton, Woo Jun Kim, J. D. O'Brien, "Calculated out-of-plane transmission loss for photonic-crystal slab waveguides", Optics Letters 28(19), 1781-3 (2003).

Wan Kuang, John D. O'Brien, "Reducing the out-of-plane radiation loss of photonic crystal waveguides on high-index substrates", Optics Letters 29(8), 860-2 (2004).

Y. Li and Kai-Ming Ho, "Waveguides in three-dimensional layer-by-layer photonic crystals," Journal of Optical Society of America B. 20(5), 801-9 (2003).

Y. Liu, et al. "Simultaneous injection locking of couples of high-power broad-area lasers driven by a common current source", Applied Optics, vol. 41, No. 24; Aug. 20, 2002; pp. 5036-5039.

W.D. Zhou, et al., "Electrically injected single-defect photonic bandgap surface-emitting laser at room temperature", Electronics Letters vol. 36 No. 18; Aug. 31, 2000.

Zheng Wang, et al., "Nonreciprocal optical resonators in 2D photonic crystals", FME2 Optical Society of America; 2004.

S.A. Aliev, et al., "Thermal conductivity and thermoelectric power of n-type indium phosphide at low temperatures", Translated from Fizika Tverdogo Tela, vol. 7, No. 5; May 1965; pp. 1590-1592.

J.R. Cao, et al., "Sapphire-bonded photonic cyrstal microactivity lasers and their far-field radiation patterns", IEEE Photonics Technology Letters, vol. 17, No. 1; Jan. 2005; pp. 4-6.

Hong-Gyu Park, et al., "Electrically driven single-cell photonic crystal laser", Science vol. 305; Sep. 3, 2004; pp. 1444-1447.

Christelle Monat, et al., "Modal analysis and engineering on InP-based two-dimensional photonic-crystal microlasers on a si wafer", IEEE Journal of Quantum Electronics, vol. 39, No. 3; Mar. 2003; pp. 419-425.

O. Painter, et al., "Two-dimensional photonic band-gap defect mode laser", Science, vol. 284; Jun. 1999; pp. 18191821.

F. Cuesta-Soto, et al., "All-optical switching structure based on a photonic crystal directional coupler", Optics Express, vol. 12, No. 1; Jan. 12, 2004; pp. 161-167.

Tokuyuki Honda, et al., "Diffraction-compensated free-space WDM add-drop module with thin-film filters", IEEE Photonics Technology Letters, vol. 15, No. 1; Jan. 2003; pp. 69-71.

G.V. Samsonov, "The Oxide Handbook (2nd Ed.)", 1982, pp. 110-113, IFI/Plenum, New York-Washington-London.

"Thorlab's DWDM820", http://www.thorlabs.com/ProductDetail.cfm?&DID=6&ObjectGroup_ID=971&Product_ID=32097, print date Nov. 15, 2005. (3 pages).

"Peltier Coolers", http://www.digit-life.com/articles/peltiercoolers/, print date Nov. 14, 2006. (10 pages).

"Photonic Crystal", http://encyclopedia.laborlawtalk.com/Photonic_crystal, print date Nov. 15, 2005. (2 pages).

"AWG (Array Waveguide Grating)", http://www2.noah-c.com/english/Apollo/apss/awg/awg_e.htm, print date Nov. 14, 2005. (5 pages).

"The New Sanyo LP-Z4 Projector", described at http://www.akihabaranews.com/en/news_10200.html, print date Nov. 14, 2005. (11 pages).

"InP—Indium Phosphide", http://www.ioffe.rssi.ru/SVA/NSM/Semicord/InP/thermal.html, print date Nov. 15, 2005. (2 pages).

* cited by examiner

Only a 1x5 micron AlAs post remains, and surrounded by $AlO_x$

Cross-section View

Only half of the 3D geometry is simulated, given the mirror symmetry of the device.

157.4 THz 147.6 THz

- Lower and adjustable slope
- Intrinsically digital control of the laser output power directly 157.4 THz 147.6 THz

FIG. 37
$\lambda_n = \lambda_0 + n \times \Delta\lambda$
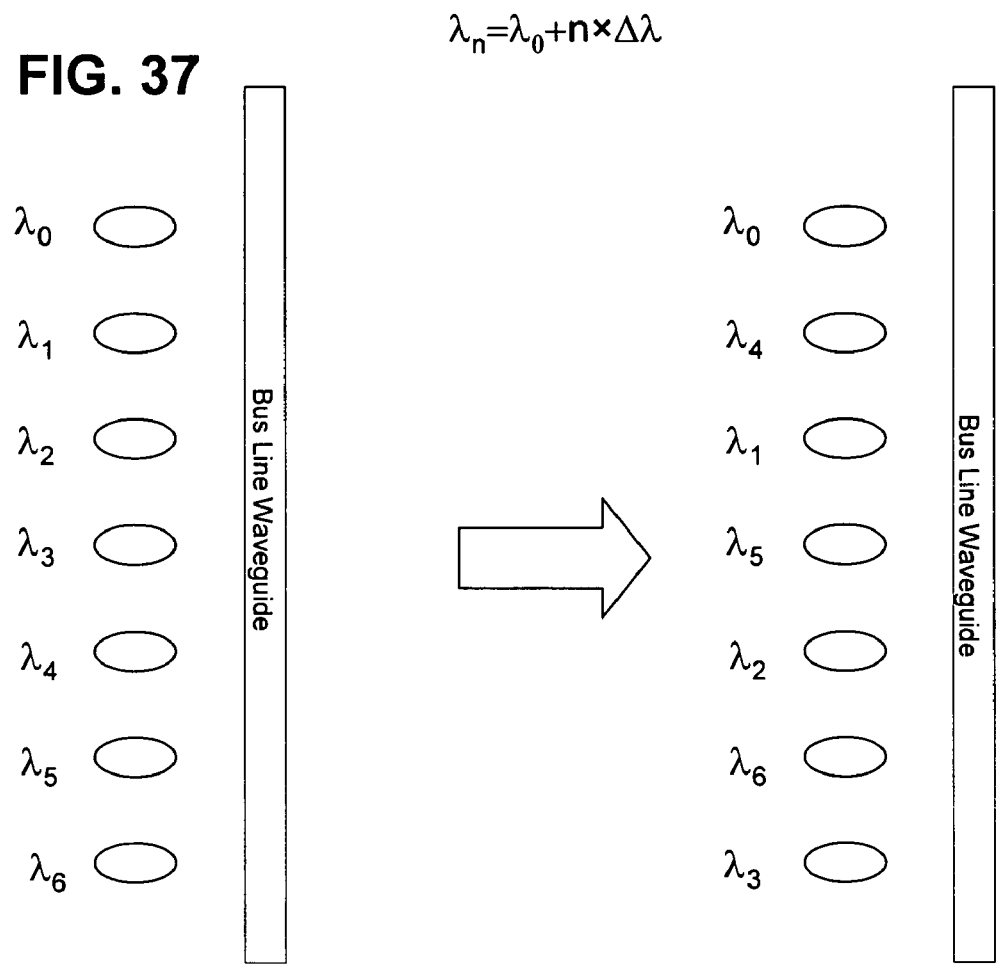
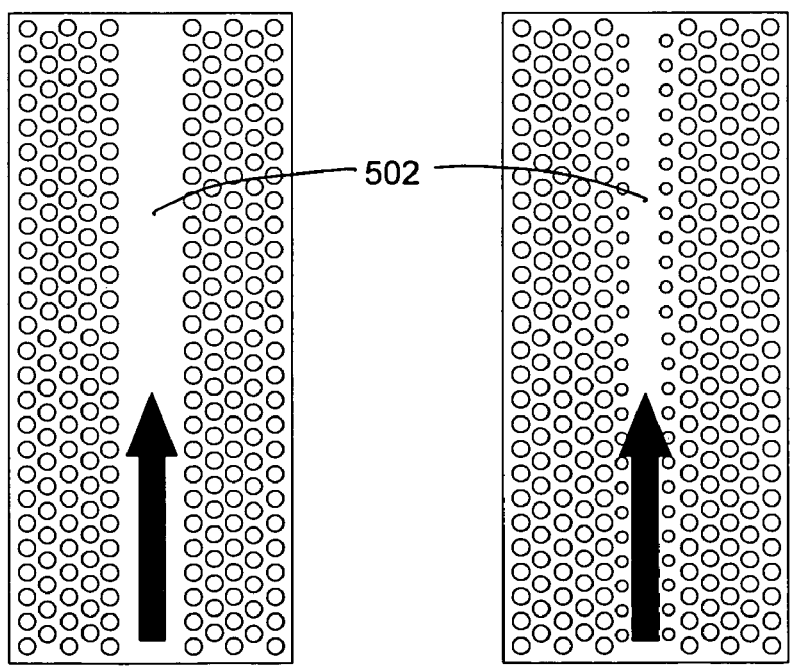
FIG. 38

LIGHT-EMITTING PHOTONIC DEVICE

CROSS-REFERENCE TO RELATED APPLICATION

This application claims the benefit of U.S. Provisional Patent Application No. 60/628,601 filed Nov. 16, 2004, the contents of which are hereby incorporated by reference as if fully stated herein.

BACKGROUND

1. Field of the Invention

The present invention is generally directed to colored light sources, and more particularly, although not exclusively, to colored light sources used in projectors and/or printers.

2. Description of the Related Art

Colored light sources have been used in different devices. For example, colored light sources have been used in data projectors and in polygon mirror scanning laser beam printers (LBPs).

FIGS. 1 to 3 depict the structure of typical colored data projectors. In FIG. 1, the structure and the light source in a typical DMD (Digital Micromirror Device) based color wheel color-projection system, which can also be referred to as a DLP™ (Digital Light Processing™) system, are shown. The DMD of FIG. 1 includes a lamp as a light source. Light from the lamp passes through an energy projector, a color wheel, an integrating rod, a lens, a light modulator and finally through a projection lens. It should be noted that in lieu of a color wheel and single lamp, three light sources of red, blue and green can be used.

FIG. 2 depicts the structure and the light source(s) for a typical three-panel color projection system based on a three-LCD (Liquid Crystal Display) panels arrangement. The projection system includes three LCD panels that employ separate polarizers. In addition, the projection system includes power supply circuitry, a PBS array, a UHP lamp and an exhaust fan.

FIG. 3 depicts an alternative arrangement of a three-panel color projection system. Instead of having a single lamp, the three-panel color projection system of FIG. 3 includes three colored light sources, each of a different color, namely red, green and blue. The optical path projector associates a collimator lens and liquid crystal panel with each colored light source. In addition, a compound dichromatic mirror and a projection lens are provided, for projecting an image on a screen.

It should be noted that the application of a compact optical path projector light source does not require a pure, coherent, single wavelength light source, because the human eye cannot typically distinguish 5 nm differences in light wavelengths.

Therefore, the stringent requirements on light source spectral purity posed on many other applications are not needed. Such applications include high power semiconductor lasers sources used in telecom industry applications. The light source for the optical path projector can utilize the output of an incoherent laser arrays, provided that the total output power is large, the total quantum efficiency is high (as a laser opposing to light emitting diodes (LEDs)), and the device size is compact.

Turning to the use of colored light sources in LBPs, FIG. 4 depicts the structure of a typical polygon beam scanning LBP. The LBP includes a laser diode 2001 and a polygon mirror 2002 spinning at high speeds (e.g. 20,000 to 30,000 rpm). The LBP also includes an aspherical laser beam-focusing lens 2003, and a photosensitive drum 2004.

A few functional characteristics are preferred for the light sources used in these two applications. First, a compact light source size is preferred. In this regard, portability is important for data projectors. For LBPs, reducing the total structure size and the individual components sizes is considered to be helpful for increasing products' competence.

In addition to compactness, high output optical power is preferred, especially for the data projector applications. In particular, a large screen projector can typically use several hundred to a couple of thousand lumens of net optical power. Assuming that the averaging lumen/Watt sensitivity of a projected averaged color image is ~300 Lumen/Watt (optical power) for a peak response of 683 Lumen/Watt at green, and assuming that three individual light sources are used to construct the color image projector, then the output optical power of each individual light source is preferably between several hundred milliwatts to a couple of watts.

High wall-plug efficiency, or the ratio between the net output optical power (Watts) and the total consumed electrical power (Watts), is also a preferred functional characteristic. The power conversion efficiency from electrical power to optical powers is less than a few percent for typical incandescent and fluorescent light sources, especially when only the visible spectrum is considered. For visible light LEDs (light emitting diodes), power conversion efficiency is usually a couple of percentage points. The concern for high wall-plug efficiency is less about the power consumption, and more about the excessive heat generation that usually results from unconverted electrical power. The generated heat not only reduces the lifetime and reliability of the light sources, but also results in bulky and power consuming thermal dissipation mechanisms and components, which increase the size, power consumption, and production costs of devices.

Furthermore, a well-defined and stable beam profile (i.e. spot shape) is a preferred functional characteristic. More particularly, a single color source that can output a single lobe, small diameter, and pure Gaussian profiled spot is preferred. In data projectors, such a beam profile can dramatically reduce the needs for complex lens systems for converting into a uniform collimated light beam for projections. In LBPs, such a beam profile can facilitate uniform and fine exposure of pixels.

Another preferred functional characteristic for light sources used in data projectors and LBPs relates to wavelength range. It should be noted that the wavelength range for data projectors and LBP's is significantly more flexible than typical laser systems. Unlike may laser systems used in communications and metrologies, a variation of wavelength within a couple dozen nanometers is well acceptable for free space optical systems in data projectors and LBPs, and for color perception of the typical human eye. In particular, if a single color light source has its physical wavelength varying ±5 nm (i.e. 10 nm bandwidth), that light source should not have any negative influence on the performance of the data projector or LBP equipment, as long as the output optical power and beam profile (including polarization) are stable.

Yet another preferred functional characteristic is the use of an incoherent light source. In many free space imaging systems, incoherent light sources are preferred over coherent light sources, since coherent light sources may introduce unintended interference artifacts, such as speckles. In addition, coherent light sources require additional components such as diffusers, typically leading to increased manufacturing costs and equipment size.

Common light sources used in data projectors are high power incandescent lamps and inertial gas lamps, as shown in the examples illustrated in FIGS. 1 and 2. However, such lamps have several technological limitations. First, these lamps typically have low wall-plug efficiencies. Moreover, since they are white light sources, the mechanisms to filter out RGB (red-green-blue) lights respectively and to dump useless IR (infrared) and UV (ultraviolet) components further reduce the net wall-plug efficiency. This low efficiency not only consumes more power directly, but also generates additional heat, requiring additional components to dissipate the heat. These thermal dissipation components (such as electrical fans and TEC (thermal electrical coolers, or Peltier coolers, with a description available at http://www.digit-life.com/articles/peltiercoolers/)) add cost, size, and power consumptions to the total system.

An alternative to using lamps in data projectors is to use semiconductor LEDs (light emitting diodes). Compared with lamps, LEDs are seen to provide a more compact device size and a higher wall-plug efficiency, as well as a longer device lifetime. Typical characteristics of these LEDs emitting in visible spectral range can be found in several manufacturers' white papers, such as those from Cree, Nichia, and Osram.

Solid state (especially semiconductor) light sources, such as LEDs and laser diodes, are generally more compact in size, provide higher optical power, and have higher wall-plug efficiency when compared with lamps. For real space imaging applications, such as the light sources in data projectors, incoherent light generated LEDs are usually preferred over the coherent light generated by individual laser diodes, due to the image quality degrading effects (such as speckles) associated with coherent illumination. Moreover, the fabrication cost for LEDs is usually lower than that of laser diodes. Therefore, there are still many practical applications where LEDs are utilized instead of laser diodes. In terms of efficiency, however, within the realm of solid state light sources, lasers diodes are preferred over LEDs for the above-described applications. In particular, the internal quantum efficiencies, or the ratios between the net number of photons generated and the net number of electrical carrier (electron and holes) injected into a light emitting device, resulting from the stimulated emission process in laser diodes are seen to be more intrinsically efficient than the spontaneous emission process in LEDs. For the same reason, most LBPs employ laser diodes as their scanning light sources, rather than LEDs.

However, it should be noted that some laser diode arrangements are undesirable. For instance, intracavity-doubled diodes or frequency doubled DPSS (diode pumped solid state lasers) can be used to realize green/blue laser sources. Unlike semiconductor laser diodes, intracavity-doubled lasers require an extra step of converting optical energy from one wavelength to another wavelength. The frequency doubled DPSS designs require an even further step of optical pumping to the gain materials. These extra steps typically result in a significantly more complex device structure (high fabrication cost and larger device size) and lower wall-plug efficiencies.

As such, better solutions are seen to come from directly electrically injected laser diodes, which can operate at high optical powers. In data projector applications, each color light source needs output optical power in the range between several tens of milliwatts to several watts. Such power levels cannot typically be provided by existing microcavity laser designs, such as VCSELs (Vertical Cavity Surface Emitting Lasers). To reach such output power levels, a large gain volume is required, typically several hundred micrometers long semiconductor bars (Fabry-Perot) embedded with quantum wells (QWs). Compared to the wavelengths within visible and NIR (near infrared) light, a cavity this large (several hundred micrometers) is multimode within the >20 nm gain bandwidth provided by typical QW media.

A well controlled and stable operation of high power laser diodes is desired. Several approaches have been developed for realizing stable single mode operation (which is by definition coherent) at high optical power on semiconductor laser diode devices.

One such approach is the coherently coupled laser array, which is also referred to as the phase-locked laser array. There have been many designs, such as those described in U.S. Pat. No. 5,323,405, U.S. Pat. No. 5,365,541, Y. Liu, H. Liu, and Yehuda Braiman, Applied Optics 41(24), 5036-9 (2002).

Another approach to realizing stable single mode operation of high power laser diodes is the MOPA (master oscillator power amplifier), which has been described in studies such as J. N. Walpole, E. S. Kintzer, S. R. Chinn, C. A. Wang, L. J. Missaggia, "High-power strained-layer InGaAs/AlGaAs tapered traveling-waveamplifier", Appl. Phys. Lett., 61 (1992) 740-742, and U.S. Pat. No. 6,721,344.

Yet another of such single mode laser diode approach is the Distributed Feedback (DFB) laser, which is used in telecommunications, and which has been described by patents within U.S. patent classifications 372, 92 and 96.

Most of these high power laser diodes have sophisticated designs and stable performances. However, such sophisticated systems are expensive to produce. For this reason, such lasers have not yet found their positions in the competitive consumer product markets of data projectors and LBPs.

In addition to the foregoing deficiencies, the coherent single wavelength property of the above-mentioned devices is not preferred for data projectors and LBPs applications. As noted above, a method to combine multiple light sources' output power incoherently is preferred, with such method resulting in a compact size, low cost, and stable design. By combining power incoherently, high total optical power can be realized, with each individual light source already providing high wall-plug efficiency.

Combining the output of multiple lasers incoherently has been addressed by some imaging systems. For example, a lens imaging system or an optical diffractive device can focus the output beams from multiple laser diodes into a common spot. Such a system has been described in U.S. Pat. No. 6,404,542 and Steven Serati, Hugh Masterson and Anna Linnenberger, "Beam combining using a Phased Array of Phased Arrays (PAPA)" 2004 IEEE Aerospace Conference, 5.0205 (March 2004).

However, such external optical lens systems (or extern diffraction systems) increase the size and cost of the light source. In addition, such systems have problems related to the free space alignment packaging costs, and the alignment stability susceptible operation environment. These systems are therefore not seen to combine the output power of multiple laser diodes in a monolithic integrated fashion, with reduced device size and fabrication costs, and with characteristics that match the preferred functional characteristics described above.

To achieve the functional characteristics described above, one may attempt to physically position an array of laser diodes near a waveguide (such as optical fiber, or other dielectric waveguides), so that the output optical powers from each laser diode can be combined in the waveguide and output together at one end of the waveguide. However, such a system will likely not function stably. In particular, the time reversibility of the electromagnetic filed propagation (governed by the Maxwell's equations) indicates that there will be strong cross-talk between each laser diode coupled to the common waveguide. Such cross-talk between lasers will simply tend to phase lock the lasers into an undesirable low loss supermode. An optical feedback and cross-talk system with multiple laser cavities and waveguides may support multiple supermodes with quality factors within the >20 nm gain bandwidth of the quantum wells, but such a system is likely to be unstable.

Another category of devices can be used to combine laser power incoherently. Such devices are used in WDM (wavelength division multiplex) systems implemented for telecommunication applications. A typical multiplexer in a WDM system uses optical grating (e.g. "WDM Technologies: Active Optical Components," ed. A. K. Dutta et al., Academic Press (2002), pp. 52) and/or interferences (arrayed waveguide grating, i.e. AWG, available at http://www2.noah-c.com/english/Apollo/apss/awg/awg_e.htm) to combine signals from multiple wavelengths without cross-talk between each other.

Within various multiplexer designs, those with photonic crystal techniques (e.g. U.S. Pat. No. 6,738,551 and U.S. Patent Application Publication No. 20020191905) may be used, because of their compact sizes and monolithic fabrication compatibility. More importantly, if one can combine the passive multiplexer devices with active laser arrays (such as those described in U.S. Pat. No. 6,804,283) in a practical design, the desired functional characteristics mentioned above may be realized within a low fabrication cost package. However, certain considerations should be made when combining of passive multiplexer devices with active laser arrays.

One consideration is how to combine cavity-based light sources with a waveguide which is coupled to each of the light sources, within a substrate. Even if the power of the light source of each cavity is small, the individual powers can be accumulated in the waveguide.

Another consideration is how to pack a large amount (several dozens to several hundreds) of single mode light sources within close proximity of a waveguide, and still satisfy the features of efficient electrical injection and thermal dissipation. In addition, how to pack single mode light sources in close proximity, while avoiding optical and/or electrical cross-talk, should be considered.

Another consideration is how to deliver the total output power in a waveguide and still avoid overheating to the waveguide. In this regard, to realize the preferred functional characteristic of a well-defined and stable beam profile, a single mode waveguide is preferred. In this regard, the requirement for a single mode waveguide only requires that the waveguide be single mode through the wavelength range of the functioning devices; it does not require that the waveguide to be single mode in all wavelengths (i.e. 0 to infinity), or single mode in other ranges such as photonic crystal bandgap.

A single mode waveguide usually corresponds to a relatively small geometric cross-section. As such, delivering large optical power through the small waveguide cross-section is likely to result in device overheating and nonlinear optical effects caused by high optical power density.

In light of the above considerations, it is desired to combine the output optical power from multiple light sources in a common waveguide (bus line waveguide), while making sure there is no optical cross-talk between light source cavities through the bus line waveguide.

SUMMARY OF THE INVENTION

The present invention is seen to address the foregoing deficiencies and considerations related to colored light sources.

According to one aspect of the invention, a colored light source apparatus is provided. The apparatus includes light sources corresponding to active regions defined by defects in a photonic crystal structure, wherein the photonic crystal structure is based on periodic structures. The apparatus also includes a waveguide, a first electrode, and a second electrode. Varying electrical properties between the first and second electrodes stimulates radiation production in the active regions, wherein the radiation is at least partially coupled to and guided by the waveguide.

The structure of the light sources can be different from that of the waveguide. The material of the light sources can also be different from that of the waveguide. The apparatus can further include a cladding layer positioned in between the first and second electrodes.

The light sources can include a first light source and a second light source, wherein the first light source is stimulated to emit single mode radiation of a first frequency, and wherein the second light source is stimulated to emit single mode radiation of a second frequency. The first and second frequencies can be different.

The first and second frequencies can be associated with different cavity structures. The difference between the cavity structures can correspond to a difference in pitch from a periodic pitch. The difference between the cavity structures can also correspond to a difference in size from a periodic size. The difference between cavity structures can also correspond to a difference in the sizes of defects of the cavity structures.

The photonic crystal structure, can be divided into a top layer and a bottom layer, wherein the top and bottom layers each have associated first and second electrodes. The top and bottom layers can correspond to n-doped or p-doped layers. A forward bias can induced into the active regions through the first and second electrodes in order to produce light in the active regions.

The light sources can laser diodes. The light sources can also be LEDs. The periodic structures can be columns of gas in a semiconductor. The waveguide can correspond to a strip without periodic structures. The waveguide can further include a strip of gas, such as air.

At least one of the first and second electrodes can includes a first light source electrode associated with the first light source, and a second light source electrode associated with the second light source. An electrical operation of the first light source electrode can be performed independent of an electrical operation of the second light source electrode, to independently stimulate the production of radiation to the active regions corresponding to the first and second light sources. The first and second light source electrodes can isolated from each other by a high break-down voltage material, such as a vacuum. The first and second light source electrodes can also be isolated from each other by air.

The first light source and the second light source can be separated by a distance chosen to minimize crosstalk. The condition to minimize crosstalk can be the condition where when the distance is associated with a variable p1, the variable p1 is chosen so that $1/p_1 \geqq 10 \cdot Q_1$, where Q1 is the quality factor of the first light source. The condition to minimize crosstalk can be the condition where when the distance is associated with a variable p2, the variable p2 is chosen so that $1/p_2 \geqq 10 \cdot Q_2$, where Q2 is the quality factor of the second light source.

The light sources can include at least a first light source, a second light source and a third light source, wherein the first light source emits stimulated radiation of a first frequency, the second light source emits stimulated radiation of a second frequency, and the third light source emits stimulated radiation of a third frequency, and wherein the first, second and third light sources are arranged according to their respective emitted frequencies so that the distance between any two of the first, second and third light sources can be minimized while minimizing crosstalk between the any two light sources.

The photonic crystal structure can be three-dimensional, and wherein the light sources and the waveguide are on separate planes of the photonic crystal. The active regions can be quantum wells. The area corresponding to the waveguide can be a passivated quantum well. The defects defining the light sources can be cavities in the periodic structures.

According to another aspect of the invention, a colored light source system is provided which includes at least two of the above-described colored light source apparatuses. The colored light source system includes a combining coupler, wherein the combining waveguide is connected to all of the waveguides of the at least two colored light source apparatuses at a connection region, and wherein the waveguides of the at least two colored light source apparatuses are separated away from the connection region to avoid crosstalk.

According to yet another aspect of the invention, a data projector is provided which utilizes at least one colored light source apparatus as described above. The data projector includes projection optics for projecting light from the at least one colored light source apparatus.

According to yet another aspect of the invention, a laser beam printer is provided which utilizes at least one colored light source apparatus as described above. The laser beam printed includes a mirror and lens for focusing light emitted from the at least one colored light source apparatus onto a photosensitive drum for printing. The out power of the at least one colored light source can be digitally controllable.

This brief summary has been provided so that the nature of the invention may be understood quickly. A more complete understanding of the invention can be obtained by reference to the following detailed description of the preferred embodiment thereof in connection with the attached drawings.

BRIEF DESCRIPTION OF THE DRAWINGS

FIG. 37 illustrates an arrangement strategy to reduce the cross-talk between neighboring cavities, by increasing the resonant frequency (i.e. inverse of wavelength) difference between the nearest neighboring elements.

FIG. 38 is a top-view of a multimode waveguide in accordance with an embodiment of the invention.

DETAILED DESCRIPTION

Figure 5:
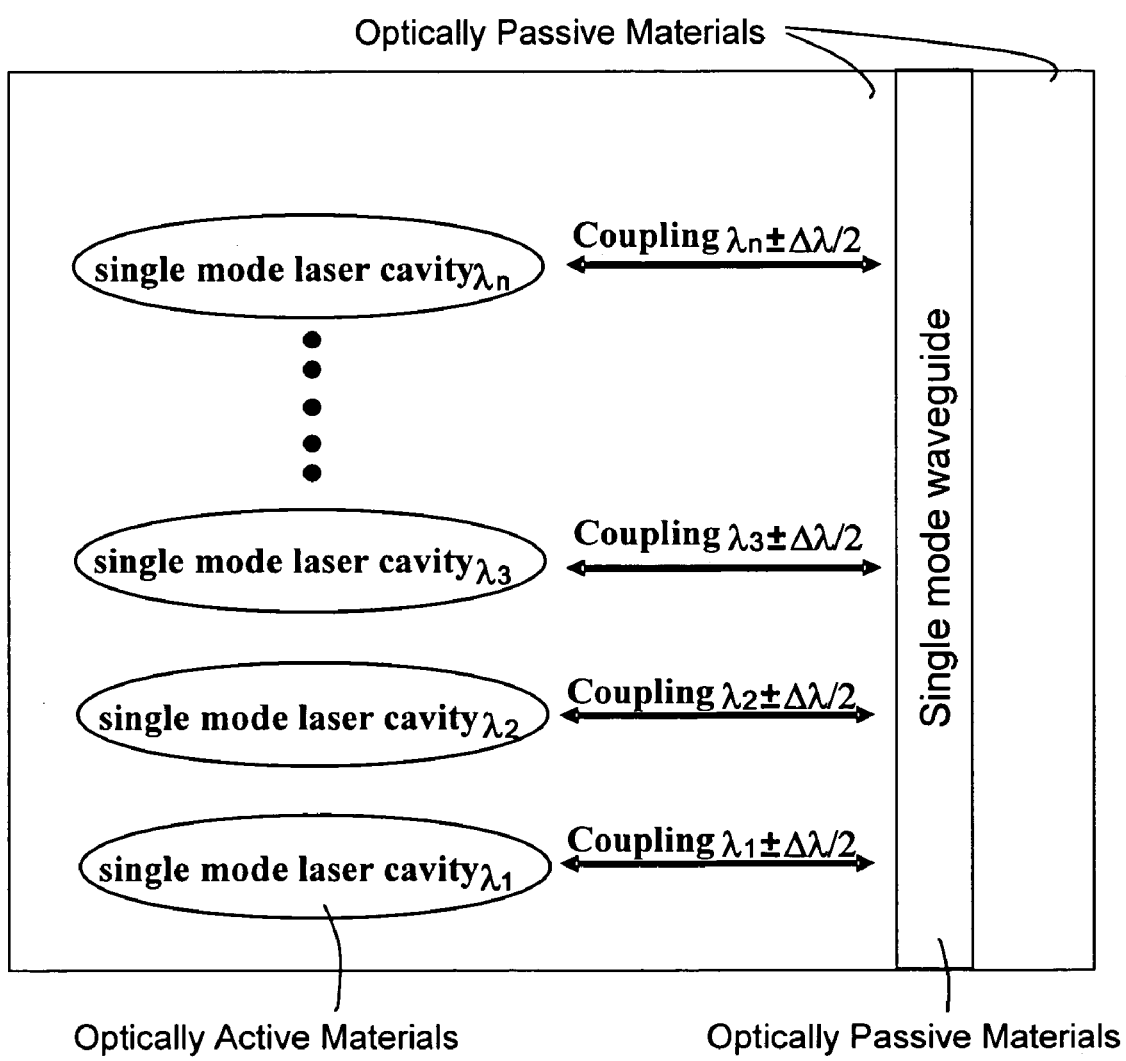
FIG. 5 is a diagram depicting the embedding of an array of photonic crystal light sources in a media of photonic crystal in accordance with a representative embodiment of the invention.

Referring to FIG. 5, the embedding of an array of photonic crystal light sources (or microcavities) in a media of photonic crystal is shown. The array of single mode photonic crystal light sources is also coupled into a common waveguide to generate output.

The concept of non-cross-talk optical power collection system can be achieved by forming the array of microcavities to resonate at different wavelengths. By doing so, each individual microcavity will naturally reject any optical power at different wavelengths (i.e. from a different microcavity).

As seen in FIG. 5, the coupling bandwidth from each mode to the common waveguide is smaller than the wavelength spacing between any two light sources in the array. Therefore, there is virtually no cross-talk between any two light sources in the array through the waveguide. Such a natural optical isolation mechanism can be demonstrated by numerical simulation, such as by FDTD (finite-difference time-domain) simulation. For instance, one such optical system based on square lattice 2D photonic crystals is illustrated in FIG. 6.

Figure 6:
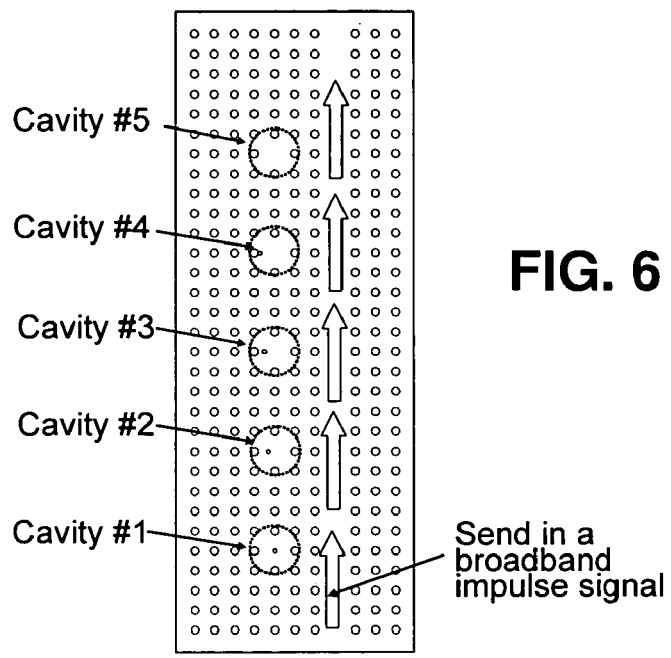
FIG. 6 is a diagram depicting an optical system based on square lattice 2D photonic crystal, which exhibits optical isolation of 5 cavities.

With reference to FIG. 6, each of the five cavities has a slightly different geometry. Therefore, the resonant modes of the cavities have different resonant frequencies. All of the cavities are optically coupled into the bus line waveguide on the right side. In this specific example, the geometry tuning is achieved by tuning the position of a central rod. It should be noted that there are other ways to achieve the resonant frequency tuning, for example by changing the air hole diameters, air hole spacing, local refractive index, etc.

Figure 7:
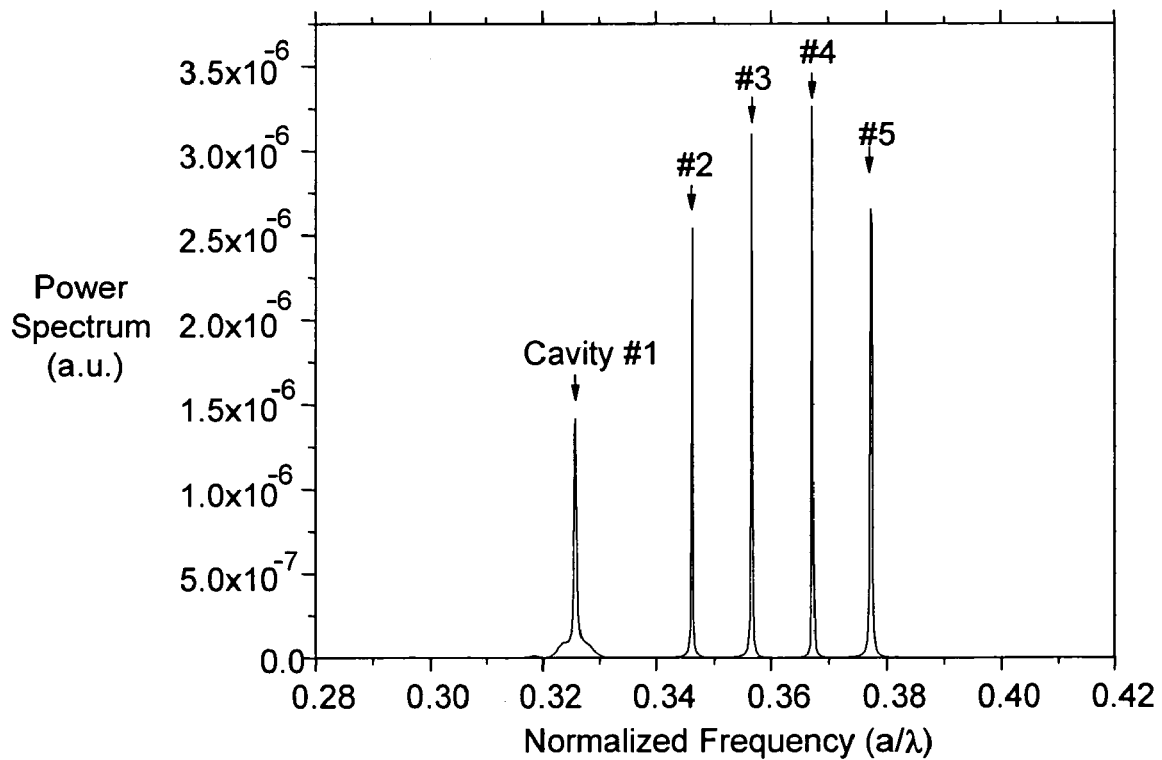
FIG. 7 is a graph which illustrates the spectra of the EM fields measured in each of the 5 cavities of FIG. 6.

In simulating this arrangement, a broadband Gaussian impulse was sent from the lower part of the waveguide, as shown in FIG. 6. EM (Electromagnetic) fields inside each cavity were also monitored by 5 point detectors inside each cavity. FIG. 7 shows the spectra of the EM fields measured in each of the 5 cavities.

With reference to FIG. 7, the spectra were obtained through DFT (discreet Fourier transform) of the time domain signals modeled through FDTD. It can be seen that the five cavities resonate at normalized frequencies of ~0.3255, 0.3459, 0.3559, 0.3666, and 0.3774 respectively. It should be noted that these normalized frequencies follow the convention used in other references, such as J. D. Joannopoulos, et al., "Photonic Crystals," Princeton University Press (1995), pp.56. In this particular case, the frequency is normalized to the lattice constant of the square lattice photonic crystal (i.e. the pitch between the rods).

Figure 8A:
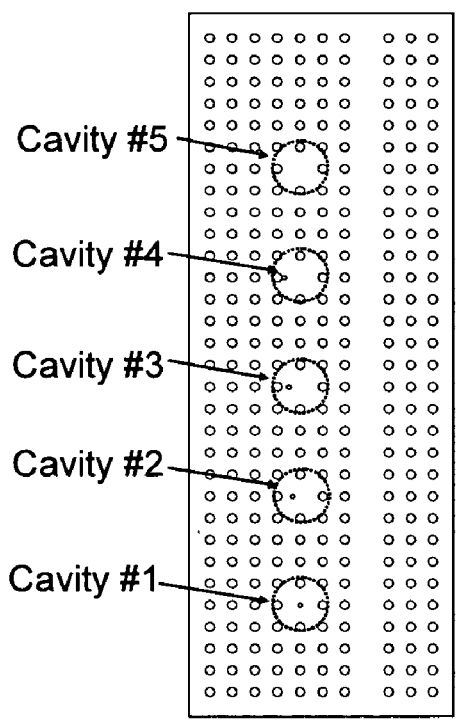
FIGS. 8A and 8B illustrate the reduction of cross-talk occurring between different microcavities when the microcavities have different resonant frequencies, one of such frequencies being 0.3774.
Figure 8B:
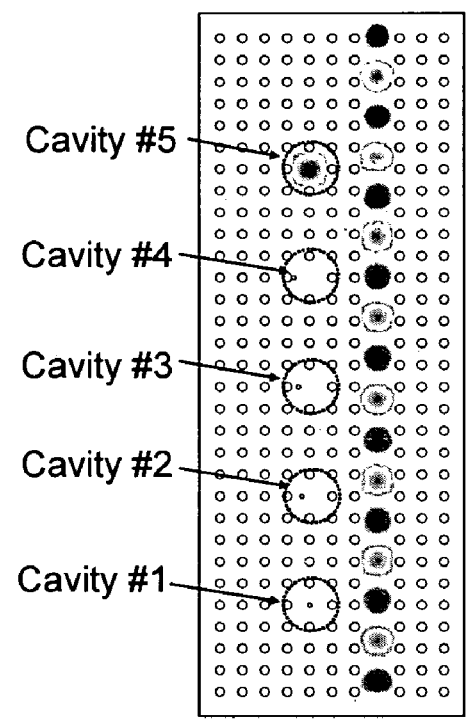

FIGS. 8A and 8B further demonstrate that there is no cross-talk between different cavities when the cavities have different resonant frequencies. In these figures, narrow bandwidth excitation sources were introduced in the simulation domain. FIG. 8B shows a snap shot of the EM field when the excitation source was set at a normalized frequency of 0.3774. An identical scaled structure plot was reproduced in FIG. 8A. It can be seen from these figures that the EM field at normalized frequency 0.3774 only exists in the cavity #5 and the output coupling waveguide.

Figure 9A:
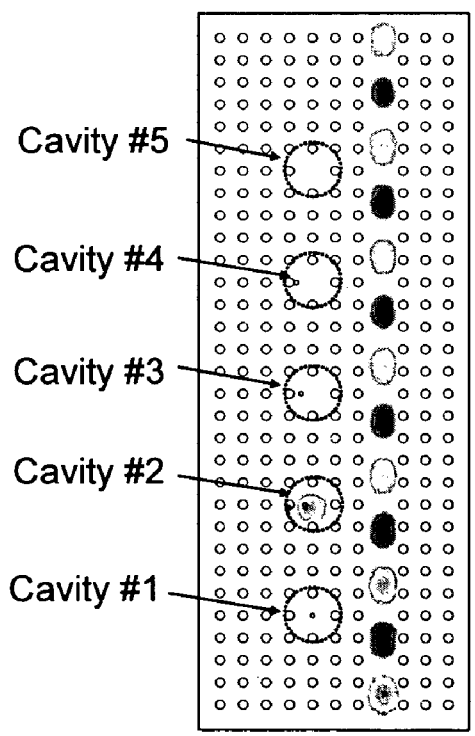
FIGS. 9A and 9B illustrate the reduction of cross-talk occurring between different microcavities when the microcavities have different resonant frequencies, with two of such frequencies being 0.3459 and 0.3559.
Figure 9B:
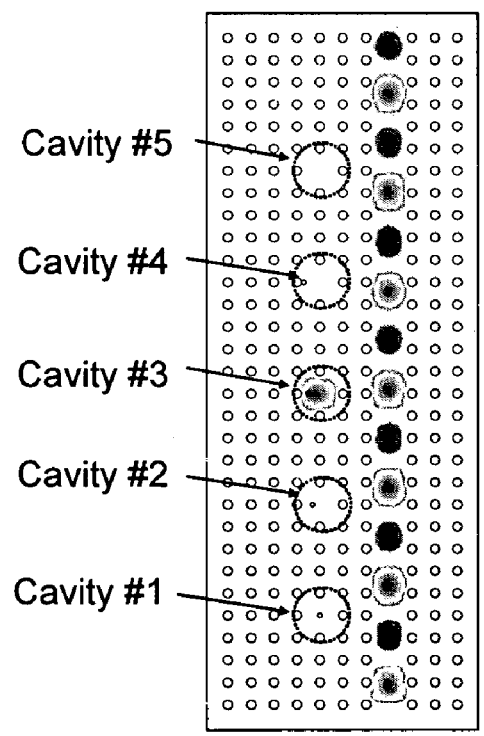

The same test was repeated at the normalized frequencies of 0.3459 and 0.3559, as shown in FIGS. 9A and 9B. It can be seen from FIGS. 9A and 9B that each cavity (e.g., cavity #2 and #3) oscillates and couples to the bus line waveguide independently.

Figure 10A:
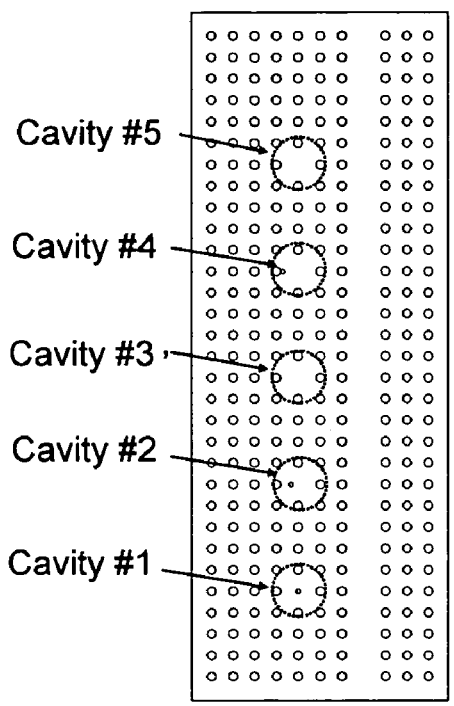
FIGS. 10A and 10B illustrate a scenario in which two or more microcavities oscillate at a similar or common frequency.
Figure 10B:
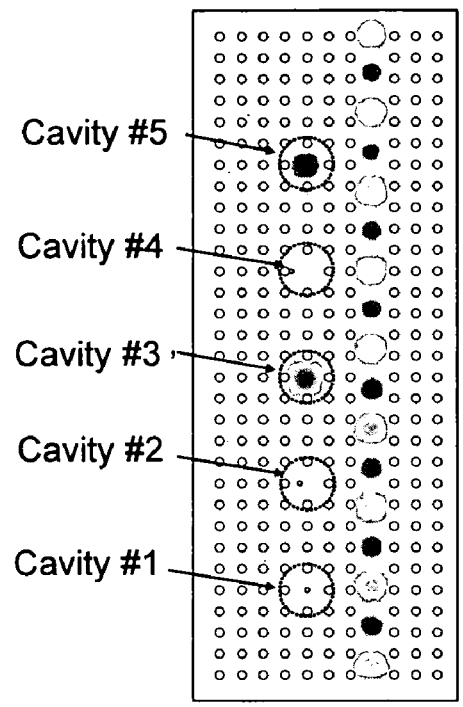

FIGS. 10A and 10B depict cases in which there are two or more microcavities oscillating at a similar or common frequency, and are seen to demonstrate the importance of minimizing optical cross-talk for the microcavities. In FIGS. 10A and 10B, the original cavity #3 (from FIGS. 8A, 8B, 9A and 9B) was modified to cavity #3', which has identical geometry as cavity #5. Since cavities #5 and #3' have identical geometry, they can oscillate at a common frequency (i.e. 0.3774). FIG. 10B is a snapshot of the resulting EM field. As expected, a strong EM field exists in both cavity #5 and cavity #3'. This is one example of a strong optical cross-talk between two microcavities.

Therefore, by embedding of an array of photonic microcavities in a media of photonic crystal, by coupling the cavities into a common waveguide to generate output, and by forming the array of microcavities to resonate at different wavelengths, it can be seen that virtually no cross-talk occurs. This analysis and design would be good enough for many WDM multiplexers, such as those described in U.S. Pat. No. 6,738,551 and U.S. Patent Application No. 20020191905. However, in order to address the above-mentioned considerations for incoherent high power laser arrays as described above, a gain and carrier injection mechanism would still be needed for the microcavities.

Figure 11:
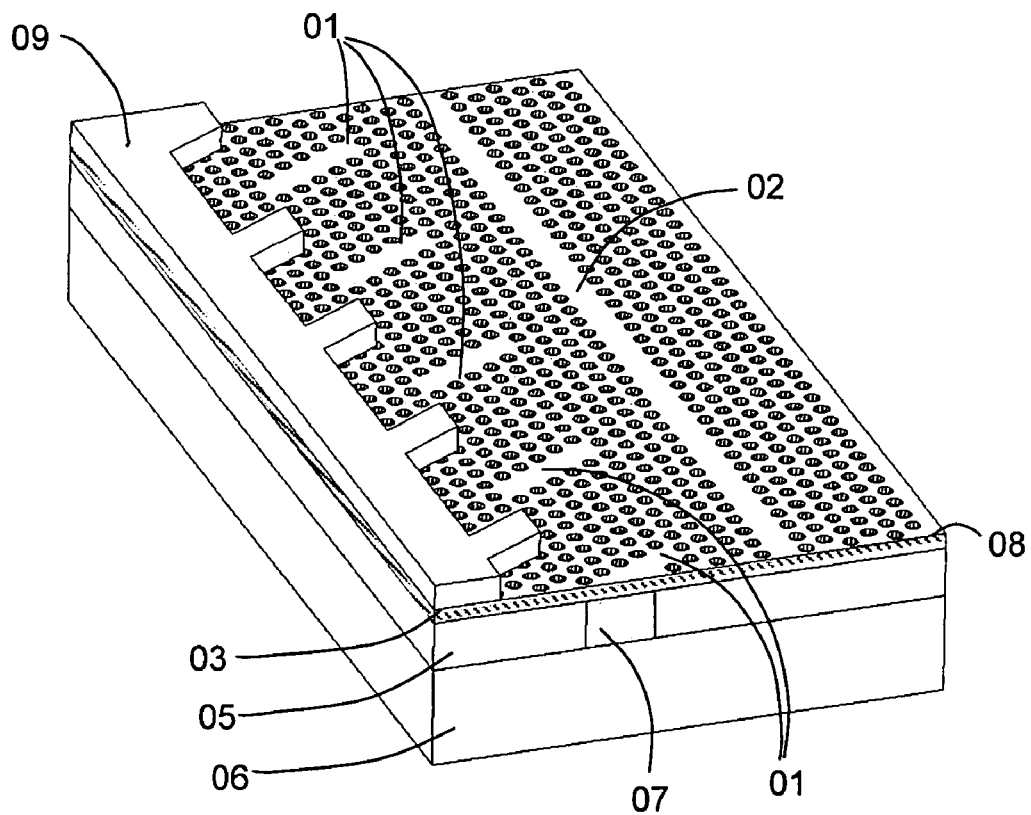
FIG. 11 depicts an arrangement for electrical injection of microcavities in a 2D slab of photonic crystal, in accordance with a representative embodiment of the invention.

Turning to FIG. 11, one representative embodiment is depicted for electrical injection of the microcavities in a 2D slab of photonic crystal. In this embodiment, photonic crystal microcavities 01 are formed in a slab of 2D photonic crystal. A bus line waveguide 02 is also formed in the same slab of 2D photonic crystal. A semiconductor slab 03 provides relatively high refractive indices (e.g. InP is ~3.2 in near infrared wavelengths, GaN is ~2.42 near green/blue wavelengths). Embedded in the slab 03 are quantum wells 08. A low refractive index cladding layer 05 is formed by amorphous aluminum oxide (AlO$_x$). An electrically conductive channel 07 is formed by doped semiconductors (e.g. AlAs and/or AlN). This conductive channel 07 is formed under the area of the active photonic crystal microcavities 01, to facilitate electrical injection into each microcavity 01 and to realize light. A doped semiconductor substrate 06 is preferably positioned beneath the cladding layer 05. An electrode metal contact 09 is also formed, and is normally an n-type contact for reasons that will be explained later.

Figure 12:
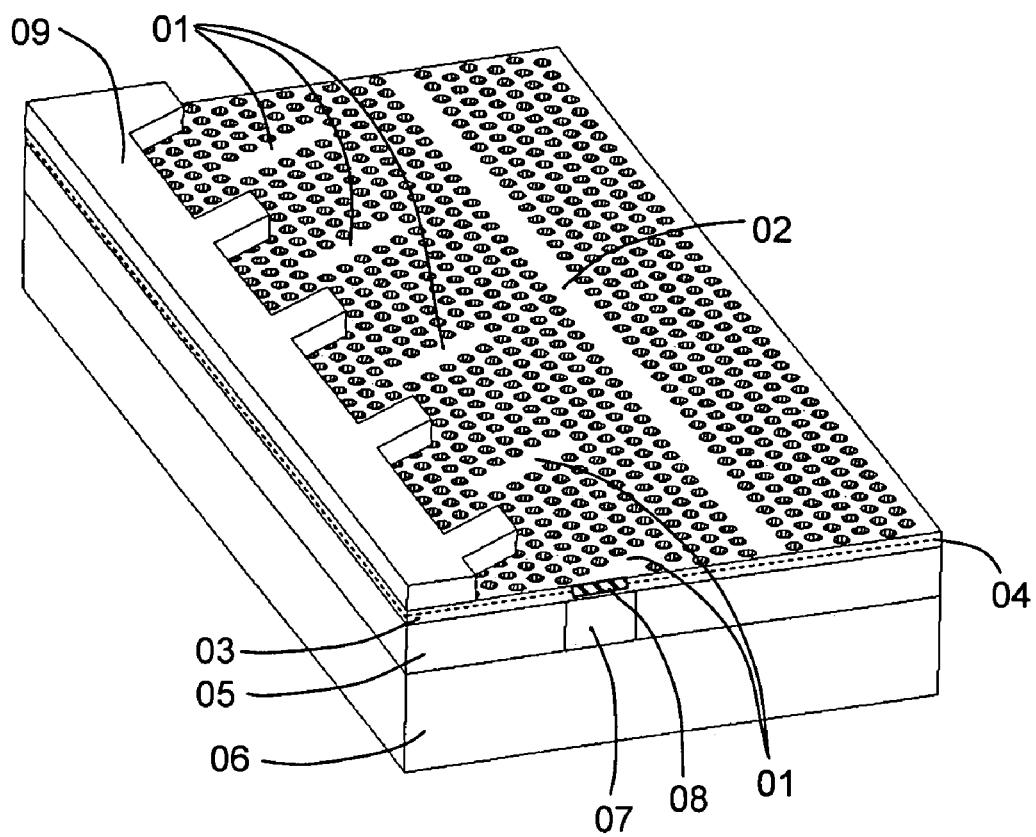
FIG. 12 depicts an alternative arrangement for electrical injection of microcavities in a 2D slab of photonic crystal, in accordance with a representative embodiment of the invention.

Turning to FIG. 12, another representative embodiment is depicted for electrical injection of the microcavities in a 2D slab of photonic crystal. In this embodiment, photonic crystal microcavities 01 are formed in a slab of 2D photonic crystal. A bus line waveguide 02 is also formed in the same slab of 2D photonic crystal. A semiconductor slab 03 provides relatively high refractive indices (e.g. InP is ~3.2 in near infrared wavelengths, GaN is ~2.42 near green/blue wavelengths). Embedded in different areas of the slab 03 are passivated quantum wells 04 and active quantum wells 08. A low refractive index cladding layer 05 is formed by amorphous aluminum oxide (AlO$_x$). An electrically conductive channel 07 is formed by doped semiconductors (e.g. AlAs and/or AlN). This conductive channel 07 is formed under the area of the active photonic crystal microcavities 01, to facilitate electrical injection into each microcavity 01 and to realize light. A doped semiconductor substrate 06 is preferably positioned beneath the cladding layer 05. An electrode metal contact 09 is also formed, and is normally an n-type contact for reasons that will be explained later.

Figure 13:
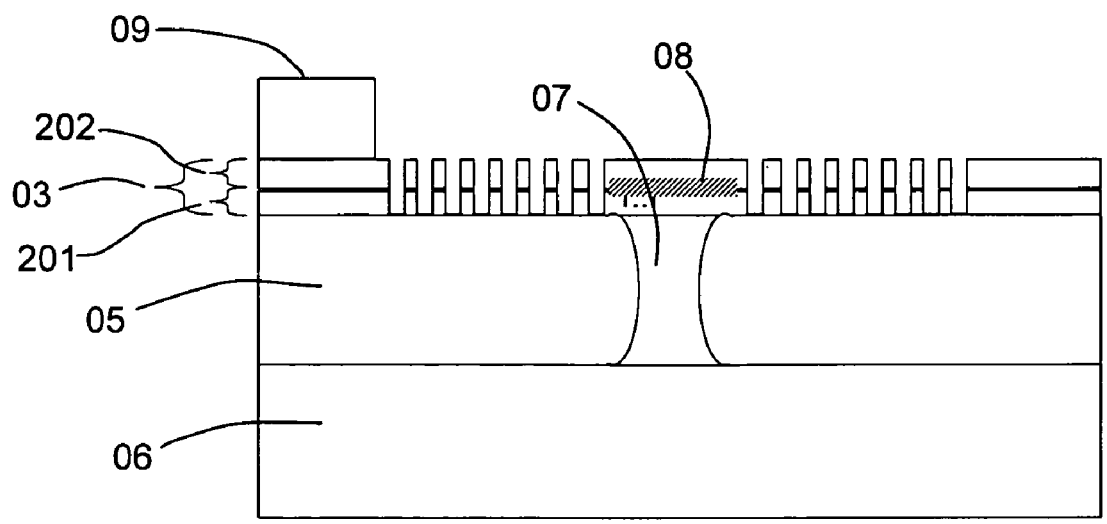
FIG. 13 is illustrates the cross-section of the front side of FIG. 12.

FIG. 13 illustrates additional characteristics of the cross-section on the left side of FIG. 12, i.e. the active portion of the system. It should be noted that FIG. 13 is not necessarily drawn to scale. To facilitate efficient electrical injection, and in view of the electrode metal contact 09 being an n-type contact, the slab 03 is doped to n-type and p-type semiconductors in its upper 202 and lower 201 halves, respectively. The thickness of the AlO$_x$ cladding 05 is preferably in the range of 1- to 2-μm to ensure both adequate optical confinement and to reflect practical fabrication limitations. The total thickness of the slab 03 is preferably in the range of 0.3- to 0.5-μm. In addition, the substrate 06 can have a thickness as large as 200- to 300-μm to provide mechanical support to the whole integrated system.

As a further improvement with respect to the basic structure shown in FIG. 11, selective passivation procedure of the active materials (e.g. quantum wells) can be utilized. With such a passivation process, one can avoid the optical absorption that may arise in the waveguide region due to under pumped quantum wells. In this regard, and with reference to FIGS. 12 and 13, the active materials (e.g. quantum wells) in the areas outside the optically confined volume of each microcavity can be selectively passivated. One method to realize such selective passivation is to utilize a quantum well ion implantation technique in combination with an aligned photolithography procedure. This method protects the light source cavity area with photo resist and exposes other areas for ion implantation, thereby passivating selected quantum wells.

Figure 14:
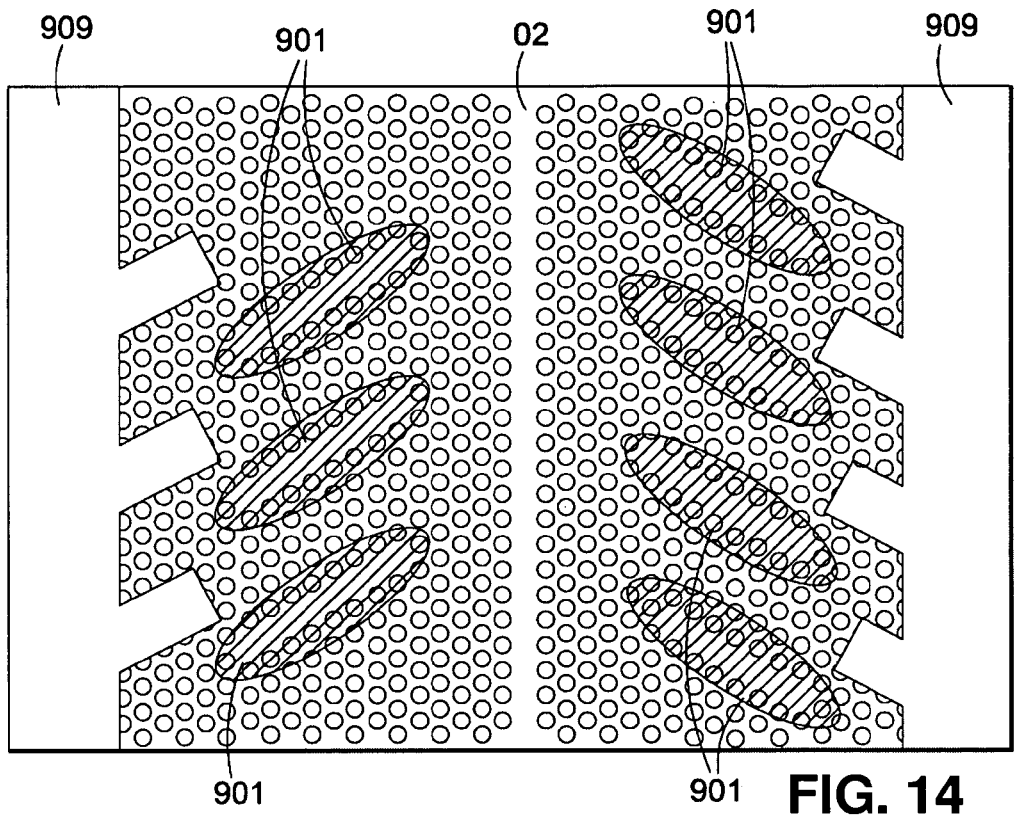
FIG. 14 is a top-view of an alternative arrangement of FIG. 5, in which microcaivities are aligned in a non-parallel fashion on both sides of waveguide to form a denser packed array, in accordance with another embodiment of the invention.

FIG. 14 is a diagram in which microcaivities are 901 aligned in a non-parallel fashion on both sides of waveguide 02 to form a denser packed array, in accordance with another embodiment of the invention. In this regard, it should be noted that there are various ways to arrange the microcavities with respect to each other, in order to maximize the density of devices coupling into a common waveguide, which remains passive. In addition, the electrode metal contact can be shared by multiple microcavities for electrical injection.

The photonic crystal of FIGS. 12 to 14 may be fabricated in the following manner, with such fabrication producing light source in the 1.55 μm wavelength range. Most data projector applications may need visible wavelengths (between 400 nm and 700 nm), which can be realized by the same design discussed here for longer wavelength by simply resealing the geometry linearly according to the scalability of Maxwell's equations, especially in the context of photonic crystals. A description of such scalability of Maxwell's equations can be found in J. D. Joannopoulos, et al., "Photonic Crystals," Princeton University Press (1995), pp.19.

In this example, a thickness of a InGaAsP/InP membrane was chosen as ~300-nm and the underlying cladding as ~2-μm amorphous aluminum oxide (AlO$_x$). The InGaAsP/InP has 4~7 strained quantum wells embedded therein to provide optical gain in the order of 10$^3$/cm. A description of such gain can be found, for example, at L. A. Coldren and S. W. Corzine, "Diode Lasers and Photonic Integrated Circuits," John Wiley & Sons, New York (1995). The thickness of the InGaAsP/InP membrane was chosen to be thin enough to avoid multimode slab waveguide effects, which could close the in-plane photonic crystal bandgap. A further description for such selection of thickness can be found in C. W. Kim, W. J. Kim, A. Stapleton, J. R. Cao, J. D. O'Brien, and P. D. Dapkus, "Quality factors in single-defect photonic-crystal lasers with asymmetric cladding layers", Journal of Optical Society of America B 19, 1777, (2002). The thickness of the AlO$_x$ was chosen to be more practical for real device fabrications as ~2-μm.

It should be noted that the light source devices, such as those illustrated in FIG. 11 through 30, can easily be operated under non-lasing conditions and used as LED arrays. In addition, when used as LEDs, the device fabrication requirements can be significantly less stringent.

To reach a laser threshold with material gain g~10$^3$/cm, a material internal loss ~5/cm, and an optical confinement factor ~0.1, a cavity mode quality factor Q>200 should be obtained. It should be noted that quality factor Q generally corresponds to the ratio between the average energy stored in an original system and the coupling power flow from this system to another system or the environment.

The above estimation is obtained from the following threshold relationship:

$$Q = \frac{\omega}{\Gamma \cdot G_{threshold} - \alpha_{internal}},$$

where ω is the laser central frequency, $G_{threshold}$ is the quantum well material gain at the threshold inversion, Γ is the spatial confinement factor of the lasing mode with respect to the quantum wells, and $\alpha_{internal}$ is the material internal optical loss at the lasing wavelength. At 1.55 μm wavelengths, ω≈1×10$^{15}$/s. In addition, $G_{threshold}$=$g_{threshold} \cdot v_g$≈10$^3$/cm×10$^{10}$ cm/s≈10$^{13}$/s. The estimation of confinement factor Γ was obtained by a simplified model, i.e. 1-D waveguide finite-difference calculation.

Figure 15:
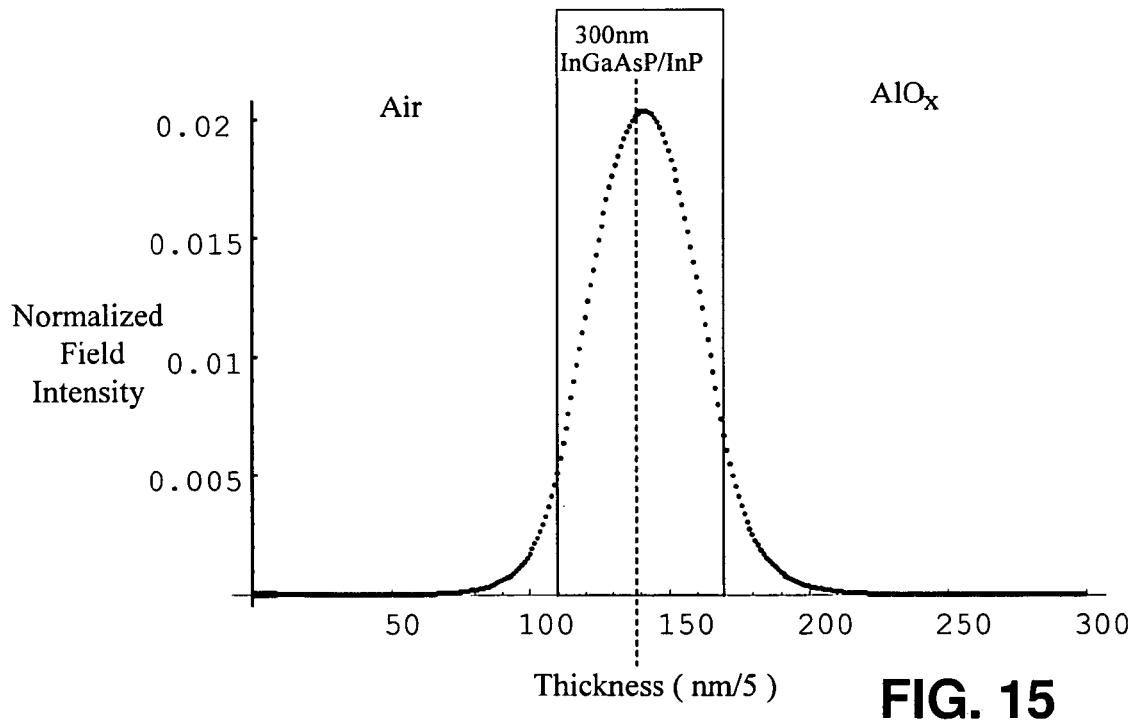
FIG. 15 is a graph depicting a 1-D finite-difference calculation which estimates the vertical confinement factor of quantum wells imbedded in a 300-nm InGaAsP/InP slab with Air and $AlO_x$ claddings.

A 1D calculation result is shown in FIG. 15, where each data point corresponds to a 5-nm thickness. FIG. 15 shows that the asymmetry between the refractive indices of air and AlOx only cause a minor shift of the confinement peak position (<20 nm). Given a single quantum well thickness ~10 nm, the peak vertical confinement factor to each quantum well is ~0.04. If 4 such quantum wells are placed near the peak position of the vertical confinement, an effective vertical confinement factor as high as 0.15 can be obtained. Taking into account the in-plane (i.e. x-y plane of the slab itself) confinement factor, a very conservative estimation of ⅔ can be made, since high in-plane confinements are common in photonic crystal defect structures. Such common structures have been further described in O. Painter, et al., "Tailoring of the resonant mode properties of optical nanocavities in two-dimensional photonic crystal slab waveguides," J. Opt. A.: Pure Appl. Opt. 3, S161-S170 (2003). This leads to a conservative estimation of an obtainable 3-D confinement factor >0.1. In view of the threshold condition, it can be seen that it is not difficult to meet the Q threshold, if the target is to obtain laser light without the concerns of whether the device will be overheated by the pumping of the quantum well to sustain its $10^3$/cm peak gain.

However, to sustain a practical room-temperature continuous wave (CW) laser, the bar of the threshold Q should be raised considerably. As a starting point, a typical 500-μm long broad area edge emitting laser diode can be used as a reference. Using the cleaved facets (i.e. reflectivity ~0.3), the lasing modes (multimode laser cavity) of such a device have Qs of ~4,000. These edge emitting laser diodes can be operated under room-temperature CW conditions, if appropriate heat sinks are implemented. Therefore, if the photonic crystal structures for the present invention are designed to have similar thermal dissipation ability as those broad area edge emitting laser diodes, a Q of ~4,000 would be needed to obtain room-temperature CW operations.

It should be noted that the assumption of "similar thermal dissipation ability" is not a trivial target. If one considers the thermal generation patterns and abilities of these devices, they can be quite different from each other depending on electrical injection's series resistance and distribution, although the thermal conductivity of sapphire and InP are similar to each other. A further discussion of thermal conductivity is found in Sapphire's thermal conductivity at 298 Kelvin is ~40 Watt/(Meter·Kelvin) according to G. V. Samsonov, "The Oxide Handbook ($2^{nd}$ Ed.)" IFI/Plenum, New York-Washington-London. The thermal conductivity of InP (n-type-$10^{16}$/cm$^3$) near room temperature is ~68 Watt/(Meter·Kelvin) according to Aliev, S. A., A. Ya. Nashelskii, and S. S. Shalyt, Sov. Phys. Solid State 7, 1287 (1965), or http://www.ioffe.rssi.ru/SVA/NSM/Semicond/InP/thermal.html. One obvious difference in thermal management is that the series resistance is expected to be different for these semi-lateral injection devices compared with the trivial vertical injections of broad area edge emitting laser diodes.

Therefore, it is recommended to target on the cavity model Q at least in the range of $10^4$, to provide maneuvering space when electrical injection and thermal dissipation require some compromise. Also, this Q value is not a difficult value to reach, given the existing reports on these 2-D slab photonic crystal cavities. Although most of those reported results do not have AlOx as substrate, it is expected that Q~$10^4$ is obtainable on $AlO_x$ substrate, as long as the size of the cavity can be slightly relaxed. Further discussion is found in J. R. Cao, Ph.D. Thesis, "Photonic Crystal Microcavity Lasers and Laser Arrays," University of Southern California, Los Angeles (2004).

Figure 16:
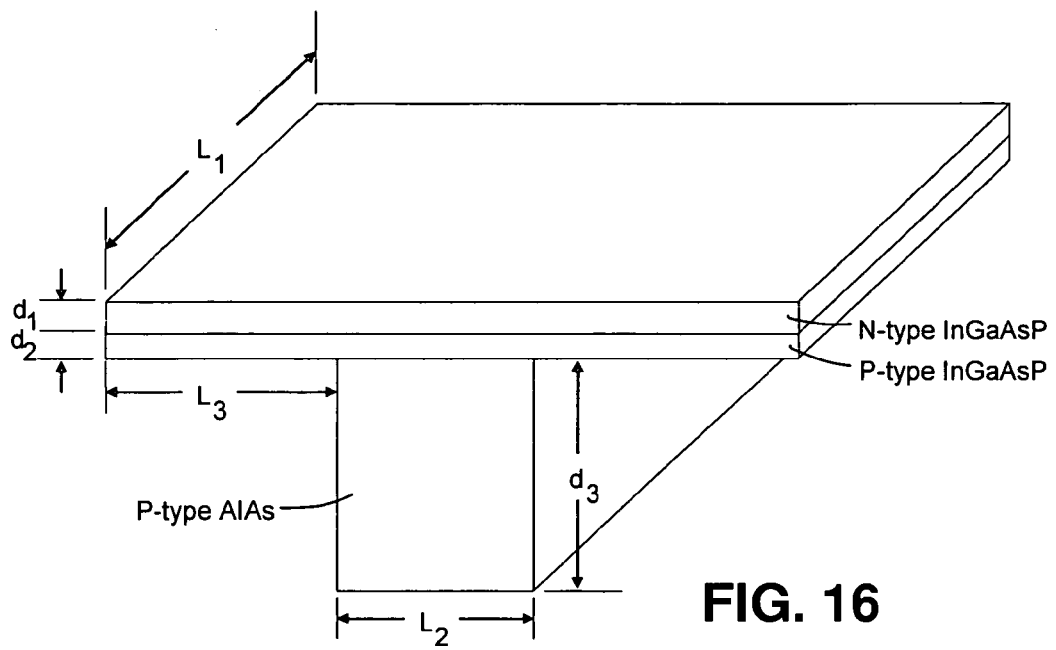
FIG. 16 is a perspective view depicting a bulk resistant model for a presumed linear shape photonic crystal cavity.

Referring now to FIG. 16, an estimate of the serial resistance of the photonic device will now be discussed. Estimating serial resistance is important when accounting for the heat distribution that occurs as a result of electrical injection into the light-emitting photonic devices. In addition, external quantum efficiency and series resistance associated with the electrical injection are important in determining the final wall-plug efficiency of the total light emitting system.

FIG. 16 is an illustration showing a bulk resistant model for a presumed linear shape photonic crystal cavity (e.g., FIG. 12), where the effect of air holes is not yet considered. The effect of the air holes will be considered later as a linear factor, which effectively reduces the cross-section width $L_1$. The arrangement of N-type material on top of P-type material is seen to be an unusual arrangement, considering that usually high quality N-type substrates are used in semiconductors, instead of P-type semiconductors. This arrangement is due to the fact that the mobility of electrons is in general much higher than the mobility of holes. To maintain the highest electron-hole pair concentration near the top of the P-type AlAs post, such an up-side-down arrangement is preferred.

Figure 17:
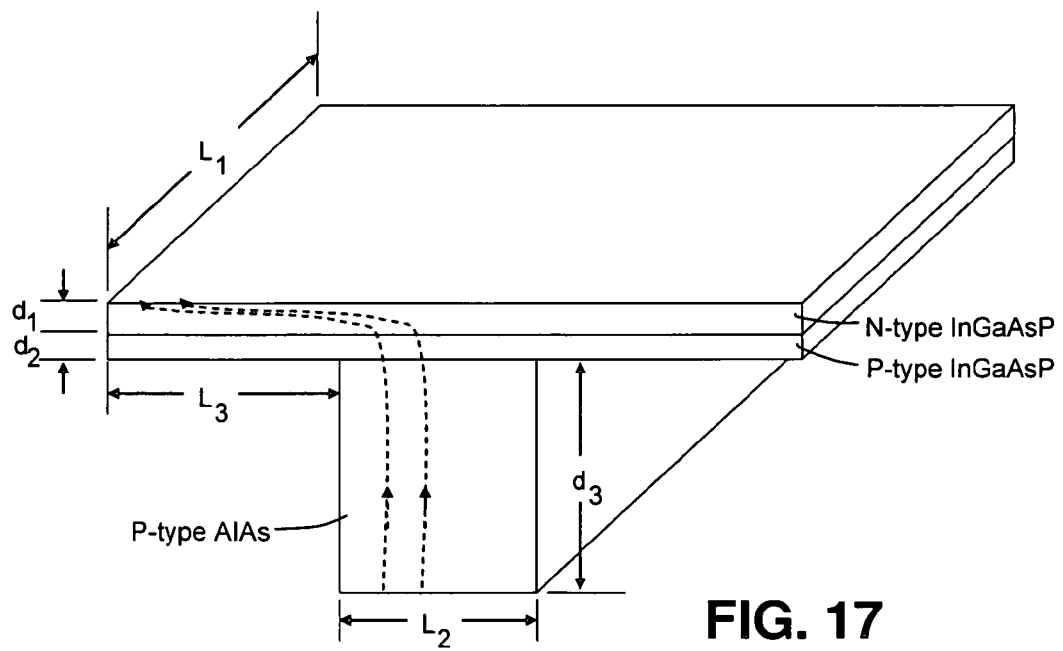
FIG. 17 illustrates the dominant current path of the perspective view of FIG. 16.

A simplified current path in this resistance model is shown in FIG. 17. The current is injected on the far-left edge of the T-shape. The n-type InGaAsP is chosen to be on the top. This configuration utilizes the fact that the electron mobility in InP is more than 20 times higher than the hole mobility, which is also true for many other semiconductors. Because of this high contrast in mobility, the electrons injected from the n-contact can reach the top of the AlAs post and recombine with the holes right at the top of the AlAs post, where the laser cavity is located. Holes from the AlAs will not have adequate mobility to spread out in the P-type InGaAsP slab. Therefore, the current path is seen to resemble that shown in FIG. 17.

With such current distribution, the total series resistant can be estimated as follows:

$$R_{total} = R_{d1} + R_{AlAsPost} = \left[\frac{1}{e \cdot \mu_e \cdot N_e}\right] \cdot \frac{L_3}{d_1 \cdot L_1} + \left[\frac{1}{e \cdot \mu_h \cdot N_h}\right] \cdot \frac{d_2 + d_3}{L_1 \cdot L_2},$$

where e is the absolute electron charge, $\mu_e$~3000 cm$^2$/(V·s) is the electron mobility in InGaAsP (using an InP value for estimation purpose here), $\mu_h$~100 cm$^2$/(V·s) is the hole mobility (almost same for both InP and AlAs), $N_e$ and $N_h$ are doping concentrations, and other dimension parameters are labeled in FIG. 15. Assuming that $d_1$=0.15 μm, $d_2$=0.15 μm, $d_3$=2 μm, $L_1$=10 μm, $L_2$=1 μm and $L_3$=5 μm, then the total series resistance is as follows:

$$R_{total} = R_{d1} + R_{AlAsPost} \approx 70\Omega + 30\Omega.$$

In considering the influence of air holes, an equivalent reduction of $L_1$ by a factor of 2 to 5 can be made, depending of the filling ratio of the photonic crystal design. Therefore, with careful design, the series resistance may be controlled in the order of ~200 Ohms, which is seen to be a manageable value. In fact, this value is comparable to some of the traditional VCSELs (vertical cavity surface emitting lasers). Although this series resistance may possibly be too large for pushing the external power efficiency above 50%, it is not difficult to push the power efficiency to 15%. Pushing the power efficiency to 15% is competitive with existing VCSELs in the market, which do not have the advantages of the photonic crystal monolithic integration.

Figure 18A:
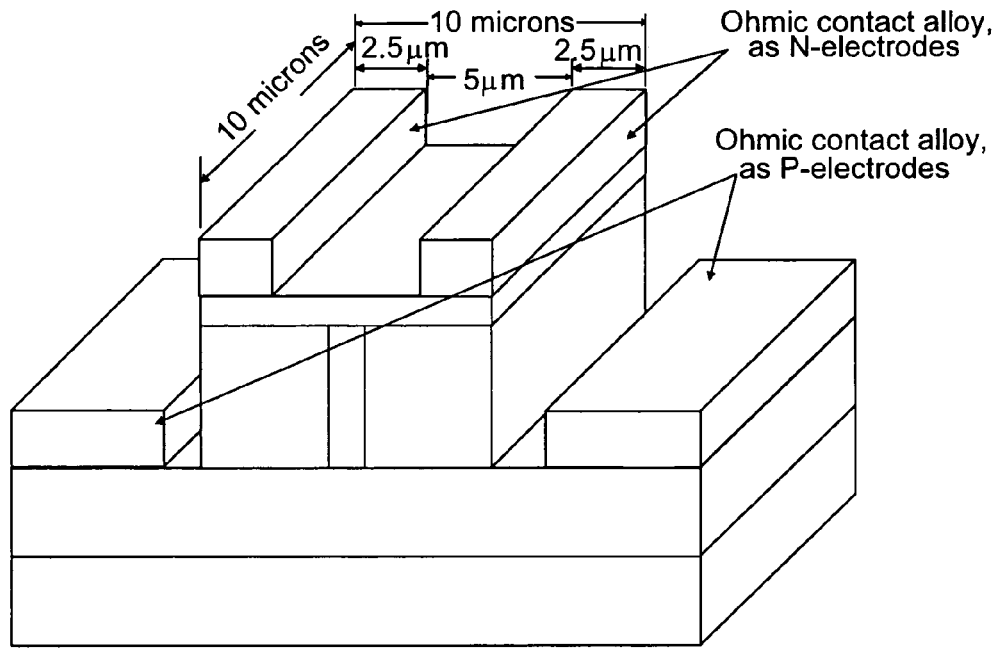
FIGS. 18A and 18B illustrate a photonic crystal laser arrangement corresponding to a Structure A, in accordance with a representative embodiment of the invention.
Figure 18B:
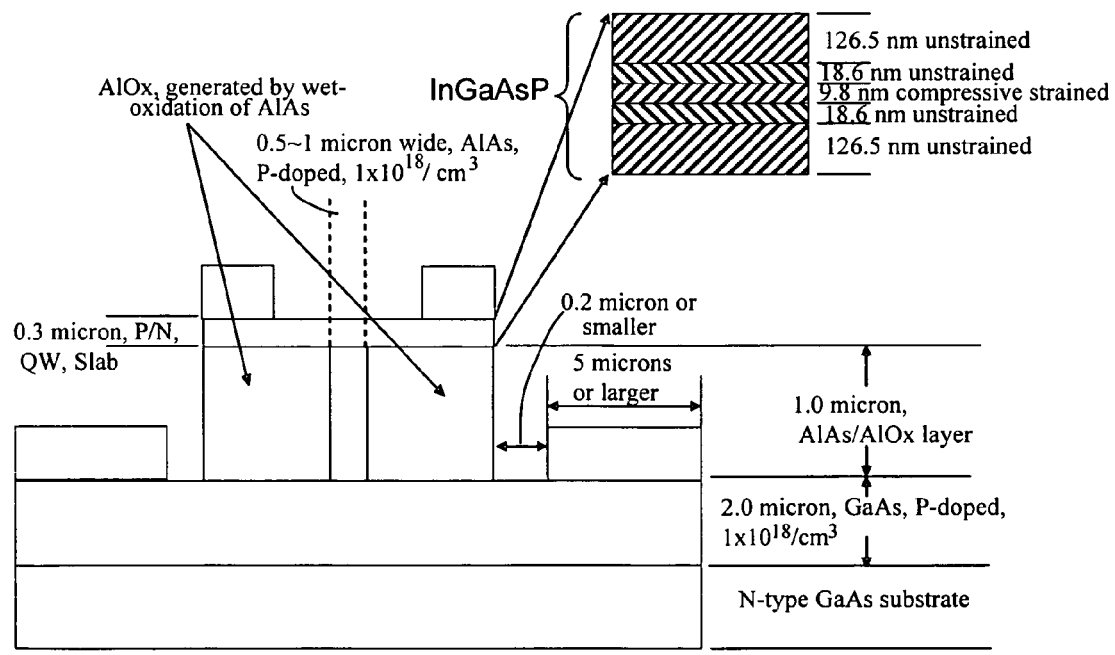
Figure 19A:
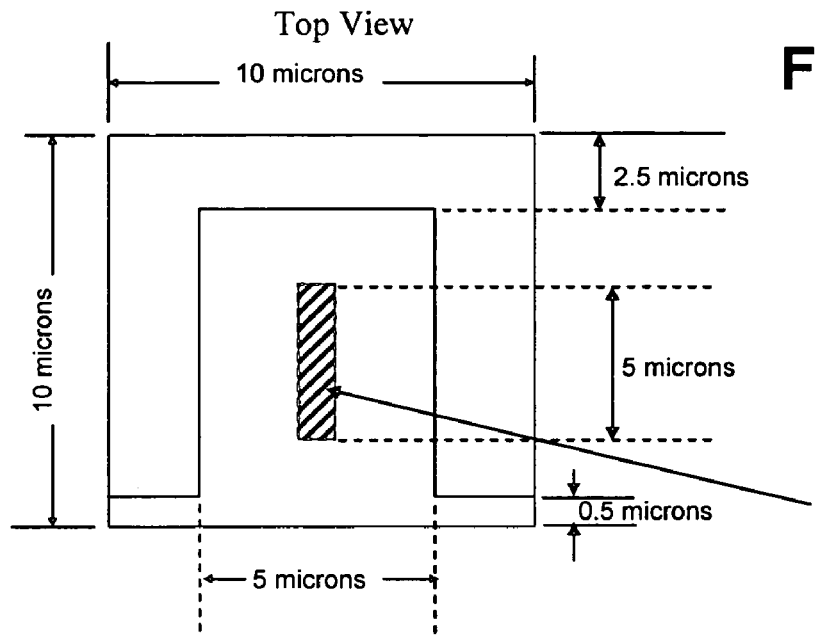
FIGS. 19A to 19C illustrate a photonic crystal laser arrangement corresponding to a Structure B, in accordance with a representative embodiment of the invention.
Figure 19B:
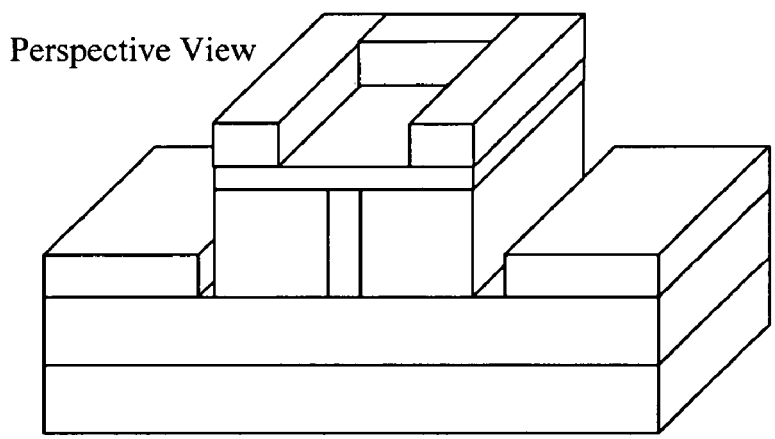
Figure 19C:
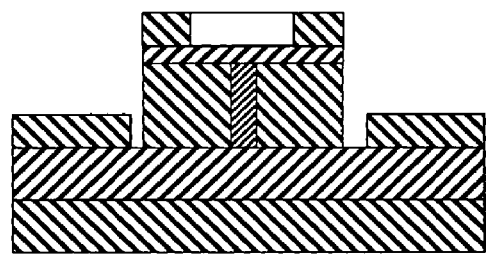

Further quantifications were determined using FEM (finite-element method) numerical modeling of the electrical injection. As a starting point, electrical injection into the T-shape structures (such as those illustrated in FIG. 16 and FIG. 17) were evaluated without the introduction of air-holes. FIGS. 18A and 18B correspond to a Structure A in the FEM simulations, and FIGS. 19A to 19C correspond to a Structure B in the FEM simulations. Structure A can be seen as a transitional geometry from simple two-dimensional (cross-section) structures into real three-dimensional structures (such as Structure B).

Figure 20:
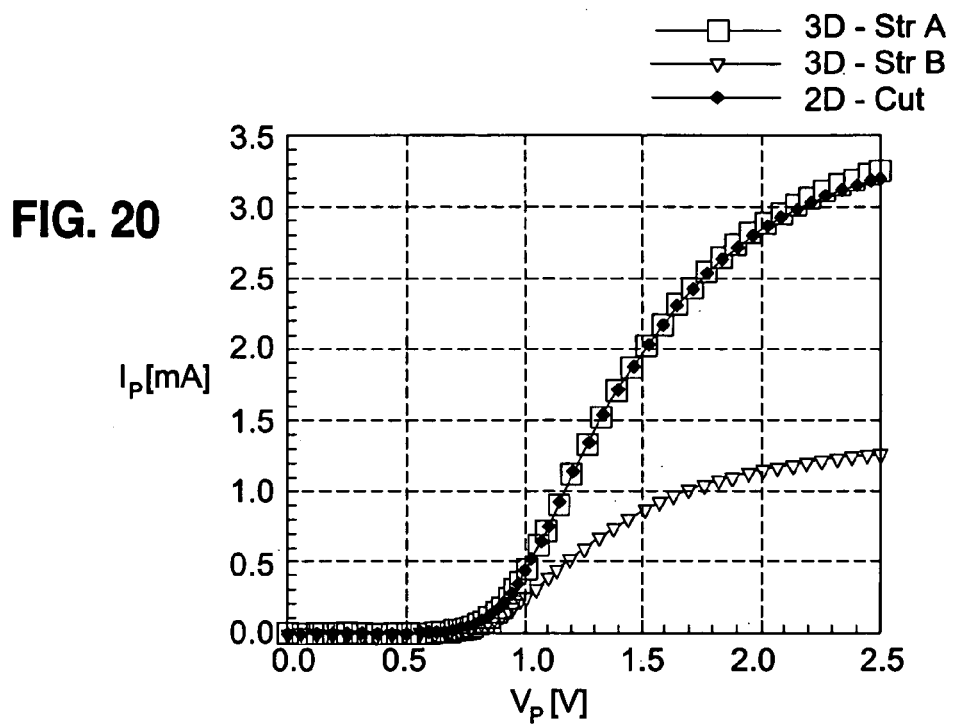
FIG. 20 is a graph illustrating FEM simulation results for electrical injections in Structures A and B.
Figure 21A:
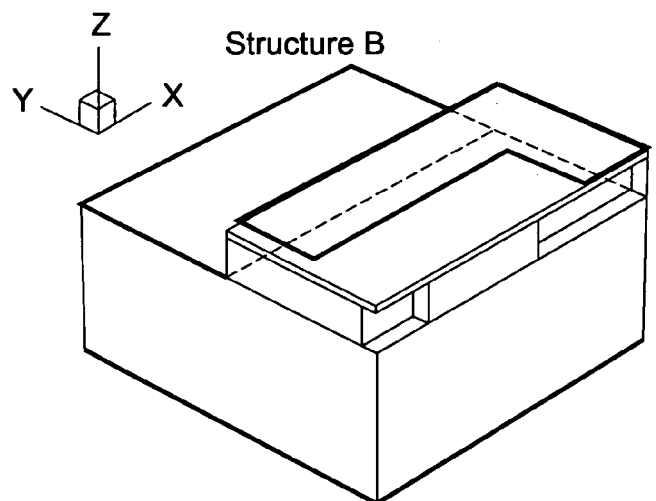
FIGS. 21A and 21B illustrate a current distribution corresponding to Structure B.
Figure 21B:
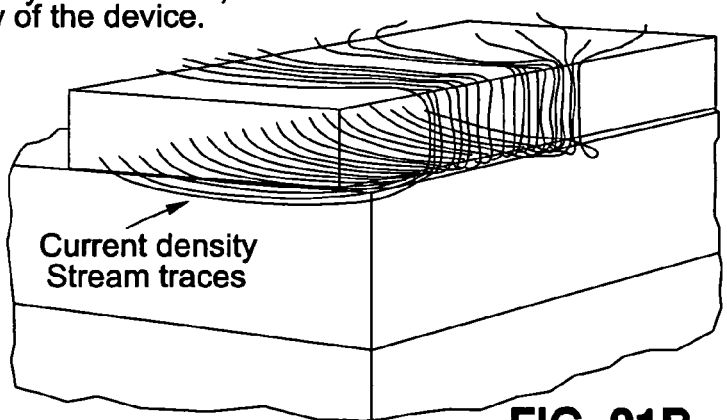

The FEM simulation results for the electrical injections are shown in FIG. 20, as the device I-V characteristic (electrical current-bias relation). The I-V characteristic is consistent with typical semiconductor laser diodes. Moreover, the current distribution, as plotted in FIGS. 21A and 21B, is consistent with the analytical prediction given discussed with reference to FIG. 17.

As noted above, one of the key characteristics for such incoherent power combining system to function is that each light source cavity resonates at a different wavelength. However, in typical WDM systems, such as Thorlab's DWDM820, the absolute accuracy of the center wavelengths in the range of 0.01 nm is required. Such high absolute accuracy is difficult to realize by any monolithic fabrication process directly. Therefore, these WDM systems all utilize implementations of dynamic wavelength monitoring and feedback systems, which are typically high cost and low yield components, not to mention much larger system sizes.

In this embodiment of the present invention, however, such a high absolute accuracy controlling of the wavelengths is not necessarily required. In practice, the necessary wavelength control accuracy can be realized by monolithic fabrication directly, without any dynamic feedback mechanism.

In releasing the stringent control of the absolute wavelengths, an intrinsic control accuracy of ~1 nm can be used, without any dynamic feedback system. Such a control accuracy is obtainable in commercial lithography systems. For example, 5 channels (wavelengths) can be implemented in this ~1 nm span. Presuming that cavity Qs are ~50,000, the function wavelength near 500-nm coupling linewidth of each cavity is ~0.01 nm. Therefore, there are ~100 possible wavelength values in the 1 nm range. An estimate can be made as to the possibility of randomly choosing 5 of the wavelengths within the 100 possibilities and having two or more wavelengths overlapping each other. A conservative estimation of the chance of two or more channels overlap with this 1 nm range is $$1 - \frac{100!/(100-5)!}{100^5} = 0.0965.$$

In other words, the possibility of having a good system, without any wavelength feedback system in this design is better than 90.35%. In one embodiment, a few redundant light sources can be preemptively introduced into an array, for example by patterning 120 light source cavities when only 100 light source elements are needed, taking into consideration the >20 nm gain bandwidth obtainable in many practical quantum well devices. By doing so, even in the 9.65% chance that two or more light source elements have their wavelengths overlapped, the electrical injections into these overlapping light source wavelengths can simply be turned off, and several of the 20 redundancy light source elements can be turned on to make sure that the total system still functions as designed. This improves the yield of wavelength separation to nearly 100%. The methods of realizing individual light source element addressability will be presented in a later embodiment.

Figure 22:
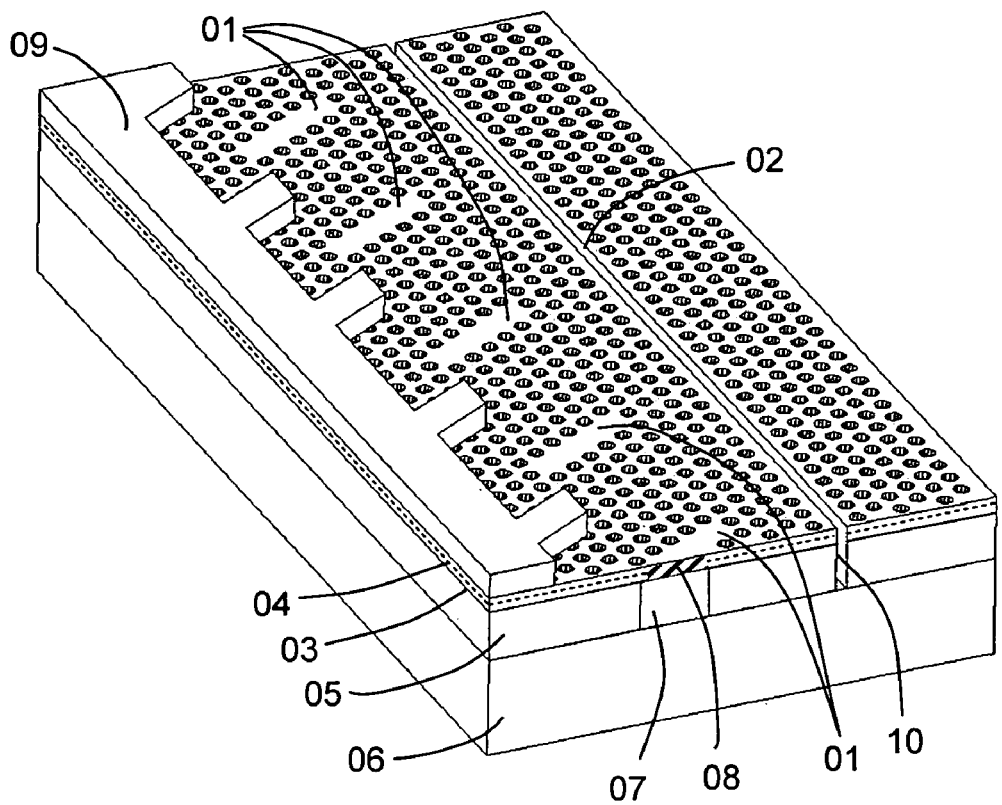
FIG. 22 is a diagram of a photonic crystal device having a waveguide formed as a gap (i.e. air gap bus line waveguide), in accordance with a representative embodiment of the invention.

Turning to FIG. 22, a photonic crystal device having a waveguide formed as a gap according to a representative embodiment of the invention is shown. As noted above with reference to preferred functional characteristics, single mode waveguides are preferred for the function of bus line waveguide. If multimode waveguides were used, then the uneven coupling of the optical power into different guided modes in the bus line waveguides can make the total output beam/spot profile unpredictable and fluctuate with time. Moreover, the transitioning between the different guided mode in the bus line waveguide can significantly complicate the implementation of low optical loss waveguide bends and branches, which are valuable functions for the light emitting system as a whole.

It should be noted that the single mode waveguides referred to do not necessarily correspond to a theoretical definition of single mode waveguides, such as a single guided mode in any frequency, or a single guided mode in the bandwidth of the full photonic crystal bandgap. Rather, the waveguides described are only required to be single mode in the bandwidth occupied by all light source elements in the array. The maximum value of this bandwidth is typically only ~20 nm, which corresponds to the general high gain bandwidth of quantum wells, bearing in mind that all light source elements on a common epitaxial slab are sharing the same quantum well characteristics.

The single mode guiding condition in >20 nm bandwidth for single line defect photonic crystal waveguides is not difficult to realize. For instance, for a triangular lattice 2D slab photonic crystal used in references, a single mode guiding condition is easily satisfied over bandwidths much larger than 20 nm with various geometric parameters (such as the r/a ratio changing from 0.27 to 0.33). Further discussion is found in M. H. Shih et al., "Two-dimensional photonic crystal Mach-Zehnder interferometers," Applied Physics Letters 84(4), 460-2 (2004). However, such single mode designs usually have restrictions limiting the cross-section size and the mode profile size along the waveguides. Namely, if two or more rows of air holes are removed in the triangular lattice photonic crystal with intention to make the guided EM power less concentrated in the narrow guided semiconductor region, then the photonic crystal waveguide quickly becomes a multimode waveguide.

On the other hand, it is undesirable to have large CW EM power collected in a bus line waveguide to propagate through a narrow cross-section of the semiconductor ridge forming the core of the photonic crystal waveguide. Such high EM field concentration will generally stimulate unwanted nonlinear optical loss, other scattering loss, and overheating, especially when the waveguide core semiconductor material is formed after an ion implantation passivation process, which inevitably leaves the semiconductor less pure compared to as-grown semiconductors, where as-grown refers to semiconductors directly formed by epitaxial growth process.

Still referring to FIG. 22, a method that can both retain the single mode condition and reduce the EM field concentration in the semiconductor materials forming the bus line waveguide is presented. In particular, an air gap 10 is formed in the middle of the waveguide core 02. In doing so, one can keep the waveguide's physical cross-section small enough for single mode operation. In addition, since the peak concentration of the EM field is now located in the air gap 10 in the middle, there is virtually no concern for any impurity scattering loss, nonlinear optical loss, or overheating in air compared with passivated semiconductors.

Figure 23:
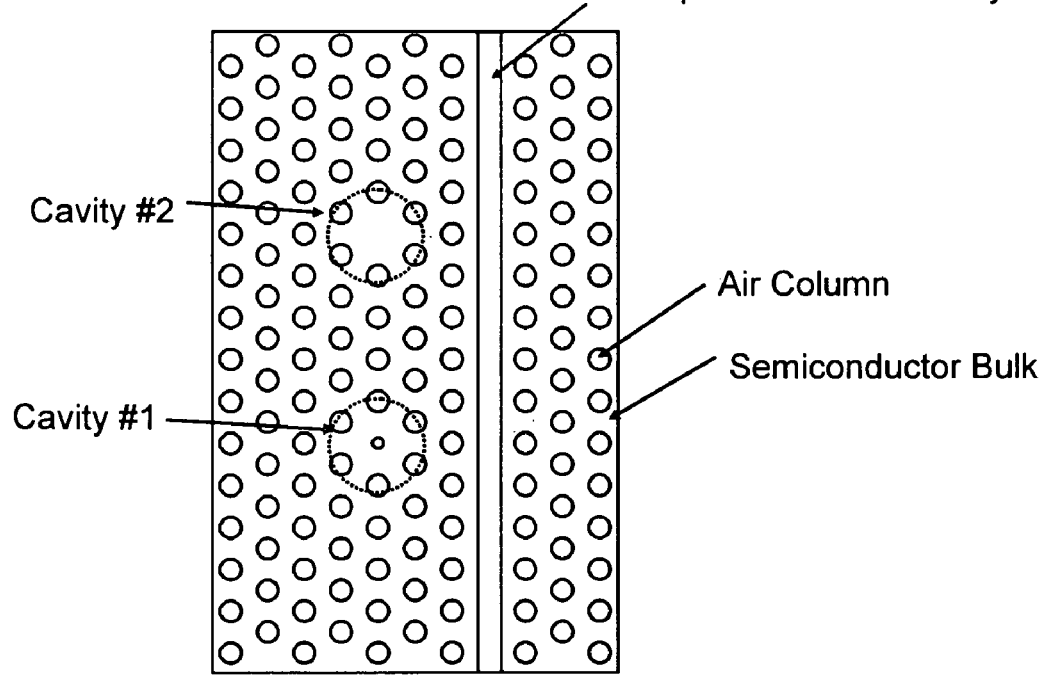
FIG. 23 illustrates an example of performing 2D-FDTD simulations for structures with an air gap bus line waveguide.
Figure 24:
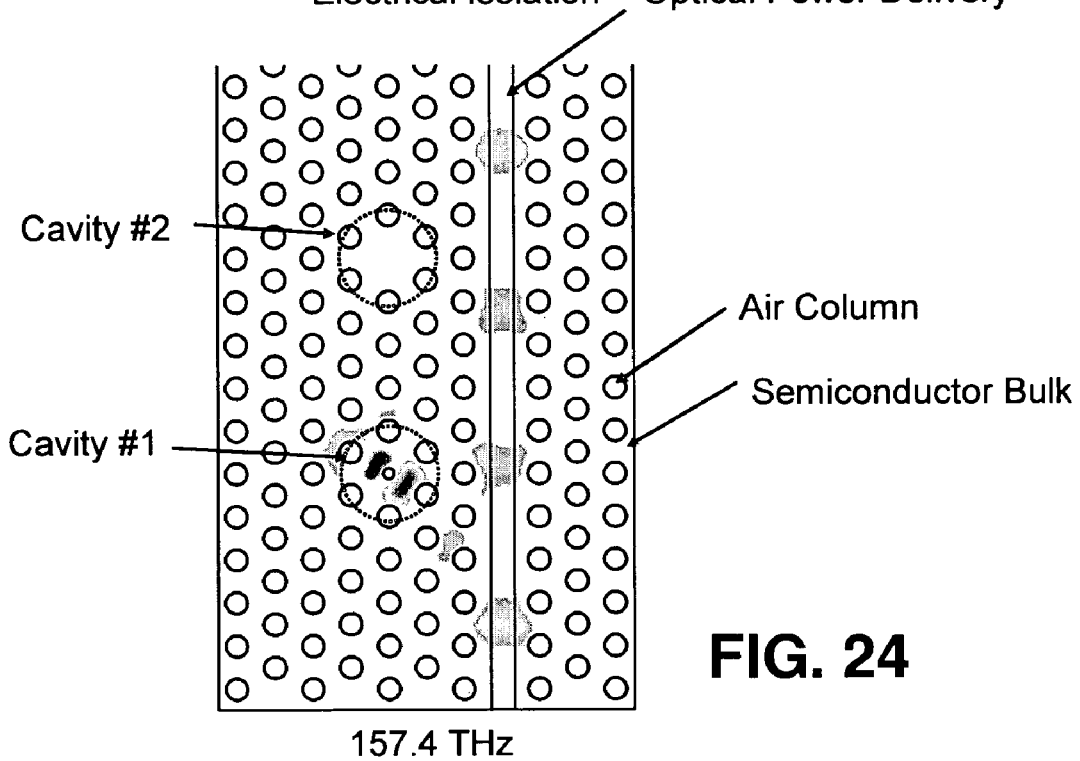
FIG. 24 illustrates an EM field snap shot corresponding to the simulation of FIG. 23, when the system is operated at 157.4 THz.
Figure 25:
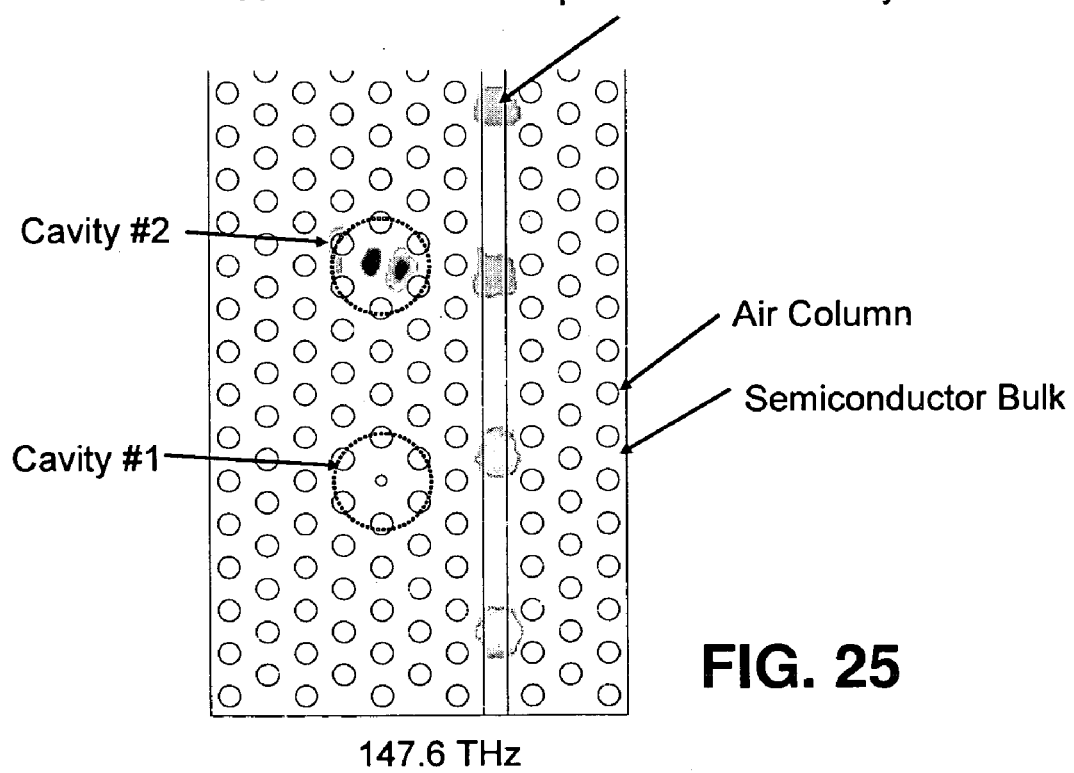
FIG. 25 illustrates another EM field snap shot corresponding to the simulation of FIG. 23, when the system is operated at 147.6 THz.

As an example, 2D-FDTD simulations were conducted for structures with an air gap bus line waveguide, as shown in FIG. 23. The corresponding EM field snap shots when the system was excited by two frequencies, 157.4 THz and 147.6 THz, are shown in FIG. 24 and FIG. 25, respectively. From these figures, it can be seen that the air gap waveguide can function well as a single mode bus line waveguide and can leave the peak EM field concentration in its air gap region.

The air gap bus line waveguide provides an additional function. In particular, the air gap provides a natural electrical isolation for the injected electrons and holes between the left and right sides of the bus line waveguides. This is seen to correspond to improved electrical injection efficiency with less carrier loss. Also, in the cases where both sides of the bus line waveguides are packed with light sources and individual light source addressability is preferred, then such an air gap can serve as a preferred electrical isolation between each light source element. This point will be addressed in greater detail as follows, with respect to an additional representative embodiment.

This representative embodiment involves an individually addressable design including air gap cut-off waveguides and a minimum distance between neighboring light sources. In combining active (such as laser) and passive (such as waveguide) devices, one consideration is how to electrically turn on/off an individual light source, with adequate optical and electrical isolations between neighboring light sources.

Figure 28:
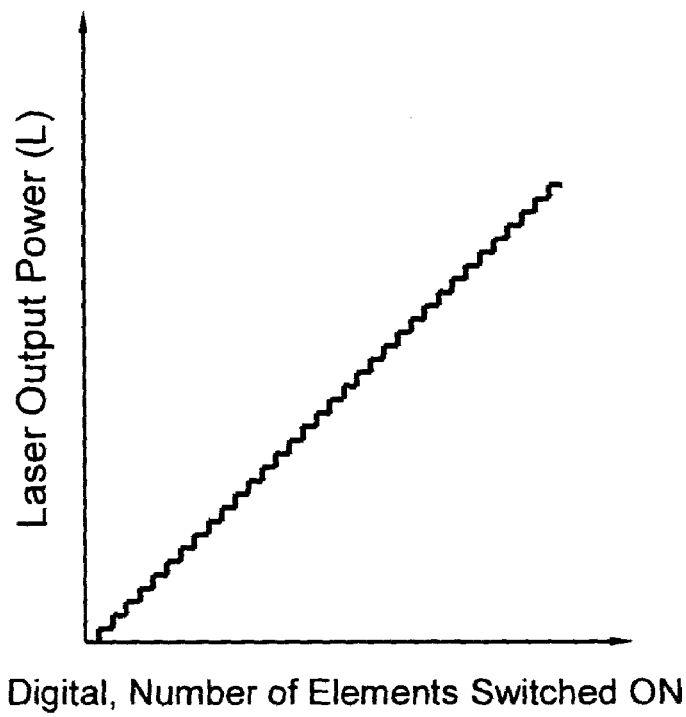
FIG. 28 illustrates a "stair" shape control of power levels that can be realized by controlling an ON/OFF of each element laser diode.

In this regard, the ability to address an individual light source is useful and preferred for at least three purposes. First, in case there is any failed individual light source(s), the total light source system can still function well by turning off the failed light source(s) and turning on a "back-up" light source to replace the optical power. Second, by turning on/off a different number of light source elements, a digitized optical power control can be realized, as illustrated in FIG. 28. In addition, and in view of fabrication tolerances, different light sources may need to be driven with slightly different conditions (bias voltage, current, duty cycle, and etc), to realize uniform power output from all light sources in one system. If one can realize individual addressability of each light source element composing the incoherent coupled array, an increase in the efficiency of the array can be facilitated.

Figure 1:
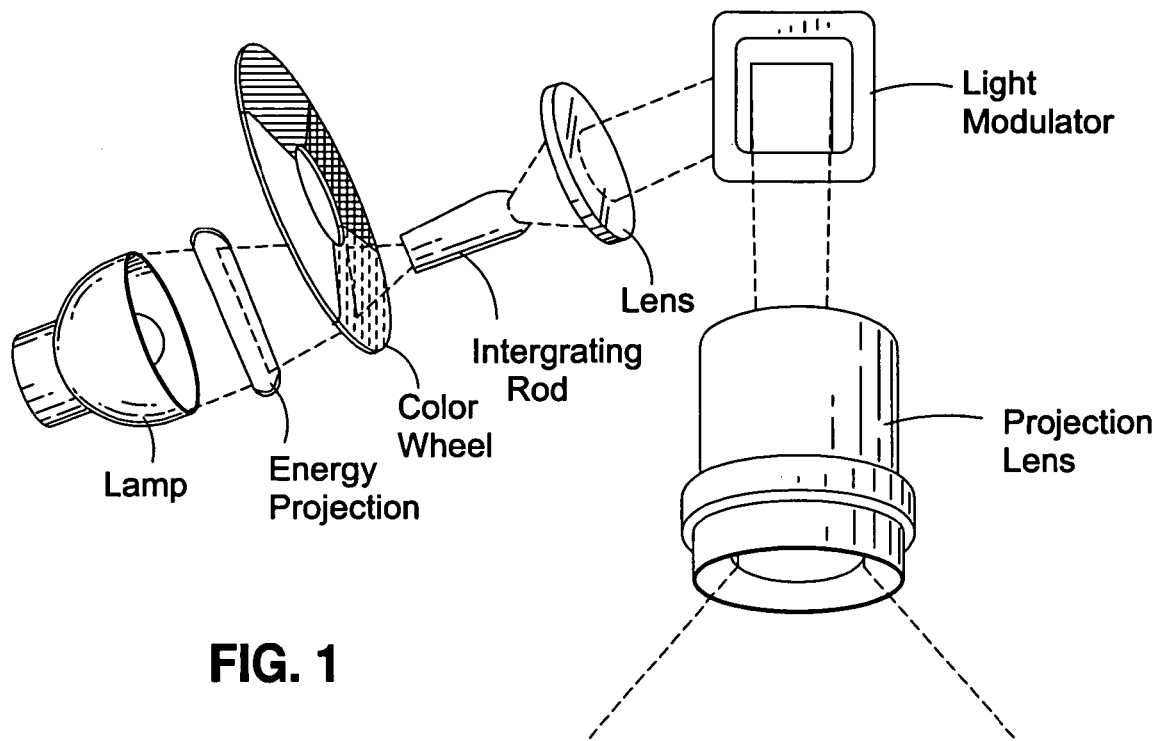
FIG. 1 depicts the structure and the light source of a typical DMD (Digital Micromirror Device) based color wheel color-projection system.
Figure 2:
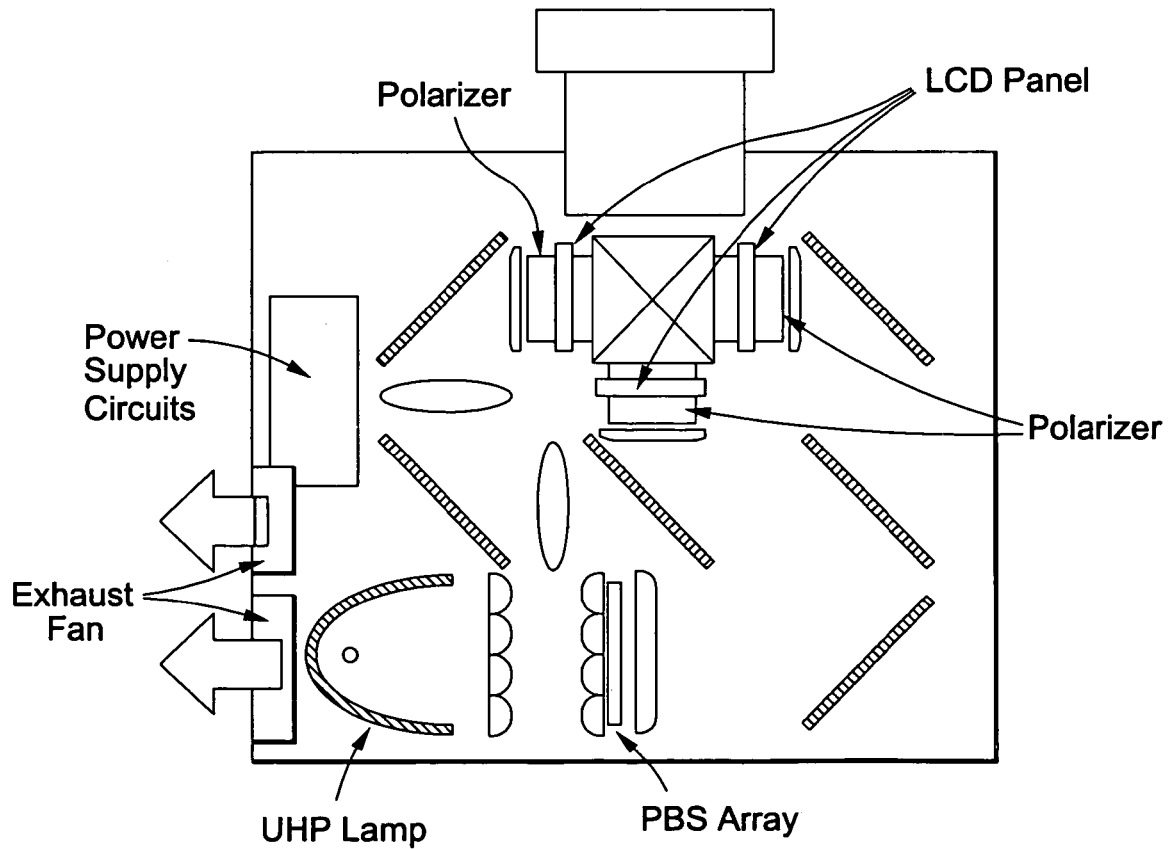
FIG. 2 depicts the structure and the light sources for a typical three-panel color projection system based on a three-LCD (Liquid Crystal Display) panels arrangement.
Figure 3:
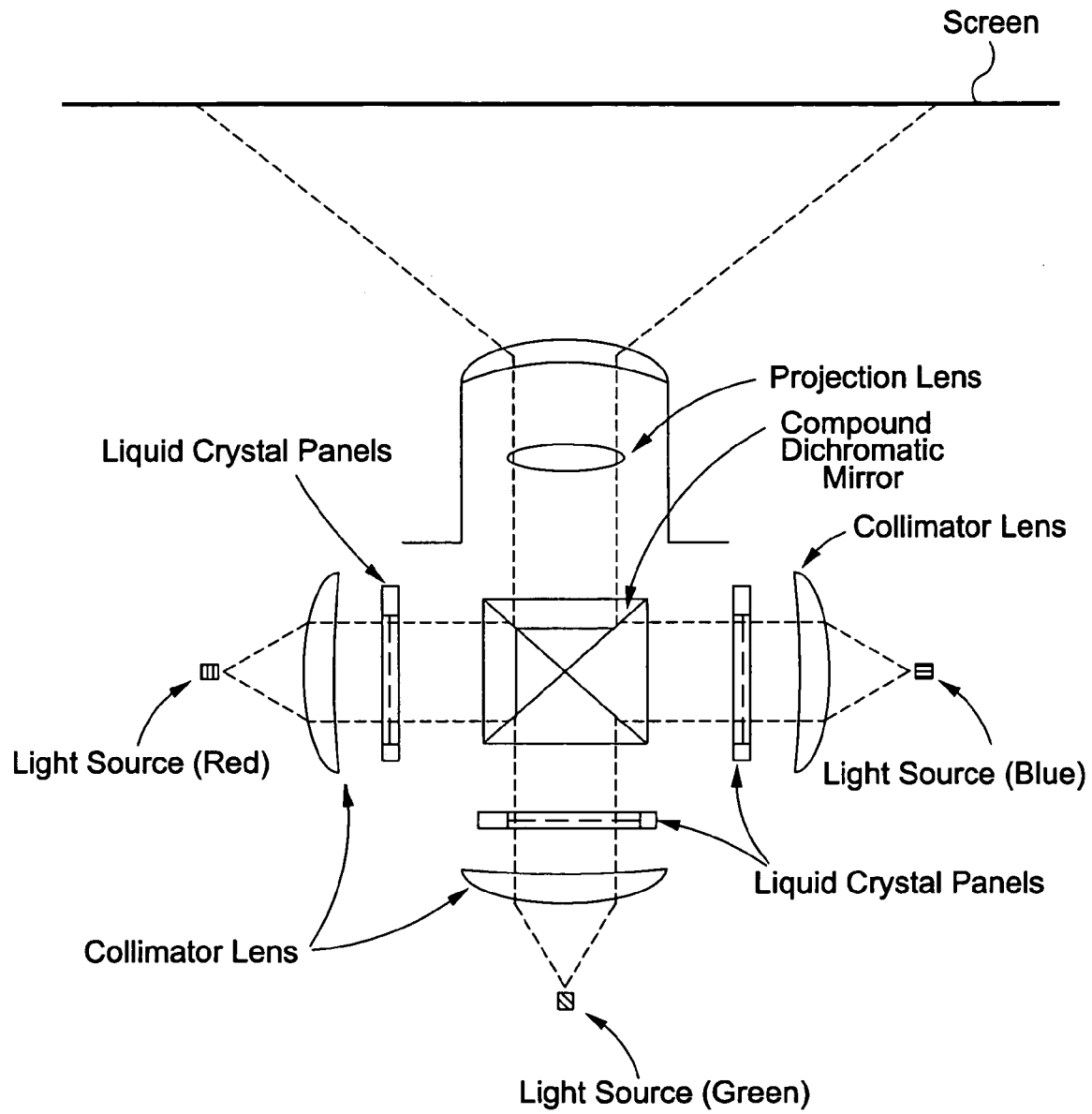
FIG. 3 depicts an alternative arrangement of a three-panel color projection system.
Figure 4:
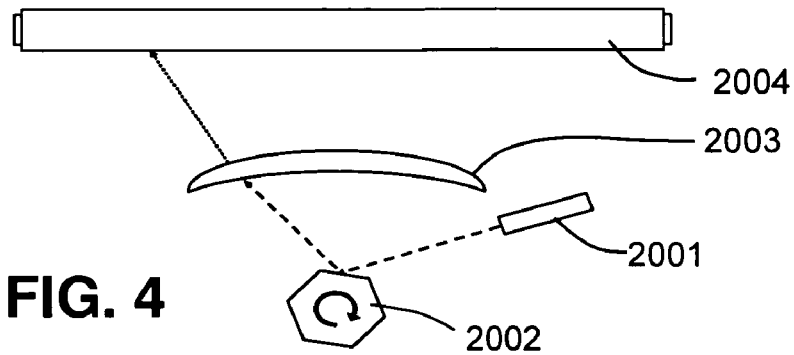
FIG. 4 depicts the structure of a typical polygon beam scanning LBP (laser beam printer).

For example, one can suppose that individual addressability of each light source element is to be used as a digitally controlled optical power source in polygon scanning LBPs. The beam scanning mechanism in such LBPs is illustrated in FIG. 4. From this figure, it can be seen that the patterns are exposed on the photoelectrical drum by modulating the light sources ON/OFF, when the spinning polygon is scanning the light spot along each line. Typical spinning speeds of the polygons are between 20,000 to 30,000 rpm, where an increase in rotation speed of the polygon mirror corresponds to increased speed for laser beam printing. In the meantime, the darkness of each pixel is determined by how much light energy is applied on each pixel area for exposure.

Figure 26:
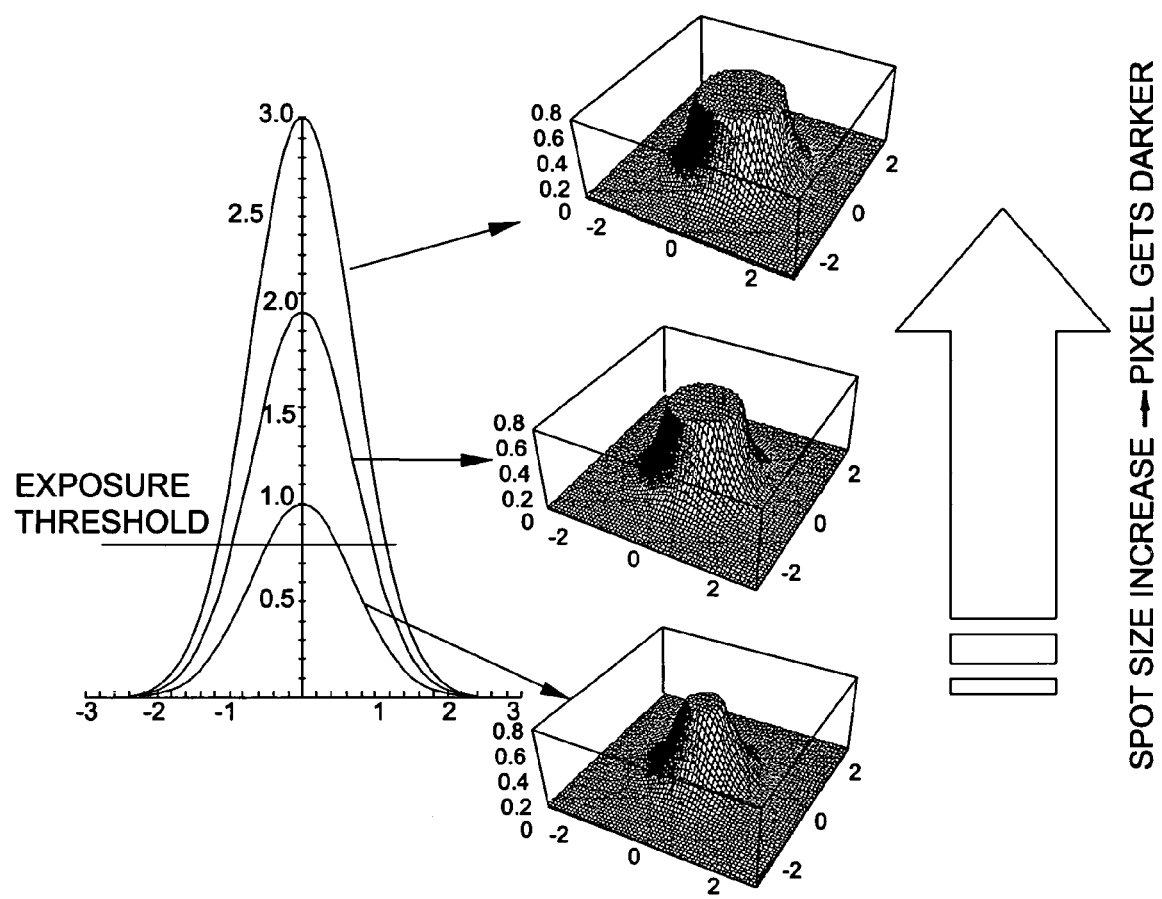
FIG. 26 is a diagram illustrating the relationship between increased laser diode power and an exposed area above the exposure threshold for an LBP.

One way to control such exposure of each pixel is to directly control and modulate the light output power as the beam is scanned. This concept is illustrated in FIG. 26, which demonstrates that as the light source power increases, the exposed area above the exposure threshold increases, leading to larger spots in the pixel, or a darker pixel. However, this is difficult to implement in practical systems.

Figure 27:
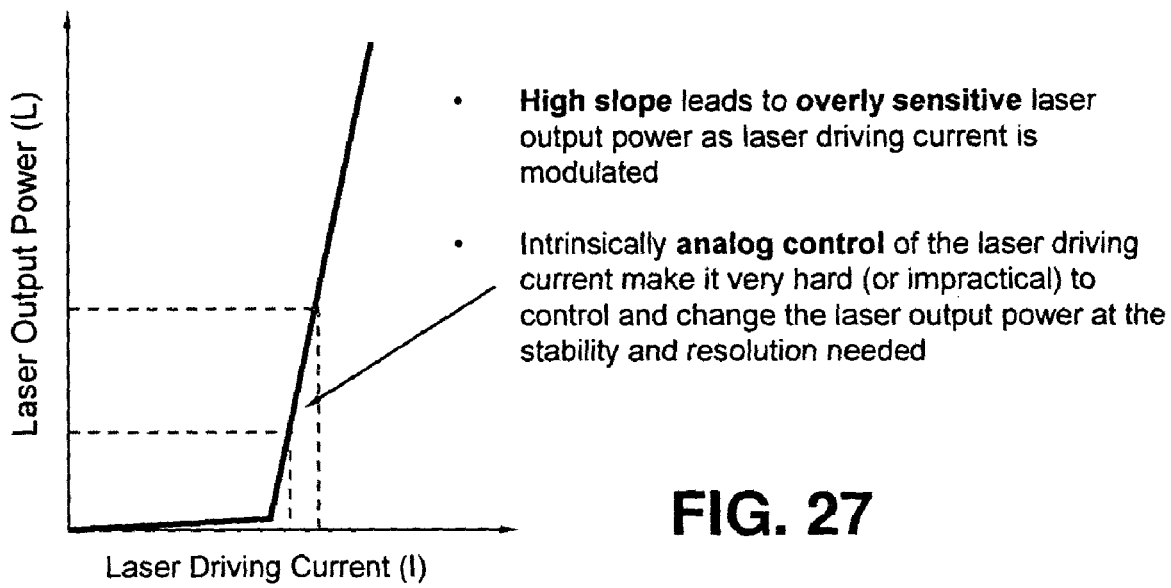
FIG. 27 is a diagram illustrating the high slope dependencies between injection current and optical output power in laser diodes.

In particular, the high slope dependencies between the injection current and optical output power in laser diodes are seen above their lasing thresholds, as illustrated in FIG. 27. In addition, given that such a laser power controlling system is intrinsically an analog system, a small fluctuation in the injection current can lead to large fluctuation in the laser output power. As such, it is technically expensive to have a precision laser injection controlling system to control stable light output in multiple output power levels.

Therefore, the exposure dose control in current LBP systems is based on high speed time domain ON/OFF modulation of the laser diode during the scanning. Namely, within the time span of the scanning spot passing through the width of one pixel, the laser diode can be turned ON/OFF multiple times and expose multiple spots within the width of one pixel. This scheme encounters a couple of intrinsic limitations.

First, the laser diode ON/OFF modulation speed has to be significantly (one or two orders of magnitudes) faster than the time it takes for the focused laser spots to pass through the width of one pixel. This poses a significant limitation on the speed of the LBPs. In addition, the darkness (e.g. grey scale) control scheme generates intrinsically elongated pixels, instead of preferred square pixels. To address this problem, one either has to scan multiple lines for one pixel and slow down the printing speed, or to image a linear array of laser bars in parallel to the drum to realize simultaneous scan of multiple lines for one pixel.

In this embodiment of the present invention, a digitally controlled light system is proposed to realize facilitated light power control at high speed and a more ideal pixel darkness control. The structure for this embodiment is based on the same coupled incoherent light source array, but with the additional capability of addressing individual light source element independently. By controlling the ON/OFF of each element light source digitally, a "stair" shape control of power levels can be realized, as illustrated in FIG. 28. By adjusting how many elements are switched ON at each pixel location, the darkness can be more directly controlled. Instead of modulating the light sources more than 10 or 100 times faster than the scanning speed, this embodiment proposes synchronized digital laser diode control with the laser spot scanning. As such, higher speed LBPs can be realized, with pixels that are intrinsically square. In effect, each pixel can be associated with an incoherently coupled array of light sources, and the grayscale can be adjusted by changing the number of illuminating light sources associated with that pixel.

There is another advantage that can be obtained when individual addressability is made available, relating to the robustness of such devices and their production yield. When the number of light sources increases in such coupled incoherently light source arrays, the possibility of a failed light source increases. This can contribute to the negative aspect of the fabrication yield and/or device robustness, once one or more light source elements fail either during fabrication or operation. An efficient solution for this potential problem is to fabricate redundant light source elements into the array. With the individual addressability to each light source elements, one can cut off the electrical injection into failed light source elements and simply turn on the back-up light source elements to maintain targeted total optical output powers.

In data projectors, the individually addressable array design can also be seen to improve contrast, which is an important figure of merit. The contrast ratio is often limited by its achievable darkness, especially when LCD panels are used. One way to effectively enhance the contrast ratio is by implementing intensity adjustable light sources. For example, the Sanyo LP-Z4 projector uses a mechanically adjustable iris to adjust the net light source output power dynamically to achieve contrast of 7000:1. Photos and characteristics of Sanyo LP-Z4 can be seen in http://www.akihabaranews.com/en/news__10200.html. Using the individually addressable array design presented in this representative embodiment, however, one can achieve high speed dynamic light source power modulations with precision power level control and without any mechanical moving parts.

Figure 29:
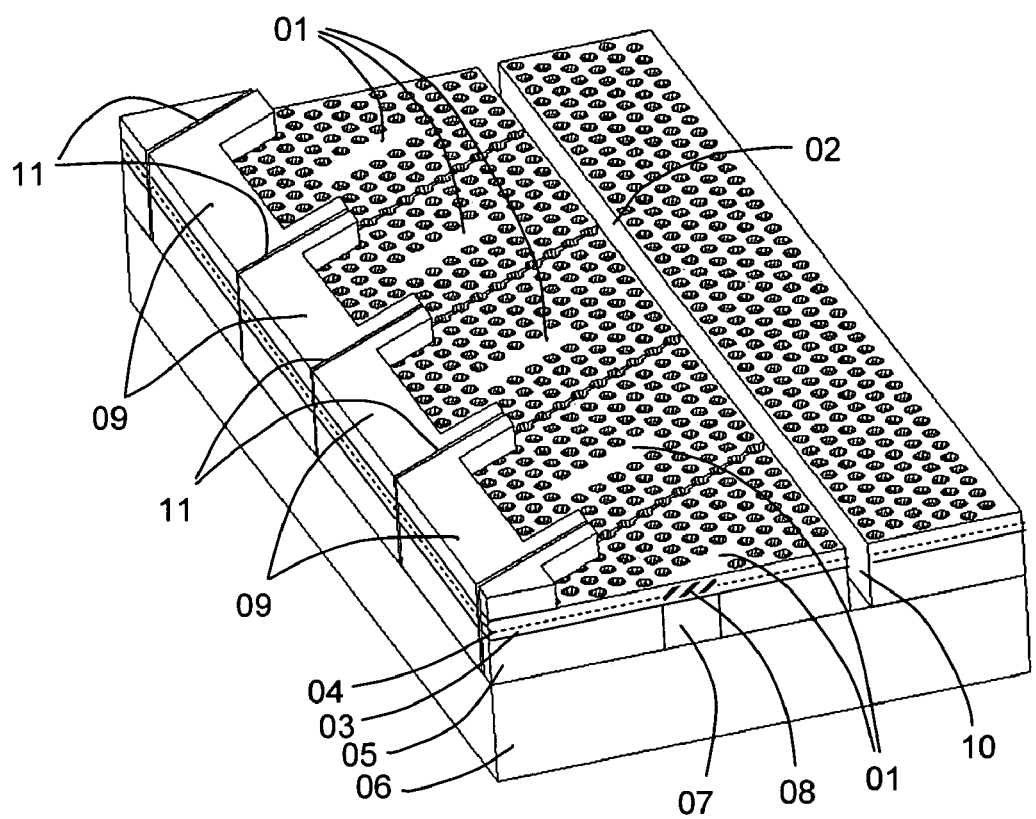
FIG. 29 illustrates the embedding of photonic crystal lasers which are electrically isolated from each other, in accordance with a representative embodiment of the invention.
Figure 30:
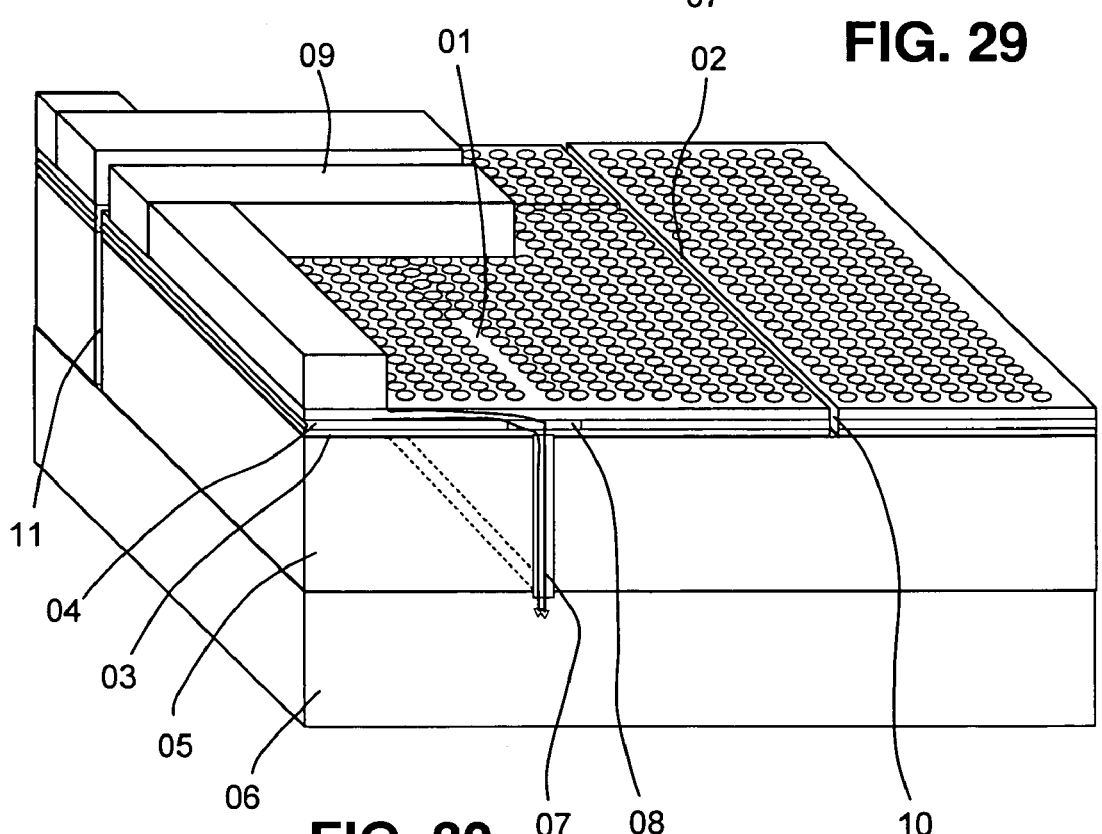
FIG. 30 illustrates a similar arrangement to FIG. 29, with lasers arranged in a parallel fashion.
Figure 31:
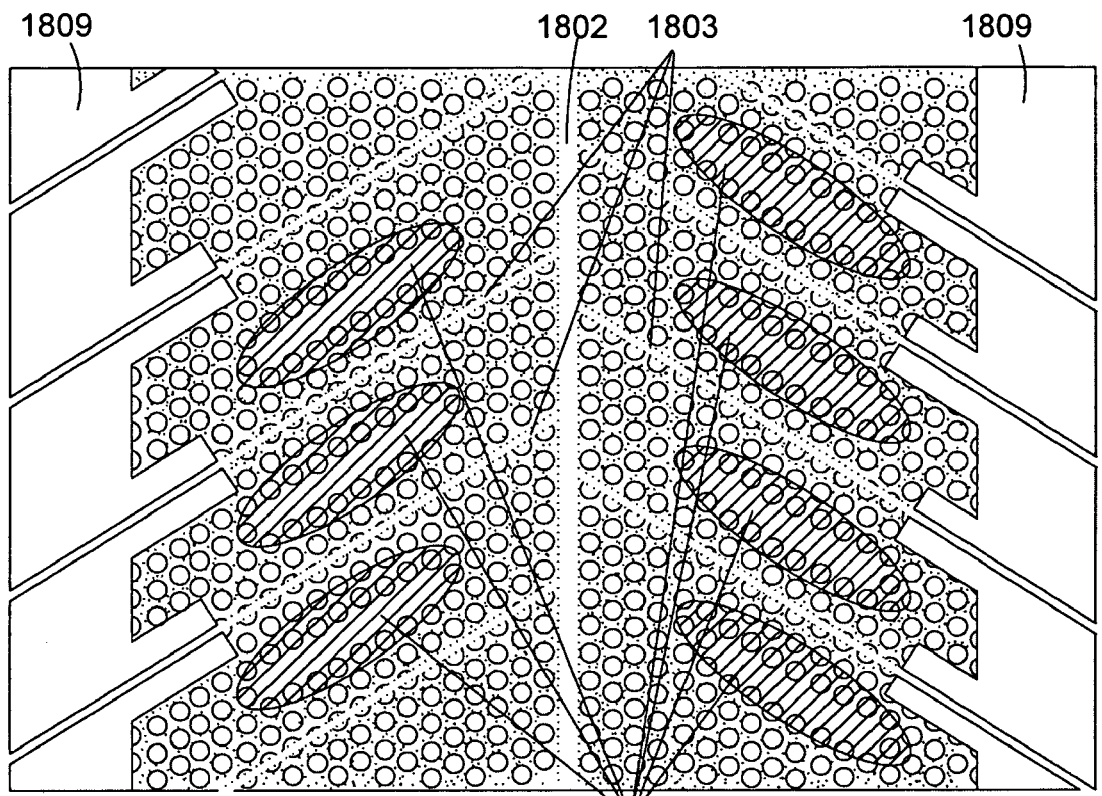
FIG. 31 is a top-view of FIG. 29, and illustrates an even denser packed array.

To realize individual addressability, the electrical contacts for each light source should be electrically isolated from each other. In addition, the electrical contacts should keep each electrode as close as possible to the vicinity of each light source cavity to maintain high electrical injection efficiency. One representative embodiment of the invention is illustrated in FIGS. 29 and 30. FIG. 31 is a top-view of FIG. 29 showing an even denser packed array.

With reference to FIGS. 29 and 30, the air gap bus line waveguide 10 introduced in FIG. 22 is included to serve its dual purpose of providing electrical isolation between the light sources on the left side and right side of the bus line waveguide and guiding output optical powers. Moreover, additional air gaps 11 (or "air gap cut-off waveguides") are formed between neighboring light elements. For instance, an air gap can be formed between LD-A1 and LD-A2 light sources, as seen in FIG. 31. These air gaps 11 are seen to provide virtually full electrical isolation for each light source. However, their optical properties are designed to be different from the air gap bus line waveguide 10, with different dimensions and geometric alignment compared with the bus line waveguide 10.

There is an advantage to introducing a different design for air gaps served in cut-off waveguides, compared to the design for the air gap associated with the bus line. In particular, if one used the same air gap design for both the bus line waveguide 10, and the air gaps between the neighbors 11 (e.g. between LD-A1 and LD-A2 in FIG. 31), then the effective optical isolation distance between the two light source cavities would approximately be reduced by half. Since the optical attenuation increases exponentially as distance increases in photonic crystals, such reduction in separation distance can influence EM field distributions. Optical power from light source cavities could first couple into the air gap formed waveguides, and then couple into a neighboring light source cavity. This not only increases the possibility of cross-talk, also reduces the total quality factor of each light source cavity. Furthermore, the output optical power from each light source is not only collected by the bus line waveguide, but also by the air gaps forming new waveguides between neighboring light source cavities.

Such significant optical power guided in these air gaps can have two negative impacts to the system. First, the simple junction between the separation air gaps formed waveguides and the bus line waveguide can have significant optical loss when the optical power flowing on two branches are combined. Although there are low loss photonic crystal waveguide combiner designs, most of such designs are quite sophisticated and need additional spaces around. This can dramatically increase the size and complexity of the device fabrication, especially if hundreds of such low loss junctions have to be implemented simultaneously. In addition, any remnant reflection at these junctions can lead to optical feedback into the light source cavity itself and destabilize the light source operations. Each light source cavity is vulnerable to the reflected signal it itself, because such reflected signal has the same wavelength as the light source cavity resonance, which generated the signal in the first place.

Figure 32:
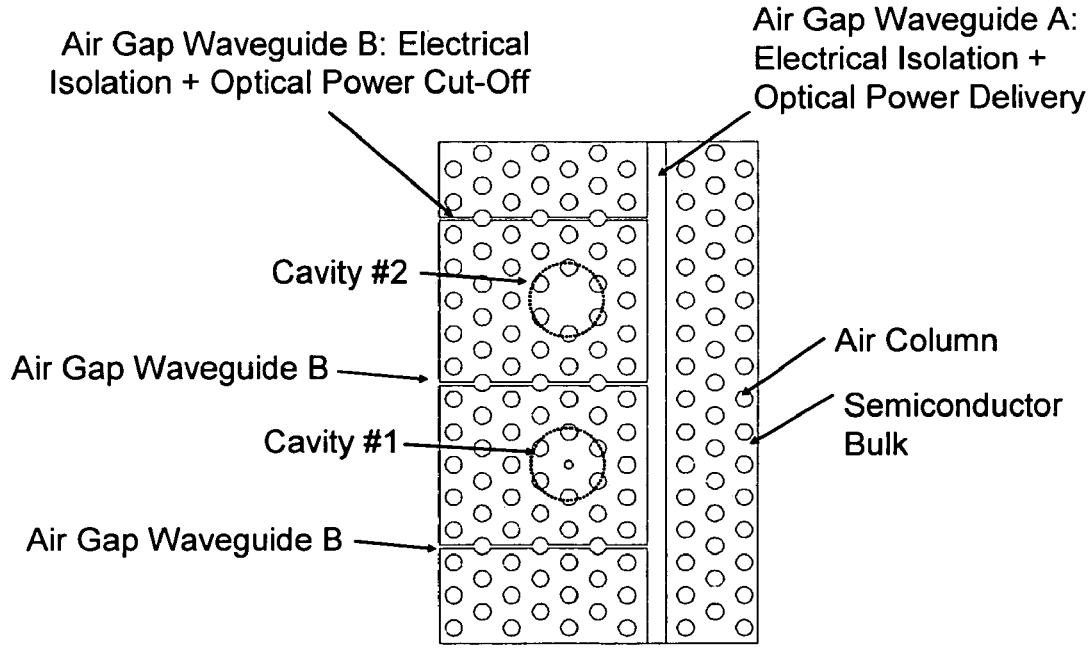
FIG. 32 is a diagram illustrating the isolation of lasers using air gaps cut-off waveguides.
Figure 33:
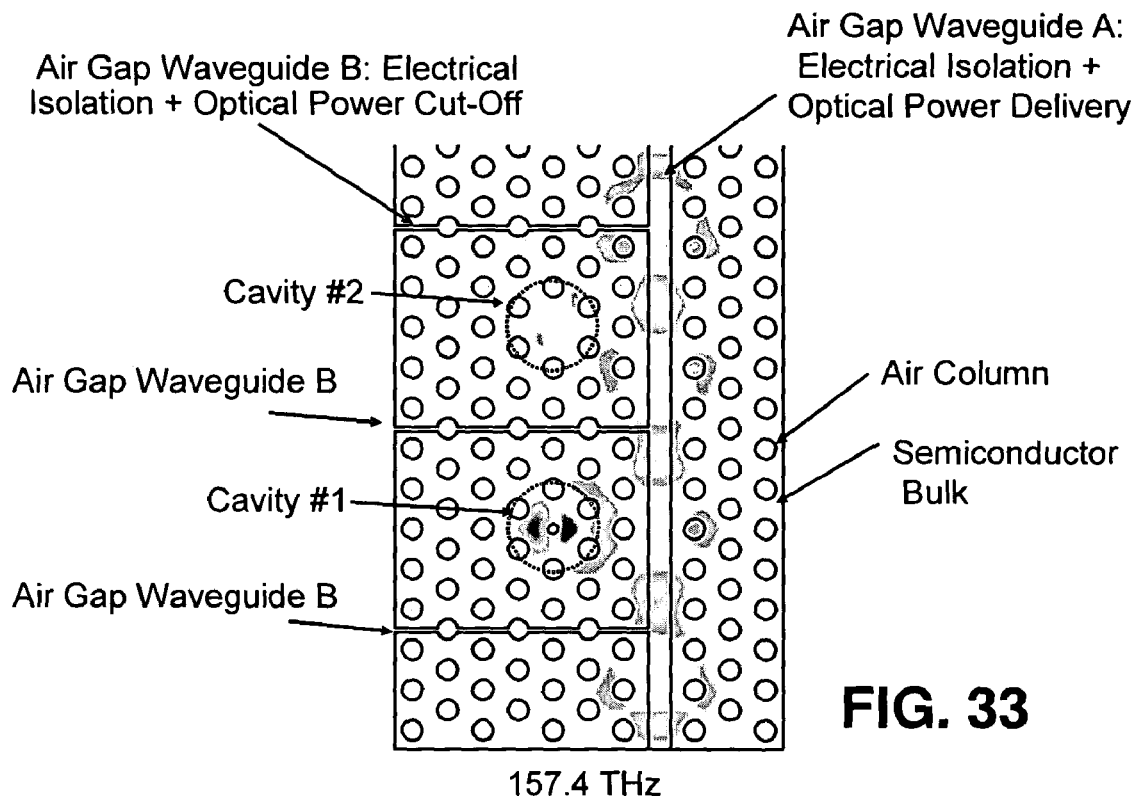
FIG. 33 illustrates that an optical response is not present with the use of air gap cut-off waveguides.
Figure 34:
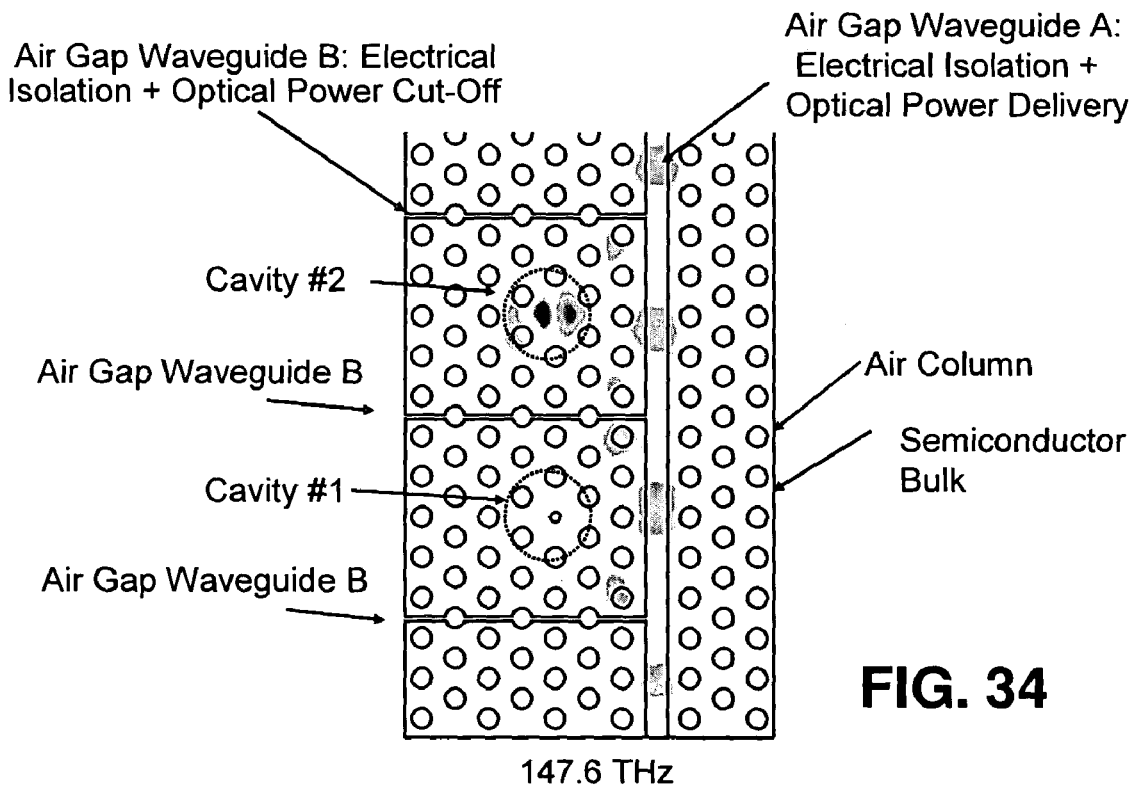
FIG. 34 further illustrates that an optical response is not present with the use of air gap cut-off waveguides.

To address the foregoing dilemmas, different air gaps between the neighboring light source cavities can be used. Such air gaps may have different width, nonequivalent registration, and nonequivalent orientation compared with the air gap bus line waveguide, such as the air gaps cut-off waveguides shown in FIG. 32. These air gap cut-off waveguides are designed to have no guided mode in the wavelengths of its neighboring light sources. In this way, the air gap cut-off waveguides are seen to present no effective optical response to the light optical power generated by its neighboring light sources. Furthermore, the air gaps still serve as electrical isolators. FIG. 33 and FIG. 34 illustrate the virtually non-existing optical response in the air gap cut-off waveguides, even when placed right next to the optical power guiding bus line waveguide and power resonating photonic crystal cavities.

In some embodiments, the electrode to electrode voltage bias is such that a threshold value is exceeded, which results in arcing across the separation air gap. For example, a threshold voltage can be a voltage above 30.00 Volt/inch for dry air or roughly 1,200,000 Volt/meter results or roughly 1.2 Volt per micrometer or 0.0012 Volt per nano meter (1 E-9 m). Thus, if the operation conditions are such that the electrode to electrode voltage bias exceeds a design value, then a high breakdown voltage material inserted into the separation air gap can be used to isolate the electrodes and minimize arcing concerns. For example, if the electrode spacing is 100 nm, with an electrode to electrode bias greater than 0.12 Volts, the arcing can be minimized by inserting into the air separation region a material with a high-break-down voltage material.

In such a situation, the waveguide concerns as discussed for the air separation gap still apply, but they apply for a region with insulating material, such as typical low refractive index electrically insulating oxide material (e.g. silicon oxide, aluminum oxide, and etc) inserted into the separation air gap. In another embodiment, the whole device chip may be packaged in a vacuum sealed capsule, in which the arcing voltage is much higher than that in atmosphere pressure.

It should be noted that the in-plane electrical isolation gaps can be provided by techniques other than etching gaps. For example, selected areas or lines can be ion bombarded to neutralize conductivity, while the optical refractive index is preserved for the photonic crystal lattice. This reduces further electrical and optical considerations associated with the physical formation gaps in the photonic crystal, because the preserved photonic crystal property can prohibit light propagation in the ion bombarded areas.

Figure 35:
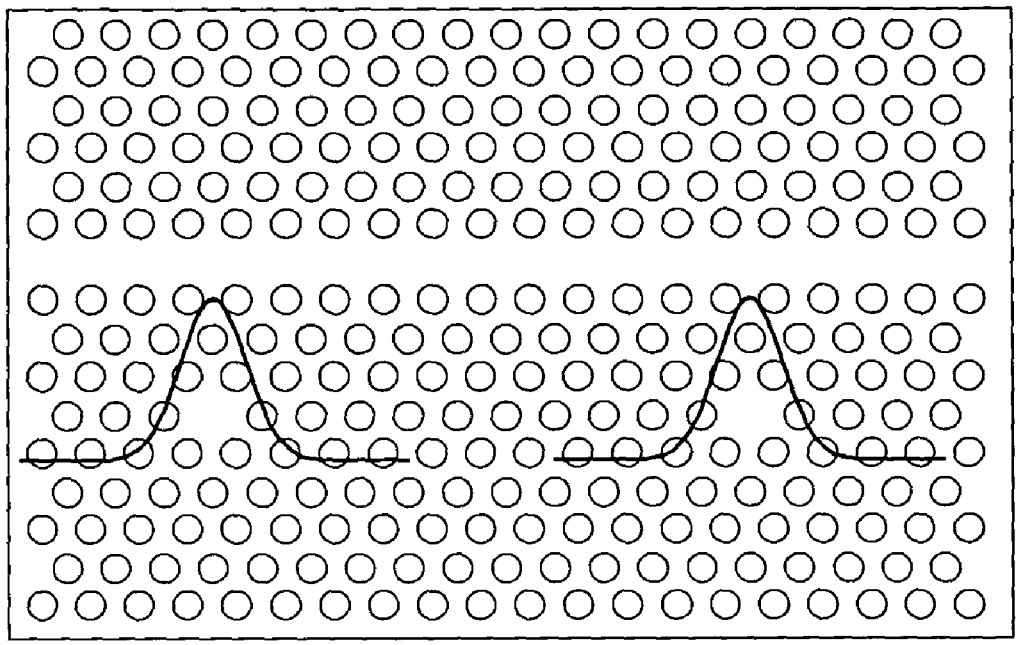
FIG. 35 illustrates the coupling between neighboring laser cavities having a large space therebetween.
Figure 36:
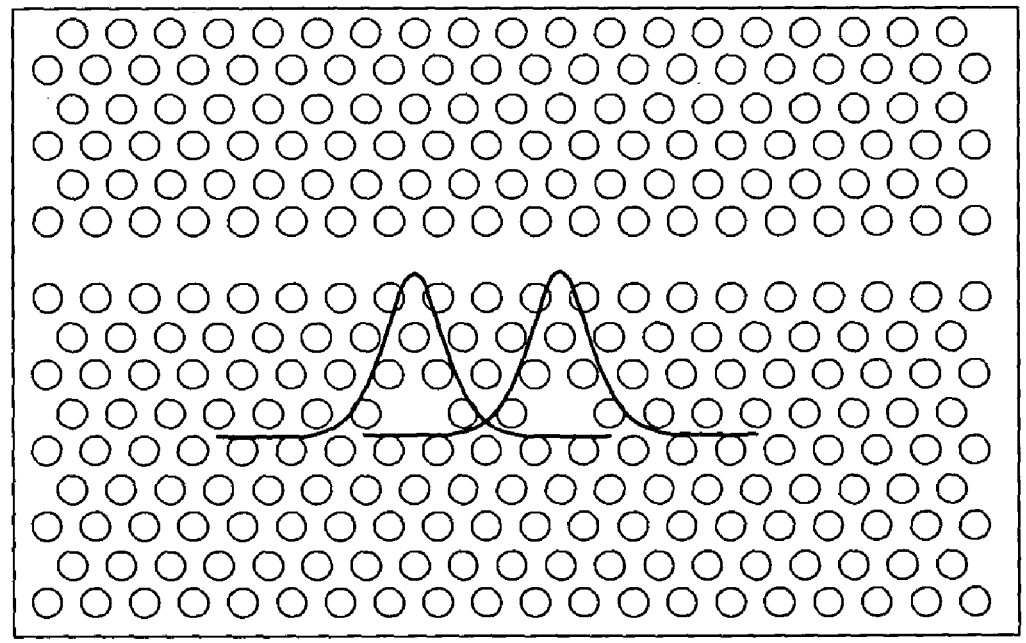
FIG. 36 illustrates the coupling between neighboring laser cavities having a small space therebetween.

Another concern of the designs of these closely packed incoherent arrays is how close to pack the light source cavities together. There exists a minimum separation distance for a specific cavity and waveguide geometry. Below that limitation, neighboring light source cavities can optically couple to each other directly, with each of their own resonant frequencies altered to combine to different supermodes. FIGS. 35 and 36 illustrate this situation conceptually.

In FIG. 35, when the spacing between two neighboring light source cavities is large enough, the coupling between them is significantly smaller than their individual coupling into the bus line waveguide, and the cavities can be treated as optically independent. On the other hand, FIG. 36 illustrates when the distance between the two cavities is so small that the strong overlapping and coupling between their resonant modes are no longer negligible.

There exist certain criteria for deciding what distance between the two cavities is the minimum, without risking optical coupling between neighboring light source cavities that should be incoherent to each other. To find such criteria, large scale numerical simulations, such as 3D-FDTD modeling, can be performed on the hundreds of light source cavities simultaneously. However, such an approach usually results in calculation loads which are impractically large. Therefore, a more practical evaluation method should be formulated.

A scientific and practical approach to address this problem is to start from two ideally isolated photonic crystal cavities, assuming they are initially infinitely far apart. In such a case, the cavity resonant mode(s) formed correspond to an eigenfunction solution of the equation. The deduction of the secular equation can be found in references such as John D. Joannopoulos, et al, "Photonic Crystals: Molding the Flow of Light," Princeton University Press (1995), pp.11.

$$\nabla \times \left( \frac{1}{\varepsilon(\vec{r})} \nabla \times \vec{H}(\vec{r}) \right) = \left( \frac{\omega}{c} \right)^2 \vec{H}(\vec{r}) \Rightarrow \hat{\Theta} \vec{H}(\vec{r}) = \left( \frac{\omega}{c} \right)^2 \vec{H}(\vec{r})$$

where $$\hat{\Theta} = \nabla \times \left( \frac{1}{\varepsilon(\vec{r})} \nabla \times \right).$$

Such a secular equation can be deduced from the traditional differential form of the Maxwell's equation. At this initial ideal situation, two cavities (Cavity$_1$ and Cavity$_2$) support two independently localized modes $\vec{H}_1(\vec{r} - \vec{r}_1)$ and $\vec{H}_2(\vec{r} - \vec{r}_2)$ respectively. Namely, $\vec{H}_1(\vec{r} - \vec{r}_1)$ is the stationary magnetic field distribution of the localized resonant mode in and around Cavity$_1$ centered at $\vec{r}_1$. There is no physical overlap (i.e. coupling between $\vec{H}_1(\vec{r} - \vec{r}_1)$ and $\vec{H}_2(\vec{r} - \vec{r}_2)$). Additionally, $\vec{H}_1(\vec{r} - \vec{r}_1)$ and $\vec{H}_2(\vec{r} - \vec{r}_2)$ correspond to different frequencies (i.e. inverse of wavelengths) $\omega_1$ and $\omega_2$ respectively.

Moving the two infinitely distanced Cavity$_1$ and Cavity$_2$ closer to each other, one can see that $$\hat{\Theta} = \nabla \times \left( \frac{1}{\varepsilon(\vec{r})} \nabla \times \right)$$

can be changed to $$\hat{\Theta}' = \nabla \times \left( \frac{1}{\varepsilon'(\vec{r})} \nabla \times \right),$$

where $\varepsilon(\vec{r})$ and $\varepsilon'(\vec{r})$ are spatial distributions of dielectric function before and after the two cavities are moved closer together. The $\vec{H}_1(\vec{r} - \vec{r}_1)$ is seen to be perturbed by the approaching $\vec{H}_2(\vec{r} - \vec{r}_2)$. With the first order perturbation formalism, the perturbed $\vec{H}_1(\vec{r} - \vec{r}_1)$, i.e. $\vec{H}'_1(\vec{r} - \vec{r}_1)$, can be written as $$\vec{H}'_1(\vec{r} - \vec{r}_1) =$$

-continued $$N \cdot \left[ \vec{H}_1(\vec{r} - \vec{r}_1) + \frac{<\vec{H}_2(\vec{r} - \vec{r}_2)|\hat{\Theta}'|\vec{H}_1(\vec{r} - \vec{r}_1)>}{\frac{\omega_1^2}{c^2} - \frac{\omega_2^2}{c^2}} \cdot \vec{H}_2(\vec{r} - \vec{r}_2) \right],$$

where N is a normalization factor without much physical significance. The critical parameter is $$p_1 = \left| \frac{<\vec{H}_2(\vec{r} - \vec{r}_2)|\hat{\Theta}'|\vec{H}_1(\vec{r} - \vec{r}_1)>}{\frac{\omega_1^2}{c^2} - \frac{\omega_2^2}{c^2}} \right|^2,$$

where $p_1$ stands for the percentage of the perturbed state $\vec{H}'_1(\vec{r} - \vec{r}_1)$ distributed in the Cavity$_2$, i.e. a numerical evaluation of the optical cross-talk strength. The inverse of the $p_1$, i.e. $1/p_1$, should be a large number when $\vec{r}_1$ and $\vec{r}_2$ are far apart where no significant cross-talk between the two cavities exist. When $\vec{r}_1$ and $\vec{r}_2$ approach each other, the $1/p_1$ value becomes smaller. The cross-talk between the two cavities is seen to be too strong to be tolerable when $1/p_1$ is in the same order of magnitude as the quality factor (Q) of the individual cavity.

With this first order perturbation formalism, the minimum distance between two neighboring cavities without significant optical cross-talk can be evaluated easier and without the need for numerical simulation of the whole light source array, which is normally too large to be practical with any numerical simulation tool. Using this approach, only simulations for individual cavities (i.e. Cavity$_1$ and Cavity$_2$) are needed.

Namely, $\{\vec{H}_1(\vec{r}), \omega_1, Q_1\}$ and $\{\vec{H}_2(\vec{r}), \omega_2, Q_2\}$ can be solved independently. Then the spatial integration of:

$$<\vec{H}_2(\vec{r} - \vec{r}_2)|\hat{\Theta}'|\vec{H}_1(\vec{r} - \vec{r}_1)> =$$

$$\int \int \int \vec{H}_2^*(\vec{r} - \vec{r}_2) \cdot \nabla \times \left( \frac{1}{\varepsilon'(\vec{r})} \nabla \times \vec{H}_1(\vec{r} - \vec{r}_1) \right) \cdot d^3r$$

can be performed, when the distance between Cavity$_1$ and Cavity$_2$ is reduced, i.e. ($\vec{r}_1 - \vec{r}_2$). Since this is a one step numerical integration operation, it typically consumes significantly less computation time compared with running a full numerical simulation of the combined structure. Additionally, various values of ($\vec{r}_1 - \vec{r}_2$) can be tested continuously. The value $1/p_1$ can be monitored as a function of ($\vec{r}_1 - \vec{r}_2$), and $1/p_1$ can be compared with $Q_1$. An empirical criterion can be set as $1/p_1 \geq 10 \cdot Q_1$, to judge whether ($\vec{r}_1 - \vec{r}_2$) is too close for optical isolation or not.

Turning to FIG. 37, one point learned from the representation of $p_1$ (i.e. percentage of the perturbed state) is that the cross-talk magnitude is inversely proportional to the difference of the squares of the resonant frequencies (i.e. the inverses of resonant wavelengths) between the neighboring cavities. This observation prompts a better strategy for arranging the light source cavities in the array along the common bus line waveguide.

FIG. 37 illustrates an arrangement strategy to reduce the cross-talk between neighboring cavities, by increasing the resonant frequency (i.e. inverse of wavelength) difference between the nearest neighboring elements. Assuming the original arrangement is the sequential arrangement (as shown on the left side of FIG. 37), the difference between the neighboring elements is $\Delta\lambda$. By swapping the elements to the arrangement shown on the right side of the difference between the neighboring elements is increased to $3 \cdot \Delta\lambda$ and $4 \cdot \Delta\lambda$. According to the definition of the $p_1$ factor, this simple swap can decrease the cross-talk between the neighboring elements by almost one order of magnitude, and can be used to further decrease the spacing between cavities.

The above embodiments describe light-emitting photonic devices for monolithically integrating active and passive components within the same photonic crystal structure. In addition, such light-emitting photonic devices allow for the electrical injection of the active components, and for the individual addressability of light sources.

Next, additional embodiments that incorporate the general structure of the above-described embodiments will be described. Some of these additional embodiments are depicted in FIGS. 38 to 42. These additional embodiments correspond to improvements or alternative arrangements for the above-described embodiments. It should be noted that features of these various embodiments may be combined with those of other embodiments to achieve other beneficial structures.

With reference to FIG. 38, a diagram of a multimode waveguide according to an embodiment of the invention is shown. As suggested above, changing from a single mode waveguide to a multimode waveguide complicates the coupling between the element light sources and the waveguide. However, it may be possible to realize more optical power using a multimode waveguide, since the affected cross-section area of the waveguide mode is made larger. Hence, although a single mode waveguide is generally preferred, it is still possible to benefit from the use of multimode waveguide. However, extra considerations regarding the coupling between the light sources and the waveguide should be made.

The multimode waveguide of FIG. 38 remains a passive component formed in the photonic crystal structure. The multimode waveguide can be formed by simply removing more columns of air holes, tapering the air hole radius, tapering the lattice constant (i.e. periodicity of the photonic crystal), or using techniques which affect the periodicity of the photonic crystal structure. Label 502 illustrates the difference between a single mode waveguide (right) and a multimode waveguide (left).

Figure 39:
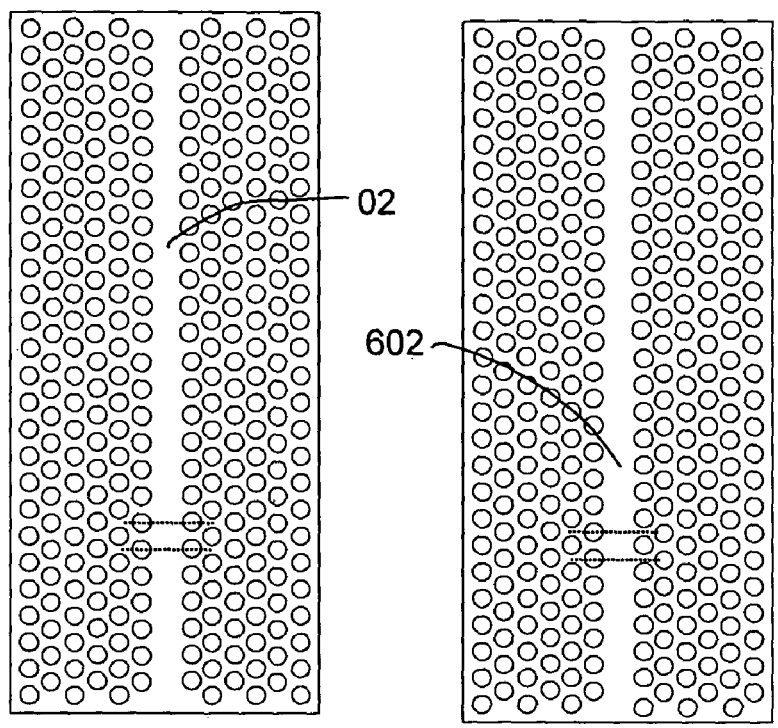
FIG. 39 is a top-view of a low loss offset waveguide in accordance with another embodiment of the invention.

With reference to FIG. 39, a diagram of a low-loss offset waveguide (Wan Kuang, John D. O'Brien, "Reducing the out-of-plane radiation loss of photonic crystal waveguides on high-index substrates", Optics Letters 29(8), 860-862 Apr. 15, 2004) according to another embodiment of the invention is shown. The low offset waveguide remains a passive component in the photonic crystal structure. The single mode waveguide can be modified by offsetting the relative lattice positions of the two sides of the waveguide, as shown in waveguide 602 compared with waveguide 02 of FIG. 39. Changing the symmetry properties of the waveguide mode can reduce practical waveguide loss. In particular, the reduction of waveguide loss is realized with a given maximum thickness of insulating layer 5 ($AlO_x$).

Figure 40:
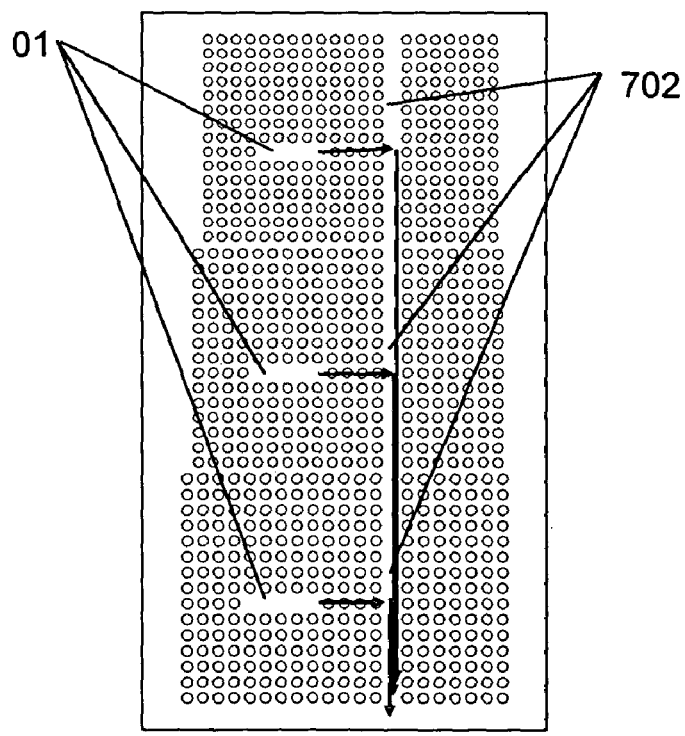
FIG. 40 is a top-view of a tapered cut-off waveguide according to yet another embodiment of the invention.

Referring now to FIG. 40, a diagram of a tapered cut-off waveguide according to yet another embodiment of the invention is shown. The original simple waveguide 02 is replaced by waveguide sections 702 with tapered lattice constants. The waveguide sections 702 remain passive within the photonic crystal structure.

Figure 41:
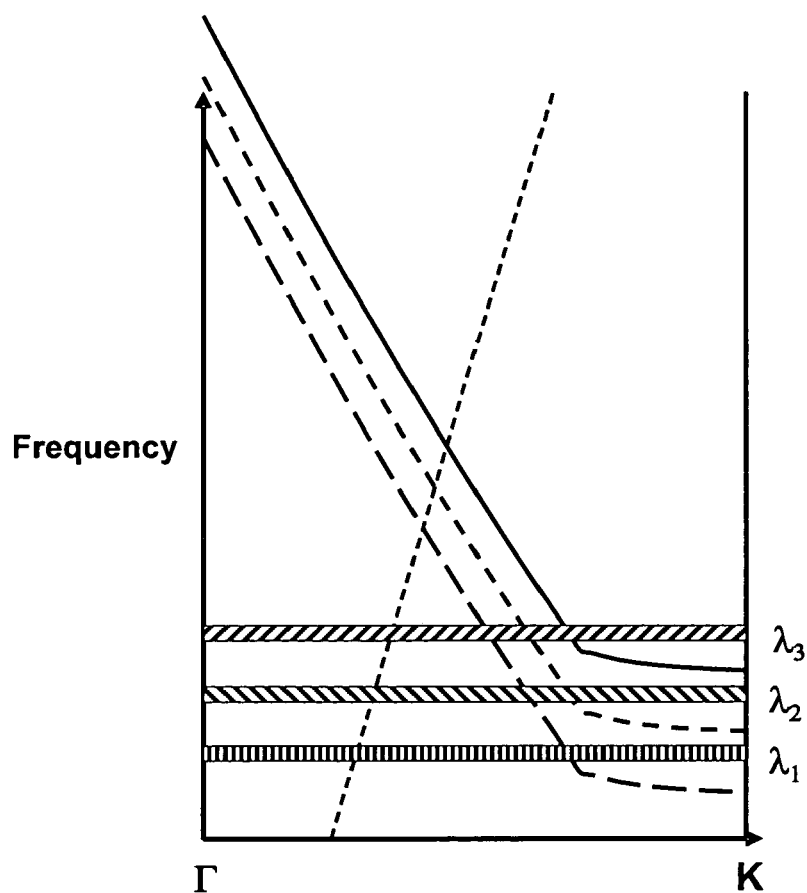
FIG. 41 is a graph depicting the dispersion relations of the tapered cut-off waveguide of FIG. 40.

The effects of implementing such a tapered cut-off waveguide are illustrated in FIG. 41, which compares estimated dispersion relations of the guided mode in three sections of waveguide 702. The net effect is that all collected optical powers can only exit the waveguide in a single direction (i.e. downward in FIG. 40). This arrangement removes the need to combine two directional output powers with a 50/50 waveguide combiner.

The output of the waveguide can be directed in other various configurations according to the convenience of the system requirements. For example, to avoid reflection at the abrupt cleaved output facet between the waveguide and the air, different types of optical impedance matching designs can be implemented between the photonic crystal defect waveguide and free space. However, if it is difficult to design direct impedance matching, the above-mentioned tapered cut-off waveguide can be first coupled into a tapered ridge waveguide or a tapered fiber through evanescent coupling, then standard anti-reflection (AR) coatings can be applied to the other end of the ridge waveguide or fiber.

Figure 42:
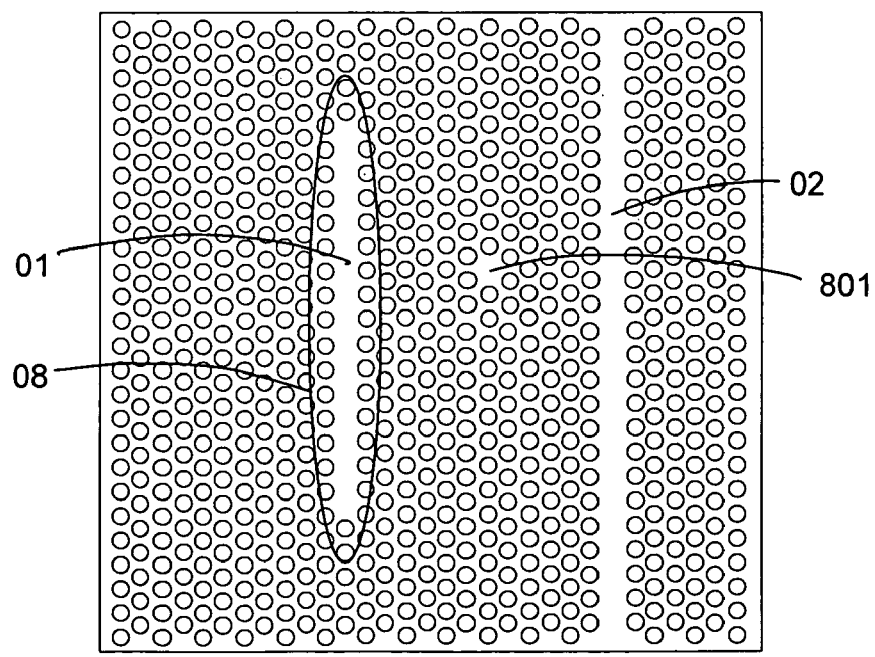
FIG. 42 is a top-view of an additional resonant cavity coupler positioned in between individual lasers and a waveguide according to yet another embodiment of the invention.

Referring now to FIG. 42, a diagram of an additional resonant cavity coupler positioned in between the individual light sources and the waveguide, in accordance with yet another embodiment of the invention is shown. The addition of an extra passive resonant cavity 801 (or cavities) can replace the direction coupling between a light source 01 and waveguide 02.

The optical coupling between 1 and 2 has to pass the filtering effect of 801 both in spectrum and spatial overlapping. The optical confinement requirement for the light source itself and the optical coupling requirement for the light source-waveguide coupling can be satisfied independently and simultaneously, without compromising each other. For example, in some instances, the optimized light source performance requires a relatively lower cavity Q (quality factor) and the spectrum selection for the light source-waveguide coupling requires a relatively higher coupling-Q. The insertion of resonant cavity 801 can provide a high coupling-Q between the light source and the waveguide, while the light source cavity Q can be much lower.

In another embodiment, passive and active components can be separately fabricated, and then integrated with aligned bonding processes. In other words, one can fabricate the passive components (i.e. waveguides, junctions, etc) in one process, and fabricate the active components (i.e. lasers or LEDs) in a separate process. After the passive and active components are fabricated, both pieces can be combined together through aligned wafer bonding techniques. When this approach is possible, the individual yields for fabricating passive and active components separately may be significantly higher than direct integration of the passive and active components.

According to another embodiment of the invention, a non-photonic crystal waveguide can be used to collect optical power. In this embodiment, the output light is still collected by a waveguide, but the waveguide is not formed from photonic crystal. For example, a traditional ridge waveguide can be buried in the substrate, and the active devices can be positioned physically near the substrate. This embodiment yields simpler waveguide fabrication.

In another embodiment of the invention, band-pass filters, instead of resonant filters, can be used to directly combine power to output and block reflected power. This utilizes the shifting of the band-pass-filters to eliminate cross-talk between element light sources, instead of aligning resonant coupling wavelengths. The requirement of the spectral alignments may be relaxed for some systems. Each band-pass-filter can be formed by vertically deep-etched Distributed Bragg Reflectors (DBRs).

In yet another embodiment of the invention, a selective volume of metals can be infiltrated to facilitate better thermal dissipation. Practical metal infiltrations in 3D semiconductor photonic crystal is possible. However, the tolerable minimum distance between the metal components to the optical active area (e.g. light source mode and waveguide mode) can vary significantly from one design to another. The practical effects of introducing metal into the vicinity of the light source cavity may be realized through case-by-case analysis, given the detailed model profile and mode dimension In yet another embodiment of the invention, a magneto optical isolator can be implemented on the semiconductor chip to improve the isolation between element light sources. This can be achieved by having a magnetic field parallel to the optical power propagating direction, which rotates the polarization of the fields in a fashion similar to free-space Faraday optical isolators. Another possibility is using a magnetic field that is perpendicular to the optical power propagating, and forming a uni-directional optical resonant coupler through the frequency splitting caused by broken symmetry between originally degenerated modes, such as an example reported by Prof. S. Fan (e.g. during the FiO2004 conference).

In addition to the above embodiments, the device structure can be changed and implemented in other ways. For example, there are different techniques for ensuring that there is adequate distance between the light source area and waveguide area to avoid a plasma etching loading effect, as well as different wafer bonding and doping processes. The possibility of switching to a lower cost substrate, such as Si, should also be considered.

Up to this point, the embodiments disclosed have been described within the context of 2D slab type photonic crystal. However, each of the above embodiments can also be employed in 3D photonic crystals, especially in layer-by-layer type 3D photonic crystals, which are compatible with existing semiconductor mass production infrastructures and technologies. Further discussion is found in K. M. Ho, C. T. Chan, C. M. Soukoulis, R. Biswas and M. Sigalas, "Photonic band gaps in three dimensions: new layer-by-layer periodic structures," Solid State Commun. 89, 413 (1994), and S. Y. Lin, etal, "A three-dimensional photonic crystal operating at infrared wavelengths," Nature 394, 251-3 (1998). S. Ogawa, M. Imada, S. Yoshimoto, M. Okano, S. Noda, "Control of Light Emission by 3D Photonic Crystals," Science 305, 227 (2004). From the device performance point of view, 3D photonic crystal designs can have several advantages.

One advantage for using a 3D photonic crystal design is the optical confinement properties for both light source cavities and bus line waveguides. In this regard, the optical confinement properties of 2D slab photonic crystal devices are sensitive to specific geometry features due to the intentional and unintentional disorders in the patterns. This observation is true for both light source cavity designs and waveguide designs. Further discussion is found in O. Painter, K. Srinivasan, J. D. O'Brien, A. Scherer, and P. D. Dapkus, "Tailoring of the resonant mode properties of optical nanocavities in two-dimensional photonic crystal slab waveguides," J. Opt. A-Pure Appl. Op. 3, S161 (2001). K. Srinivasan and O. Painter, "Momentum space design of high-Q photonic crystal cavities," Opt. Express 10, 670 (2002). Ph. Lalanne, S. Mias, and J. P. Hugonin, "Two physical mechanisms for boosting the quality factor to cavity volume ratio of photonic crystal microcavities," Opt. Express 12, 458 (2004), and Wan Kuang, etal, "Calculation Out-of-Plane Transmission Loss for Photonic-Crystal Slab Waveguides," Optics Letters 28(19), 1781-3 (2003). S. Hughes, etal, "Extrinsic Optical Scattering Loss in Photonic Crystal Waveguides: Role of Fabrication Disorder and Photon Group Velocity," Physical Review Letters 94, 0339.3 (2005). The intrinsic reason causing such vulnerability is the fact that 2D slab photonic crystals cannot have real full photonic bandgap in all three spatial orientations. Only real 3D photonic crystals can provide full 3D bandgaps, which manifest full 3D control of the EM fields.

A second advantage for using a 3D photonic crystal design is the flexibility in introducing electrical injection methods. In 3D photonic crystal designs, the electrical injection arrangement in the epitaxial direction (i.e. direction perpendicular to the semiconductor substrate) typically has more options compared with the lateral injection theme shown in FIG. 12. In 3D photonic crystals, electrodes can be introduced right on top of the active area and still maintain the vertical distance between the metallic electrodes and EM field peaking area, to avoid excessive optical absorption loss posed by metal components.

Figure 43:
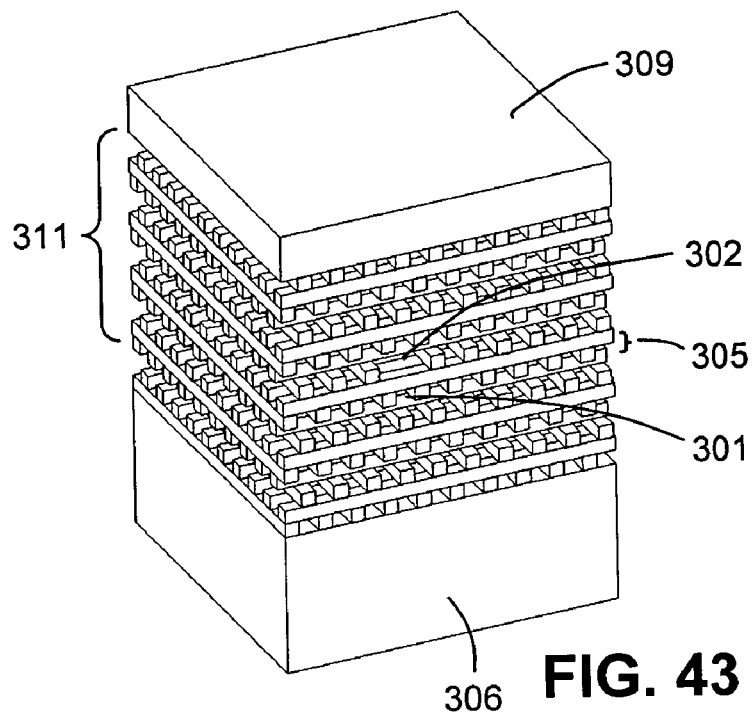
FIG. 43 is a diagram illustrating an incoherently coupled laser array in 3D photonic crystal, in accordance with a representative embodiment of the invention.
Figure 44:
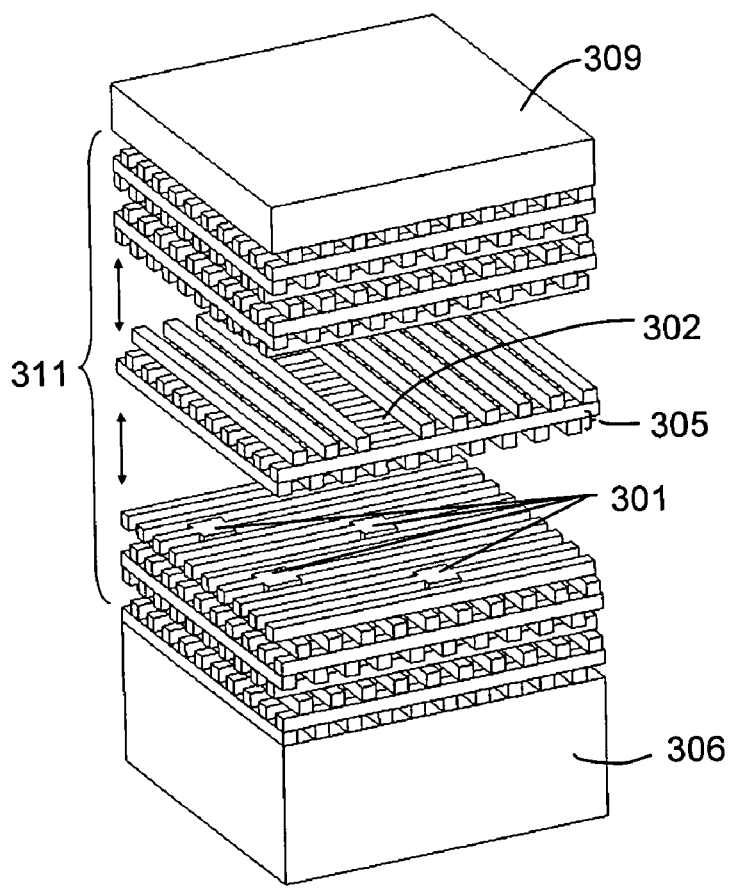
FIG. 44 is anatomic view showing the inside structures of FIG. 43.

In light of these two advantages, a representative embodiment of the incoherently coupled light array is illustrated in FIG. 43. FIG. 44 is an anatomic view showing the inside structures of FIG. 43.

Referring to FIGS. 43 and 44, the light source array includes a 3-D volume 311 of 3-D photonic crystals, in this case a layer-by-layer type photonic crystal where the structure is formed by stacking layers of slabs, each slab having its in-plane periodic structures. In FIG. 44, non-periodic geometries 301 in one layer 401, form the photonic crystal microcavities for light emissions or lasers in most cases.

Figure 45:
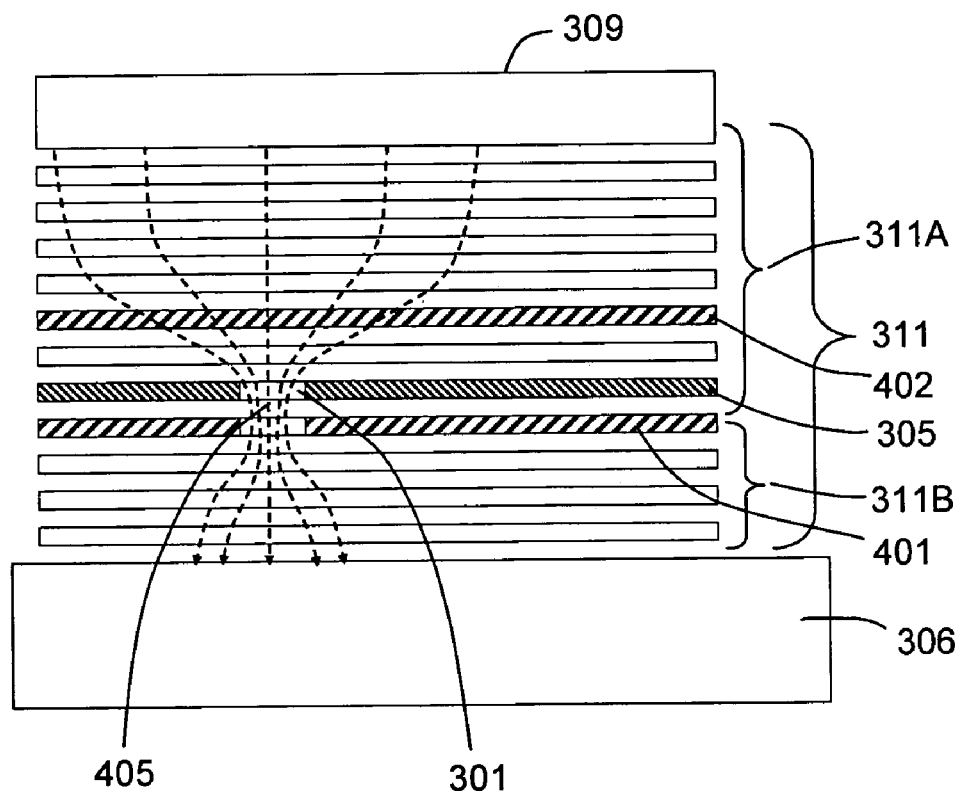
FIG. 45 is a cross-section view illustrating the different layers in the structure of FIG. 43.

FIG. 45 is a cross-section view illustrating different layers in the structure of FIG. 43. Layer 402 is a passive semiconductor layer, where a bus line waveguide is embedded. The photonic crystal microcavities 301 (forming light sources) are formed within an active layer 401. The active layer 401 is positioned in between an electrode 309 and a substrate 306. Insulating layer 305 has an insulation aperture for providing concentrated electrical injection to the light sources 301 within the active layer 401. Such insulating/conductive patterns of layer 305 can be achieved by standard semiconductor processing technologies, for example ion implantation, wet/dry oxidation (for appropriate material), selective area growth and etc.

For example, a predefined boundary of AlAs (for the insulating layer 305) may be used in a mesa structure arrangement. In this arrangement, wet-oxidation is initiated from the side of the predefined boundary, and propagates toward the center, leaving an unoxidized central post where the propagation stops. The photonic crystal microcavity can then be aligned with the unoxidized post of AlAs, corresponding to the insulation portion.

A capping with metal contact electrode 309 allows for the realization of electrical injection in the vertical direction. The optical output collected into the bus line waveguide 302 can be directed to exit the device at virtually any part. For example, the vertical direction output can be very useful in many applications, just as traditional stand-along VCSELs (vertical cavity surface emitting lasers) do. Also included are P-type doped layers 311A, and are N-type doped layers 311B. The P/N junction is located at the active layer 401. Since the N-type doped layers 311B are directly on top of the typical N-type substrate 306, this arrangement no longer has the unconventional N/P sequence discussed in the 2D slab designs, such as FIG. 12.

Moreover, the single mode bus line waveguide can be formed naturally with an air core by removing individual rods forming the woodpile lattice, and the engineering work for the air gaps discussed in the embodiments for a 2D slab is no longer necessary in 3D photonic crystals. Many of such 3D photonic crystal waveguide designs have been proposed and demonstrated in other literatures, where air core waveguides with single mode bandwidth larger than 10 nm is a common phenomenon. For example, such discussion is provided in M. Okano, etal, "Coupling between a point-defect cavity and a line-defect waveguide in three-dimensional photonic crystal," Physical Review B 68, 235110 (2003). C. Sell, etal, "Waveguide networks in three-dimensional layer-by-layer photonic crystals," Applied Physics Letters 84 (23), 4605-7 (2004). Z. Y. Li and Kai-Ming Ho, "Waveguides in three-dimensional layer-by-layer photonic crystals," Journal of Optical Society of America B. 20(5), 801-9 (2003).

The individual addressability of light sources can be implemented in a manner similar to the embodiments in a 2D slab, by forming deep trenches around each light source. The minimum distance between neighboring light sources without optical cross-talk can also be evaluated in a manner similar to that described above. In addition, electrical isolation layer 305 can be merged into the active layer 401, if the processing techniques of the active materials in layer 401 are compatible with an electrical insulating process, such as dry oxidation. By merging the active layer 401 and isolation layer 305, the complexity of the fabrication process is reduced, while maintaining electrical injection (current confinement) of the active layer.

Figure 46:
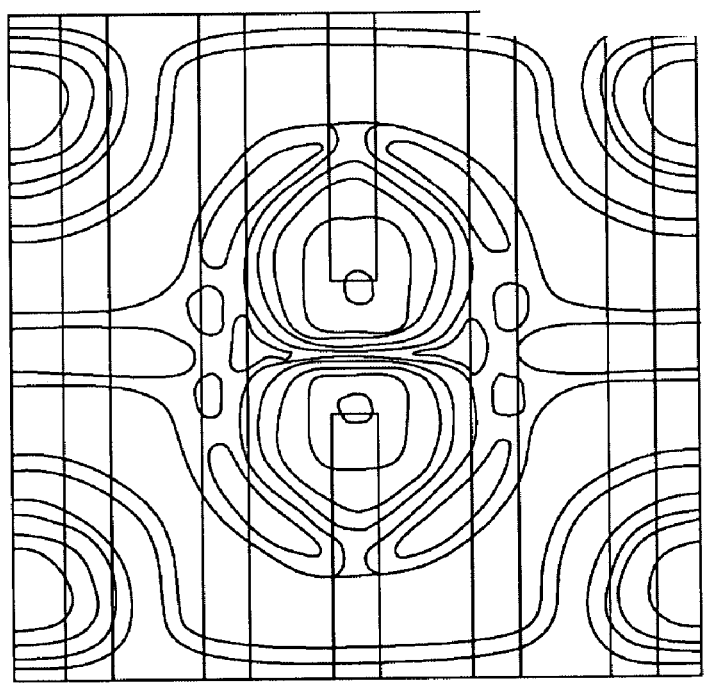
FIG. 46 illustrates an optical cavity formed by removal of a section of the semiconductor rod.
Figure 47:
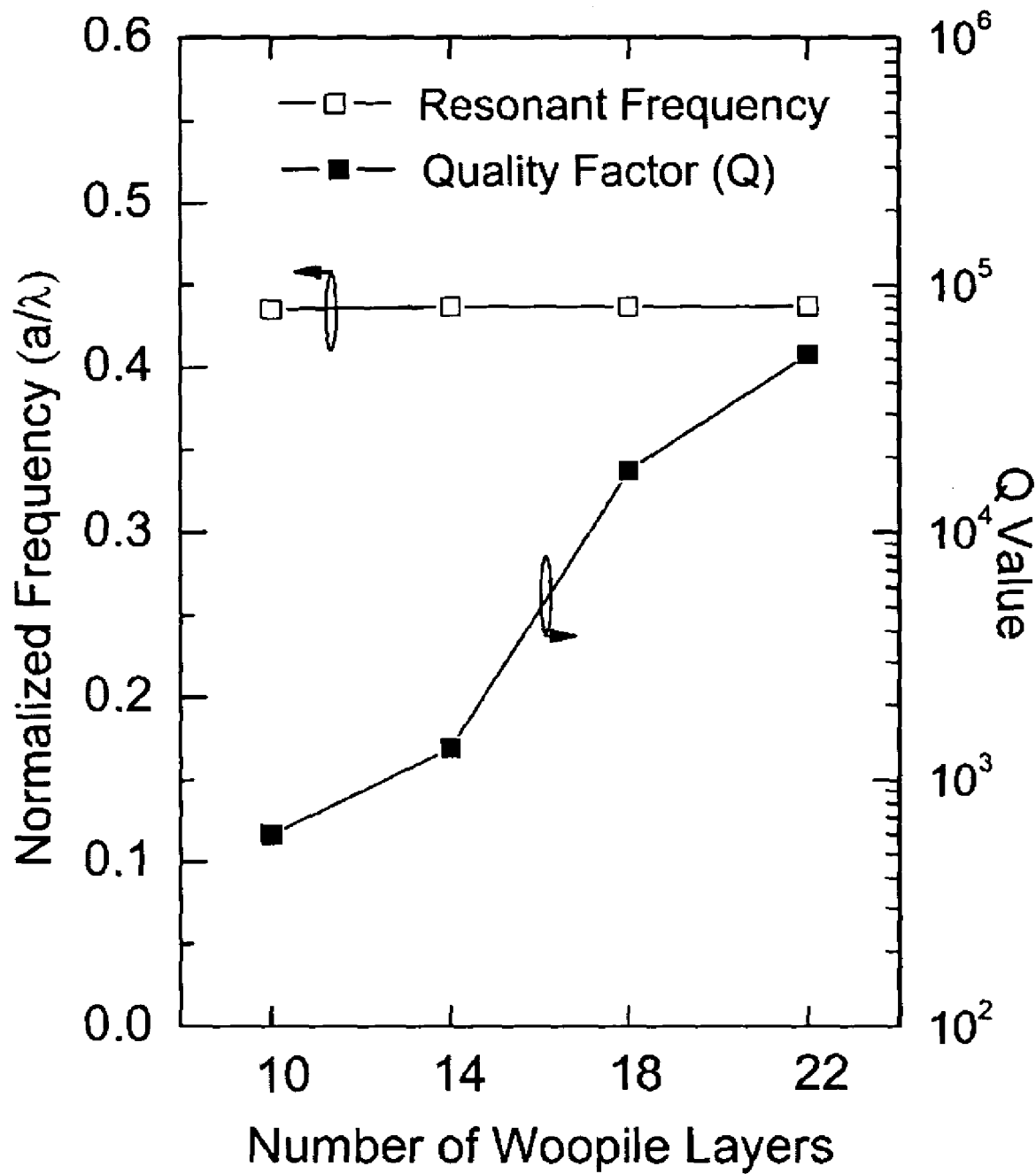
FIG. 47 depicts the resonant frequency and the quality factor of the cavity mode of FIG. 46 calculated using planewave based TMM.

As an example, a localized cavity mode trapped by a single defect cavity in woodpile photonic crystal was calculated by planewave based transfer matrix method (TMM). The optical cavity was formed by removing a section of the semiconductor rod, as delineated by the lines in FIG. 46. In FIG. 46, the contour curves show the total electrical field distribution is localized near the cavity. The resonant frequency and the quality factor of this cavity mode were also calculated by the planewave based TMM, as shown in FIG. 47.

The 3-D structure of this embodiment has virtually all of the beneficial effects summarized in the embodiment of the 2-D structure, although there are differences in the details of series resistance distribution, thermal dissipation distribution, etc. In addition, stronger effects on the spontaneous emissions in the 3-D photonic crystal microcavities are expected, compared with the 2-D slab photonic crystal microcavities, due to the presence of a full 3-D band gap in the second embodiment.

With an additional dimension of freedom compared with the 2D embodiments, the 3D embodiments have additional flexibility in arranging the positions of the light sources 301, waveguides 302, current control layer 305, etc. Due to the presence of the full 3-D band gap, the 3D embodiments can also have higher degree of control on the spontaneous emissions in the device, which potentially can increase the efficiency of the system.

Figure 48:
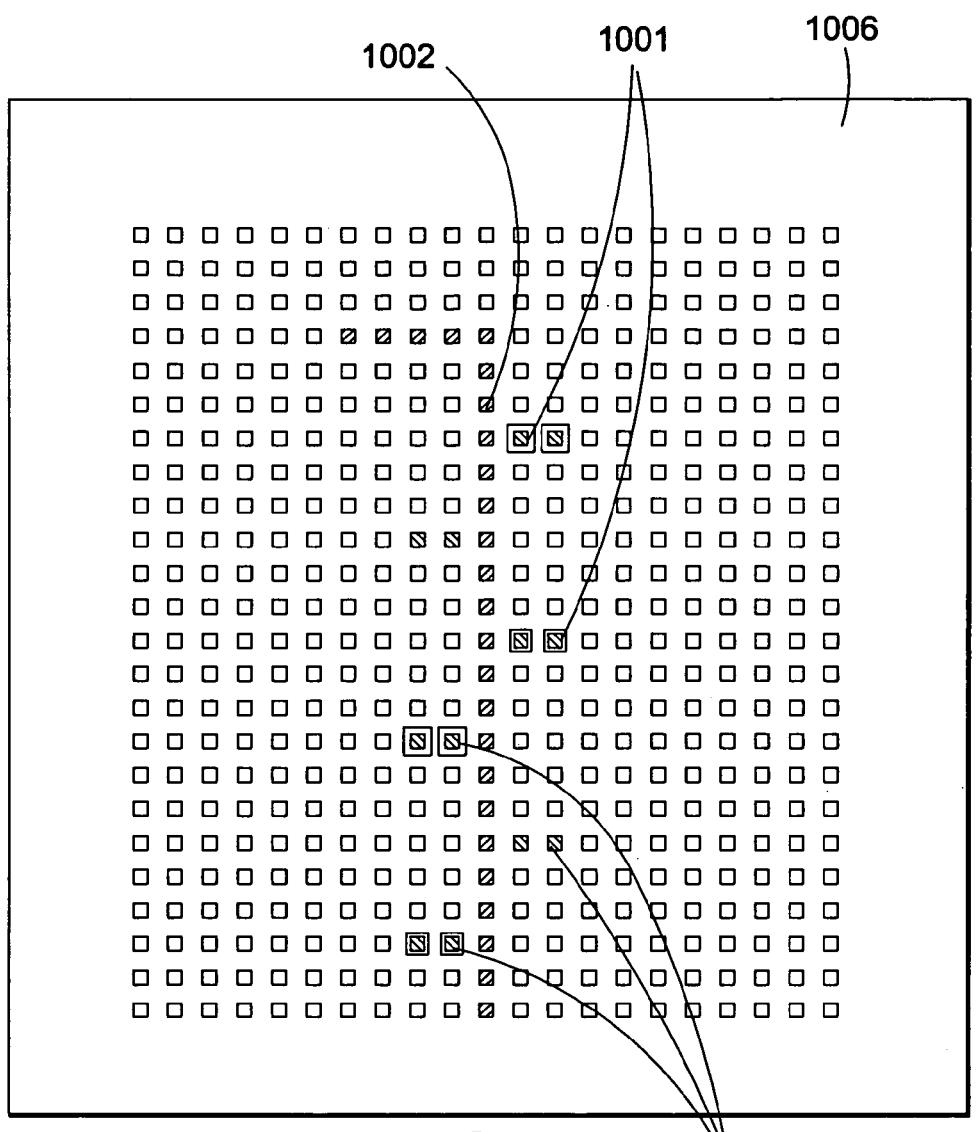
FIG. 48 is a top-view of lasers aligned on both sides of the waveguide in a 3D photonic crystal, in accordance with an embodiment of the invention.
Figure 49:
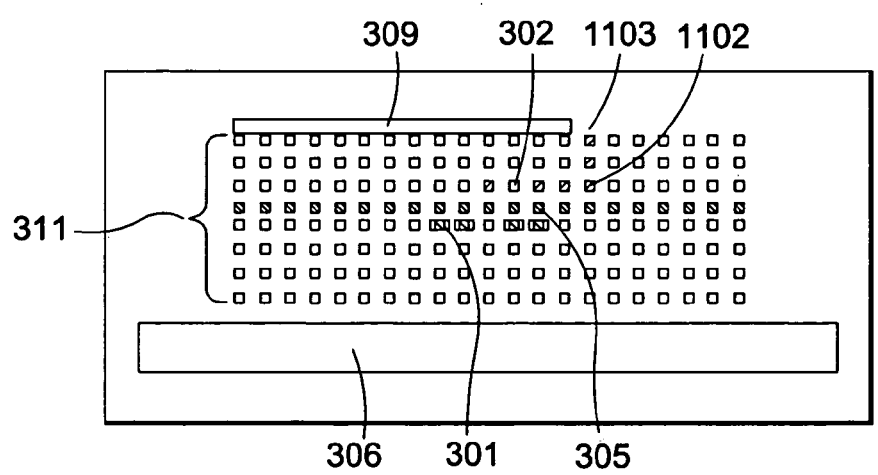
FIG. 49 is a perspective view of a photonic device in which the waveguide is bent to have vertical output, in accordance with another embodiment of the invention.
Figure 50:
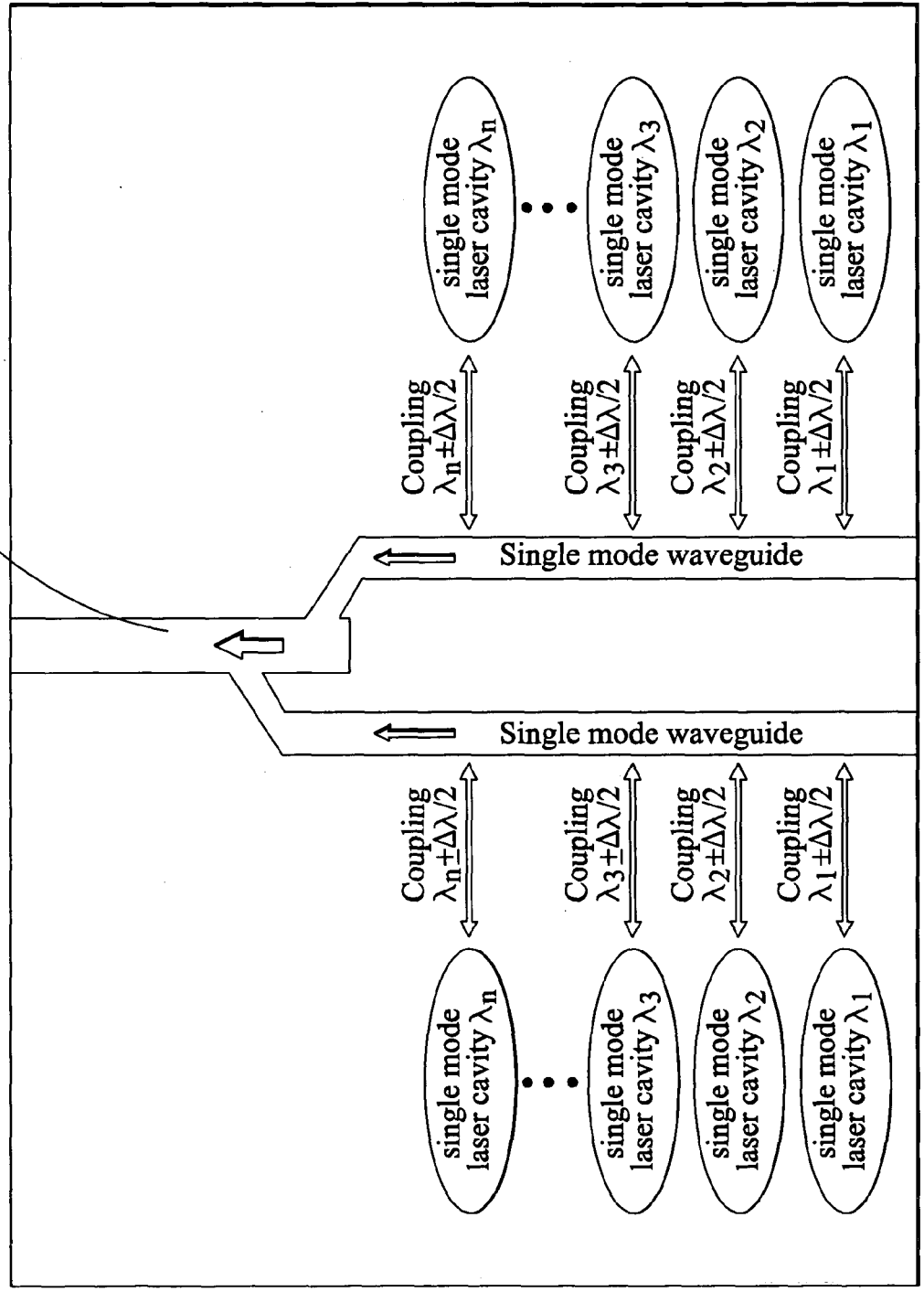
FIG. 50 is a top view of a photonic device which illustrates the combining of multiple sub-arrays' output waveguides, in accordance with a representative embodiment of the invention.

FIGS. 48 to 50 depict arrangements corresponding to further embodiments in a 3D photonic crystal design. With reference to FIG. 48, a diagram of light sources aligned on both sides of the waveguide. By aligning light source units 1001 on both sides the waveguide, more light source units 1001 can be fitted into a given length of a waveguide, and these light source units 1001 can share their electrical injection metal contacts. This embodiment is seen to yield a higher density of integration.

In addition, cross-talk between the light source units 1001 can be better prevented since the required spacing between the light source units 1001 is reduced. For example, if a GaAs "woodpile" photonic crystal is to be used as the basic construction material, then the bulk estimate of the spacing between neighboring light source cavities needs only to be larger than 8 periods, with an estimated coupling Q in the order of 10,000. The coupling Q between each element light source to the waveguide should be much larger than 1,000, again with 8 being a good estimated distance for ~10,000 coupling Q.

FIG. 49 depicts another embodiment of the invention, in which the waveguide is bent to have vertical output. In this embodiment, waveguide 302 includes a passive waveguide bending portion 1102 in which the waveguide bends in the vertical direction. An exit port 1103 is formed in waveguide 302 after the waveguide bending portion 1102.

As a result, the optical power can be directed not only in-plane but also out-of-plane to realize various options for output, such as, but not limited to, vertical emission. As noted above, the optical output (collected in the waveguide) can be directed to exit the photonic device at virtually any point. FIG. 49 illustrates that the waveguide can be turned upward to exit on an aperture area of the electrode. However, the waveguide can also be configured to direct the optical output in-plane, and can drive or be combined with other devices on the chip. Optical output at virtually any point is possible by appropriately configuring the waveguide.

With reference to FIG. 50, a diagram of a photonic device combining multiple sub-arrays' output waveguides according representative embodiment of the invention is shown. It should be noted that this embodiment can be applied to both the 2D and the 3D photonic crystal arrangements described above.

The previous embodiments have disclosed the use of one bus line waveguide collecting optical powers from all light sources connected thereto. As noted above, it is practically viable to allocate 5 light sources into a 1-nm gain bandwidth with direct monolithic fabrication tolerance. For typical quantum wells, free space optical system tolerance bandwidth, and human eye color distinguishing ability, a total bandwidth of 10-nm is practical. In other words, it is viable to stack 5 (light sources/nm)×10 (nm gain bandwidth)=50 light sources along one bus line waveguide, without risking resonant frequency overlapping. Hence, if each individual light source can output 5 mWatt (CW) optical power, then the total array can output 250 mWatt (CW) optical power. Such power with its spectral and spatial purity is seen to be more than enough for typical data projector and LBPs applications. However, it would be difficult to increase this power level further, given the single mode requirement for each light source and the limited 10-nm total bandwidth for color purity. Therefore, the embodiment depicted in FIG. 50 can be introduced to give designs for higher total output power, while keeping the total bandwidth within 10-nm.

In FIG. 50, multiple sub-arrays (e.g. emitting 250 mWatt from each) are combined with non-reflection waveguide combiners, such as directional couplers. With appropriate designs, such a photonic crystal waveguide combiner can have practically zero-reflection and zero-cross-talk. Therefore, light sources in different sub-arrays can have their wavelengths overlapped without risking optical cross-talk. It should be noted that it is preferred for the combining junctions to be zero-reflection so that there is no self-feedback to destabilize the light sources. Although such junction designs are not trivial, there have been a few successful demonstrations in photonic crystal waveguides, owing to the full optical control and flexibility in photonic crystal geometries. For example, a cascade of directional couplers has been used, as described in F. Cuesta-Soto, etal, "All-optical switching structure based on a photonic crystal directional coupler," Optics Express 12(1), 161-7 (2004).

The invention has been described above with respect to particular illustrative embodiments. It is understood that the invention is not limited to the above-described embodiments. For example, the colored light source apparatus are not limited to use in data projectors and laser beam printers. Furthermore, various changes and modifications may be made by those skilled in the relevant art without departing from the spirit and scope of the invention.

What is claimed is:

1. A light source apparatus comprising:
a plurality of light sources with an active layer, the light sources being adjacent to each other, each of the light sources having a cavity defined by a defect in a photonic crystal comprising a periodic structure;
a plurality of first electrodes corresponding to each of the light sources, each of the first electrodes being electrically separated from each other by a gap to independently drive each of the light sources;
a second electrode;
a common waveguide without the active layer, the common waveguide being configured to optically couple to light emitted from each of the light sources by using each of the first electrodes and the second electrode, so that output optical power from the common waveguide is in a range between several tens of milliwatts and several watts; and
an additional plurality of light sources adjacent to each other and positioned across from the common waveguide relative to the plurality of light sources.

2. The light source apparatus according to claim 1, wherein a total bandwidth of light outputted from the common waveguide is 10 nm or less.

3. The light source apparatus according to claim 1, wherein the gap is an air gap for electrically and optically separating the first electrodes from each other.

4. The light source apparatus according to claim 3, wherein the common waveguide comprises an air gap.

5. The light source apparatus according to claim 4, wherein the air gap between the first electrodes is different from the air gap of the common waveguide.

6. The light source apparatus according to claim 1, further comprising an optical power controller to control a number of the light sources to be turned on so that the output optical power is digitally controlled.

7. A projector comprising the light source apparatus according to claim 1, and an optical system for projecting light emitted from the light source apparatus.

8. A printer comprising the light source apparatus according to claim 1, and an optical system for focusing light emitted from the light source apparatus onto a photosensitive drum.

* * * * *